United States Patent
Nakahata et al.

[11] Patent Number: 5,959,389
[45] Date of Patent: Sep. 28, 1999

[54] DIAMOND-ZNO SURFACE ACOUSTIC WAVE DEVICE

[75] Inventors: Hideaki Nakahata; Tomoki Uemura; Kenjiro Higaki; Satoshi Fujii; Hiroyuki Kitabayashi; Shin-ichi Shikata, all of Itami, Japan

[73] Assignee: Sumitomo Electronic Industries, Ltd., Japan

[21] Appl. No.: 08/964,469

[22] Filed: Nov. 4, 1997

Related U.S. Application Data

[63] Continuation-in-part of application No. 08/791,894, Jan. 31, 1997, Pat. No. 5,783,896, which is a continuation-in-part of application No. 08/689,296, Aug. 7, 1996, Pat. No. 5,814,918.

[30] Foreign Application Priority Data

| | | | |
|---|---|---|---|
| Aug. 8, 1995 | [JP] | Japan | 7-202114 |
| Nov. 7, 1996 | [JP] | Japan | 8-295183 |
| Jan. 28, 1997 | [JP] | Japan | 9-014158 |

[51] Int. Cl.$^6$ .................................. H03H 9/145
[52] U.S. Cl. .................. 310/313 A; 310/313 R
[58] Field of Search .................... 310/313 R, 313 A, 310/313 O

[56] References Cited

U.S. PATENT DOCUMENTS

| | | | |
|---|---|---|---|
| 5,160,869 | 11/1992 | Nakahata et al. | 310/313 A |
| 5,221,870 | 6/1993 | Nakahata et al. | 310/313 A |
| 5,294,858 | 3/1994 | Nakahata et al. | 310/313 A |
| 5,320,865 | 6/1994 | Nakahata et al. | 310/313 R |
| 5,426,340 | 6/1995 | Higaki et al. | 310/313 R |
| 5,440,189 | 8/1995 | Nakahata et al. | 310/313 R |
| 5,446,329 | 8/1995 | Nakahata et al. | 310/313 |
| 5,783,896 | 7/1998 | Nakahata et al. | 310/313 A |
| 5,814,918 | 9/1998 | Nakahata et al. | 310/313 R |

FOREIGN PATENT DOCUMENTS

| | | | |
|---|---|---|---|
| 534355-A1 | 3/1993 | European Pat. Off. | 310/313 A |
| 0 588 261 | 3/1994 | European Pat. Off. | |
| 0 608 864 | 8/1994 | European Pat. Off. | |
| 0 758 165 A1 | 2/1997 | European Pat. Off. | H03H 9/02 |
| 0 766 383 A2 | 4/1997 | European Pat. Off. | H03H 9/02 |
| 60-124112 | 7/1985 | Japan | 310/313 A |
| 3-160811 | 7/1991 | Japan | 310/313 A |
| 3-198412 | 8/1991 | Japan. | |
| 6-164294 | 6/1994 | Japan | 310/313 A |
| 8-32398 | 2/1996 | Japan. | |
| 8-65088 | 3/1996 | Japan. | |
| 2 069 278 | 8/1981 | United Kingdom | 310/313 A |

*Primary Examiner*—Thomas M. Dougherty
*Attorney, Agent, or Firm*—Pennie & Edmonds LLP

[57] ABSTRACT

A first surface acoustic wave device for 2nd mode surface acoustic wave of a wavelength λ ($\mu$m) according to the present invention is a SAW device of "type A" device shown in FIG. 6A, wherein a parameter $kh3=2\pi(t_A/\lambda)$ is: $0.033 \leq kh3 \leq 0.099$, and wherein a parameter $kh1=2\pi(t_Z/\lambda)$ and a parameter $kh2=2\pi(t_S/\lambda)$ are given within a region ABCDEFGHIJKLA in a two-dimensional Cartesin coordinate graph of FIG. 1.

25 Claims, 39 Drawing Sheets

$0.033 \leq$ kh of Al $\leq 0.099$ $0.033 \leq$ kh of Al $\leq 0.099$ $0.099 \leq$ kh of Al $\leq 0.165$ $0.165 \leq$ kh of Al $\leq 0.231$ $0.231 \leq$ kh of Al $\leq 0.297$ $0.297 \leq$ kh of Al $\leq 0.363$

TYPE A

TYPE B

TYPE C

TYPE D

TYPE E

TYPE F

TYPE G kh of Al = 0.066 kh of Al = 0.132 kh of Al = 0.264 kh of Al = 0.066 kh of Al = 0.264

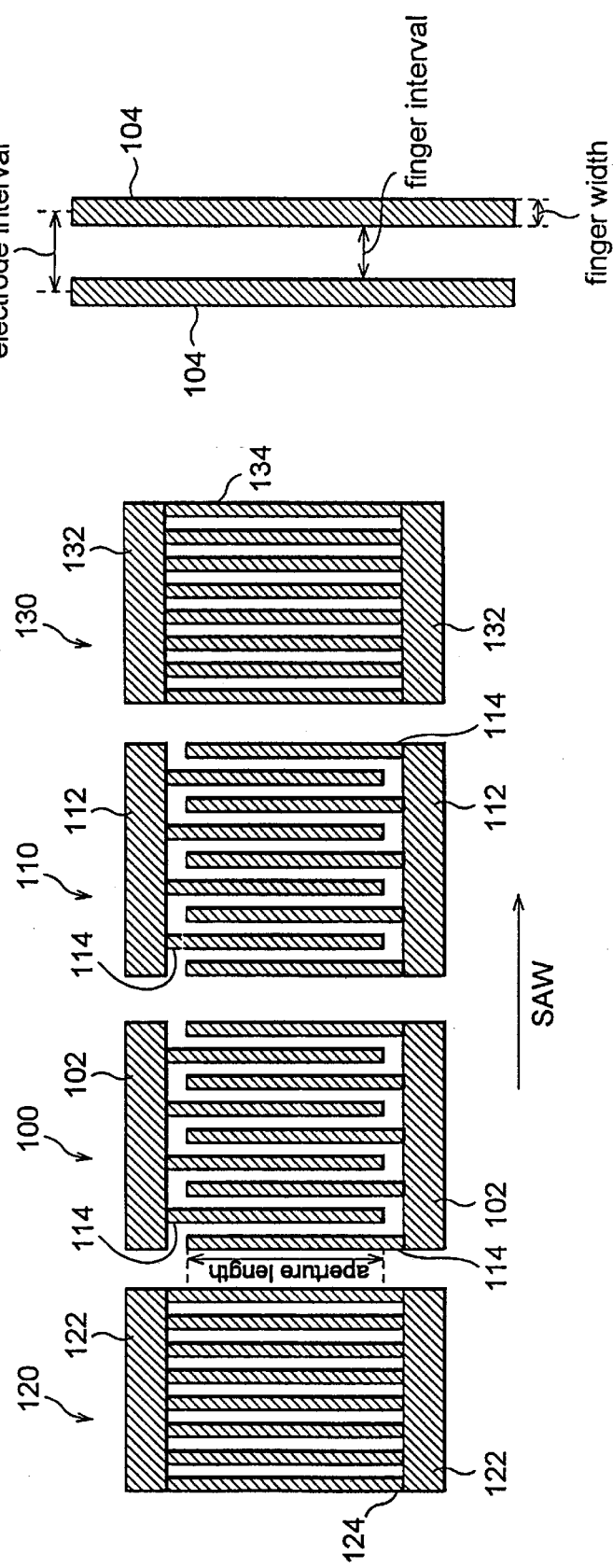

DIAMOND-ZNO SURFACE ACOUSTIC WAVE DEVICE

RELATED APPLICATIONS

This is a continuation-in-part, of prior application Ser. No. 08/791,894, filed Jan. 31, 1997, now U.S. Pat. No. 5,783,896, which is continuation-in-part application of application Ser. No. 08/689,296 filed Aug. 7, 1996 now U.S. Pat. No. 5,814,918.

BACKGROUND OF THE INVENTION

1. Field of the Invention

The present invention relates to an improved surface acoustic wave (SAW) device which comprises ZnO and diamond. The SAW device according to the present invention is applicable in operating at higher frequency.

2. Related Background Art

A surface acoustic wave device (SAW device) is a device which utilizes the acoustic wave propagation and the piezo-electricity on the surface of particular solid materials. The SAW device has excellent temperature stability, durability, and phase characteristics. Thus, there are certain demands, in the field of the advanced communication technology, for SAW devices which can be used in high frequency bands of more than 2 GHz, such as band pass filters, resonators, delay devices, signal processing devices, convolvers, and functional elements for opto-electronic devices. For example, the band pass filter with wider bandwidth is necessary for the equipments for cellular phones/communications which are typically operated in high frequency bands of more than 2 GHz.

The SAW devices typically comprises interdigital transducers (IDT) for generating and detecting the surface acoustic wave. The operation frequency (f) of a SAW device is given by the equation: $f=V/\lambda$, where V is the wave propagation velocity in the SAW device, and $\lambda$ is the wavelength of the surface acoustic wave. The operation frequency of more than 2 GHz is required for SAW device to be used for the band pass filters with wider bandwidth. The wavelength $\lambda$ is generally proportional to the width (d) of electrodes of the interdigital transducer.

Because of difficulties on micro-fabrication technique, the electrode with the width (d) of less than 0.5 $\mu$m is difficult to be obtained, thus it is difficult to achieve desirable operation frequency (f) of more than 2 GHz by decreasing wavelength $\lambda$. Therefore, the SAW device with higher propagation velocity V is required for being applied to the operation at the frequency of 2 GHz or higher.

The energy transform (piezoelectric) efficiency is also important for SAW device to be used for the advanced communication equipments. The effective coupling coefficient ($K^2$) is an index to conversion efficiency of the converting of electrical energy into mechanical energy on the surface of the device. The preferable range of the effective coupling coefficient depends upon applications; about 0.10%—about 0.7% for narrow-band filter; about 0.7%—about 3% for medium-band filter; and about 3%—about 6% for wide-band filter.

The temperature coefficient of frequency (TCF) of the SAW device is preferable to be small as possible, because the smaller temperature dependency of the SAW device is desirable. The propagation loss of the SAW device is also preferable to be small as possible, since smaller attenuation in propagation of surface acoustic wave is desirable.

Japanese Patent Laid-Open No. 01-339,521 discloses SAW devices comprising a ZnO piezoelectric layer formed onto a diamond layer. Another type of SAW devices comprising LiNbO$_3$ piezoelectric layer is disclosed in Japanese Patent Laid-Open No. 08-32,398. Japanese Patent Laid-Open 08-65,088 discloses SAW devices comprising LiTaO$_3$ piezoelectric layer.

FIGS. 6A to 6G illustrate the layer/electrode constitution of SAW devices. In U.S. Pat. No. 5,446,329 to Nakahata et. al., disclosures of which is incorporated by reference, propagation velocity V, effective coupling coefficient $K^2$ and temperature coefficient with frequency TCF of ZnO-diamond SAW devices have been improved, in particular by focusing first mode surface acoustic wave: for example, V of 8,000 to 10,000 (m/s), TCF of −10 to 10 (ppm/° C.) and $K^2$ of 0.7 to 1.7 (%) are achieved for "type E" constitution shown in FIG. 6E; V of 8,000 to 10,000 (m/s), TCF of −10 to 10 (ppm/° C.) and $K^2$ of 1 to 3 (%) are achieved for "type B" constitution shown in FIG. 6B; V of 8,000 to 10,000 (m/s), TCF of −10 to 10 (ppm/° C.) and $K^2$ of 1.5 to 4.5 (%) are achieved for "type F" constitution shown in FIG. 6F; V of 8,000 to 10,000 (m/s), TCF of −10 to 10 (ppm/° C.) and $K^2$ of 0.8 to 2.3 (%) are achieved for "type D" constitution shown in FIG. 6D; and V of 8,000 to 10,000 (m/s), TCF of −10 to 10 (ppm/° C.) and $K^2$ of 0.7 to 2.2 (%) are achieved for "type G" constitution shown in FIG. 6G.

It is also known that the performances of the SAW device can be further improved by employing LiNbO$_3$ or LiTaO$_3$ for piezoelectric material of SAW device. In the Japanese Patent Laid-Open No. 08-32,398, it is demonstrated that LiNbO$_3$-diamond SAW devices have V of 11,000 to 12,500 (m/sec.), TCF of −10 to 10 (ppm), and $K^2$ of 7.5 to 9.5 (%).

Nevertheless, the use of ZnO for piezoelectric material of SAW device can provide significant advantage in fabricating SAW device, because the processibility of ZnO film is much better than LiNbO$_3$ or LiTaO$_3$ films. Therefore, it is desirable to further improve the performances of SAW devices which comprise ZnO piezoelectric layer.

It is also desirable to further improve the performances of the SAW devices in which an electrode, typically made of aluminum (Al), is not included between diamond layer and ZnO layer, such as "type A" and "type C" devices shown in FIG. 6A and FIG. 6C, respectively. Because such device constitution can eliminate the limitation on the process conditions for forming ZnO layer such as process temperature, since Al electrode having relatively low melting point is not included.

Therefore, it is an object of the invention to further improve the propagation velocity V, the effective coupling coefficient $K^2$, the thermal coefficient of frequency TCF and propagation loss of the SAW device which includes ZnO piezoelectric layer formed on diamond layer, to provide SAW device having improved operation characteristics at the frequency of 2 GHZ or higher with superior durability and less energy loss.

SUMMARY OF THE INVENTION

We have conducted a number of experimental evaluations on SAW devices comprising a ZnO piezoelectric layer disposed on a diamond, and an SiO$_2$ layer disposed on the ZnO layer. As mentioned above, ZnO layer is advantageous in utilizing a piezoelectric layer of SAW devices, because of its better formability. These experimental evaluations have been carried out by varying layer thicknesses and utilizing the second mode surface acoustic wave which propagates within SAW devices, in order to achieve the above-mentioned object of the invention. The evaluation is, however, generally difficult and complicated, because a compromise among V, TCF, $K^2$ and the propagation loss must be made, in order to achieve the optimization of the operating characteristics of the SAW devices.

The inventors first carried out a series of preliminary evaluation ("first preliminary evaluation") to obtain good V, TCF and $K^2$, with a manner which is similar to a manner utilized in the U.S. Pat. No. 5,446,329 to Nakahata et. al. The result of the first preliminary evaluation is shown in FIG. 24, in which a desirable range of kh1=$2\pi(t_Z/\lambda)$ and kh2=$2\pi(t_S/\lambda)$ ($t_Z$ is a thickness of ZnO layer, and $t_S$ is a thickness of $SiO_2$ layer) is shown in a region A'B'C'D'E'F'G'H'I'J'K'L'M'N'O'P'Q'R'A' and a region A'B'C'D'S'T'M'N'O'P'Q'R'A'

These regions are applicable to SAW devices of Types "A" (FIG. 6A), "B" (FIG. 6B), "C" (FIG. 6C), "D" (FIG. 6D) and "E" (FIG. 6F), according to the present invention.

Next, another series of preliminary evaluation (second preliminary evaluation) were carried out with a manner which is similar to but more precise than a manner utilized in the U.S. Pat. No. 5,446,329 to Nakahata et.al. The result of the second preliminary evaluation is shown in FIG. 25, in which a desirable range of kh1=$2\pi(t_Z/\lambda)$ and kh2=$2\pi(t_S/\lambda)$ ($t_Z$ is a thickness of ZnO layer, and $t_S$ is a thickness of $SiO_2$ layer) is shown in a region abcdefghijklmnopqra and a region abcdstmnopqra. These regions are also applicable to SAW devices of Types "A" (FIG. 6A), "B" (FIG. 6B), "C" (FIG. 6C), "D" (FIG. 6D) and "E" (FIG. 6F), according to the present invention.

In these series of the preliminary evaluations, the inventor have found that a thickness of the interdigital transducer (IDT) must also be considered in order to optimize V, TCF and $K^2$.

The IDT is formed of a electric conductive material, and typically formed of aluminum or aluminum alloys, which have own SAW propagation velocity (V) and own linear thermal expansion coefficient. It have been found that the SAW propagation velocity and the linear thermal expansion coefficient of the electrical conductive material such as aluminum is influential to V, TCF and $K^2$ of the SAW devices and the influence of the SAW propagation velocity and the linear thermal expansion coefficient of the IDT to SAW device depends on thickness of IDT.

The present invention is, in particular, directed to a SAW device which are provided with superior operating performances such as propagation velocity (V), temperature coefficient of frequency (TCF), effective coupling coefficient ($K^2$) and propagation loss. The SAW devices comprise ZnO piezoelectric layer, $SiO_2$ layer and aluminum IDT, and have a particular relationship among the layer thicknesses of ZnO, $SiO_2$ and IDT.

A first surface acoustic wave device for 2nd mode surface acoustic wave of a wavelength $\lambda$ ($\mu$m) according to the present invention comprises (i) a diamond layer, (ii) a ZnO layer disposed on the diamond layer, the ZnO layer having a thickness $t_Z$, (iii) an interdigital transducer (IDT) disposed on the ZnO layer, the IDT having a thickness of $t_A$, and (iv) a $SiO_2$ layer disposed over the interdigital transducer onto the ZnO layer, the $SiO_2$ layer having a thickness of $t_S$; wherein a parameter kh3=$2\pi(t_A/\lambda)$ is: $0.033 \leq kh3 \leq 0.099$, and wherein a parameter kh1=$2\pi(t_Z/\lambda)$ and a parameter kh2=$2\pi(t_S/\lambda)$ are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A-B, B-C, C-D, D-E, E-F, F-G, G-H, H-I, I-J, J-K, K-L and L-A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6A, "type A".

The first SAW device having above constitution is provided with propagation velocity V of 8,000 (m/s) or higher, temperature coefficient of frequency TCF of from −15 to 15 (ppm/° C.) and effective coupling coefficient $K^2$ of from 0.1 to 1.3 (%). Further, such constitution is more advantageous in manufacturing. Processing temperature for forming ZnO layer is not strictly limited when the "type A" constitution is employed, because the formation of ZnO layer, which requires relatively higher processing temperature, is accomplished before forming IDT which has relatively low melting/softening point.

A second surface acoustic wave device according to the present invention is also a "Type A" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A-B, B-I, I-J, J-K, K-L and L-A.

The second SAW device having this constitution is provided with propagation velocity V of from 10,000 or higher (m/s), temperature coefficient of frequency TCF of from −15 to 15 (ppm/° C.) and effective coupling coefficient $K^2$ of from 0.1 to 1.3 (%). Further, such constitution is more advantageous in manufacturing, as discussed in the first SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A third surface acoustic wave device for 2nd mode surface acoustic wave of a wavelength $\lambda$ ($\mu$m) according to the present invention comprises: (i) a diamond layer, (ii) a ZnO layer disposed on the diamond layer, the ZnO layer having a thickness $t_Z$, (iii) an interdigital transducer (IDT) disposed on the ZnO layer, the IDT having a thickness of $t_A$, and (iv) a $SiO_2$ layer disposed over the interdigital transducer onto the ZnO layer, the $SiO_2$ layer having a thickness of $t_S$; wherein a parameter kh3=$2\pi(t_A/\lambda)$ is: $0.099 \leq kh3 \leq 0.165$, and wherein a parameter kh1=$2\pi(t_Z/\lambda)$ and a parameter kh2=$2\pi(t_S/\lambda)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A-B, B-C, C-D, D-E, E-F, F-G, G-H, H-I, I-J, J-K, K-L, L-M and M-A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6A, "type A".

The third SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 1.20 (%). Further, such constitution is more advantageous in manufacturing, as mentioned in the first SAW device.

A fourth surface acoustic wave device according to the present invention is also a "Type A" SAW device, wherein the parameters kh1 and kh2 are given within a region ABCNJKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A-B, B-C, C-N, N-J, J-K, K-L, L-M and M-A, the point N being given by a coordinate point (kh1=0.62, kh2=0.77).

The fourth SAW device having this constitution is provided with propagation velocity V of from 10,000 or higher (m/s), temperature coefficient. of frequency TCF of from −15 to 15 (ppm/° C.) and effective coupling coefficient $K^2$ of from 0.05 to 1.15 (%). Further, such constitution is more advantageous in manufacturing, as mentioned in the first SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A fifth surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_Z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_S$; wherein a parameter kh3=2π($t_A$/λ) is: 0.165≦kh3≦0.231, and wherein a parameter kh1=2π($t_Z$/λ) and a parameter kh2=2π($t_S$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A-B, B-C, C-D, D-E, E-F, F-G, G-H, H-I, I-J, J-K, K-L, L-M and M-A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6A, "type A".

The fifth SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 1.05 (%). Further, such constitution is more advantageous in manufacturing, as mentioned in the first SAW device.

A sixth surface acoustic wave device according to the present invention is also a "Type A" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A-B, B-C, C-N, N-J, J-K, K-L, L-M and M-A, the point N being given by a coordinate point (kh1=0.43, kh2=0.95); and the point O being given by a coordinate point (kh1=0.61, kh2=0.75).

The sixth SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.95 (%). Further, such constitution is more advantageous in manufacturing, as mentioned in the first SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A seventh surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_Z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_S$; wherein a parameter kh3=2π($t_A$/λ) is: 0.231≦kh3≦0.297, and wherein a parameter kh1=2π($t_Z$/λ) and a parameter kh2=2π($t_S$/λ) are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A-B, B-C, C-D, D-E, E-F, F-G, G-H, H-I, I-J, J-K, K-L, L-M, M-N and N-A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6A, "type A".

The seventh SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.95 (%). Further, such constitution is more advantageous in manufacturing, as mentioned in the first SAW device.

A eighth surface acoustic wave device according to the present invention is also a "Type A" SAW device, wherein the parameters kh1 and kh2 are given within a region AOPKLMNA in the two-dimensionall Cartesian coordinate graph, the outer edge of the region AOPKLMNA being given by a closed chain in the Cartesian coordinate, consisting of the point A, a point O, a point P, and the points K, L, M and N, and lines A-O, O-P, P-K, K-L, L-M, M-N and N-A, the point O being given by a coordinate point (kh1=0.36, kh2=1.00); and the point P being given by a coordinate point (kh1=0.48, kh2=0.83).

The eighth SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.70 (%). Further, such constitution is more advantageous in manufacturing, as mentioned in the first SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A ninth surface acoustic wave device for 2nd mode surface acoustic wave of a wavelength λ (µm) according to the present invention comprises: (i) a diamond layer, (ii) a ZnO layer disposed on the diamond layer, the ZnO layer having a thickness $t_Z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_S$; wherein a parameter kh3=2π($t_A$/λ) is: 0.297≦kh3≦0.363, and wherein a parameter kh1=2π($t_Z$/λ) and a parameter kh2=2π($t_S$/λ) are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A-B, B-C, C-D, D-E, E-F, F-G, G-H, H-I, I-J, J-K, K-L and L-A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point H being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09). The layer structure of this SAW device is schematically illustrated in FIG. 6A, "type A".

The ninth SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.85 (%). Further, such constitution is more advantageous in manufacturing, as mentioned in the first SAW device.

A tenth surface acoustic wave device according to the present invention is also a "type A" SAW device, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L-M, M-J, J-K and K-L, the point M being given by a coordinate point (kh1=0.37, kh2=0.94).

The tenth SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.50 (%). Further, such constitution is more advantageous in manufacturing, as mentioned in the first SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

An 11th surface acoustic wave device for 2nd mode surface acoustic wave of a wavelength λ (µm) according to the present invention comprises: (i) a diamond layer, (ii) a short circuit electrode disposed on the diamond layer, (iii) a ZnO layer disposed over the short circuit electrode onto the diamond layer, the ZnO layer having a thickness $t_Z$, (iv) an interdigital transducer (IDT) disposed on the ZnO layer, the IDT having a thickness of $t_A$, and (v) a SiO$_2$ layer disposed over the interdigital transducer onto the ZnO layer, the SiO$_2$ layer having a thickness of $t_S$; wherein a parameter kh3=2π($t_A$/λ) is: 0.033≦kh3≦0.099, and wherein a parameter kh1=2π($t_Z$/λ) and a parameter kh2=2π($t_S$/λ) are given within a region ABCDEFGHIJKLA which are shown in FIG. 1. The layer structure of this SAW device is schematically illustrated in FIG. 6B, "type B".

The 11th SAW device having above constitution is provided with propagation velocity V of 8,000 (m/s) or higher, temperature coefficient of frequency TCF of from −15 to 15 (ppm/° C.) and effective coupling coefficient $K^2$ of from 1.0 to 2.4 (%). Further, such constitution is advantageous in manufacturing, because ZnO having better formability is employed.

A 12th surface acoustic wave device according to the present invention is also a "type B" SAW device having a kh3 of 0.033 to 0.099, wherein the parameters kh1 and kh2 are given within a region ABIJKLA shown in FIG. 1.

The 12th SAW device having this constitution is provided with propagation velocity V of from 10,000 or higher (m/s), temperature coefficient of frequency TCF of from −15 to 15 (ppm/° C.) and effective coupling coefficient $K^2$ of from 1.2 to 2.4 (%). Further, such constitution is advantageous in manufacturing, as discussed in the 11th SAW device.

A 13th surface acoustic wave device for 2nd mode surface acoustic wave of a wavelength λ (µm) according to the present invention is a "type-B" SAW device shown in FIG.

6B; wherein a parameter $kh3=2\pi(t_A/\lambda)$ is: $0.099 \leq kh3 \leq 0.165$, and wherein a parameter $kh1=2\pi(t_Z/\lambda)$ and a parameter $kh2=2\pi(t_S/\lambda)$ are given within a region ABCDEFGHIJKLMA in a two-dimensional Cartesian coordinate graph having abscissa axis of kh1 and ordinate axis of kh2, the outer edge of the region ABCDEFGHIJKLMA shown in FIG. 2.

The 13th SAW device having above constitution is provided with propagation velocity V of 8,000 (m/s) or higher, temperature coefficient of frequency TCF of from −15 to 15 (ppm/° C.) and effective coupling coefficient $K^2$ of from 0.75 to 2.25 (%). Further, such constitution is advantageous in manufacturing, as mentioned in the 11th SAW device.

A 14th surface acoustic wave device according to the present invention is also a "type B" SAW device having a kh3 of 0.099 to 0.165, wherein the parameters kh1 and kh2 are given within a region ABCNJKLMA in the two-dimensional Cartesian coordinate graph, the outer edge of the region ABCNJKLMA shown in FIG. 2.

The 14th SAW device having this constitution is provided with propagation velocity V of from 10,000 or higher (m/s), temperature coefficient of frequency TCF of from −15 to 15 (ppm/° C.) and effective coupling coefficient $K^2$ of from 0.75 to 2.25 (%). Further, such constitution is advantageous in manufacturing, as mentioned in the 11th SAW device.

A 15th surface acoustic wave device for 2nd mode surface acoustic wave of a wavelength λ (μm) according to the present invention is a "type-B" SAW device shown in FIG. 6B; wherein a parameter $kh3=2\pi(t_A/\lambda)$ is: $0.165 \leq kh3 \leq 0.231$, and wherein a parameter $kh1=2\pi(t_Z/\lambda)$ and a parameter $kh2=2\pi(t_S/\lambda)$ are given within a region ABCDEFGHIJKLMA shown in FIG. 3.

The 15th SAW device having above constitution is provided with propagation velocity V of 8,000 (m/s) or higher, temperature coefficient of frequency TCF of from −15 to 15 (ppm/° C.) and effective coupling coefficient $K^2$ of from 0.70 to 2.2 (%). Further, such constitution is advantageous in manufacturing, as mentioned in the 11th SAW device.

A 16th surface acoustic wave device according to the present invention is also a "type B" SAW device having a kh3 of 0.165 to 0.231, wherein the parameters kh1 and kh2 are given within a region ABNOJKLMA shown in FIG. 3.

The 16th SAW device having this constitution is provided with propagation velocity V of from 10,000 or higher (m/s), temperature coefficient of frequency TCF of from −15 to 15 (ppm/° C.) and effective coupling coefficient $K^2$ of from 0.70 to 2.2 (%). Further, such constitution is advantageous in manufacturing, as mentioned in the 11th SAW device.

A 17th surface acoustic wave device for 2nd mode surface acoustic wave of a wavelength λ (μm) according to the present invention is a "type-B" SAW device shown In FIG. 6B; wherein a parameter $kh3=2\pi(t_A/\lambda)$ is: $0.231 \leq kh3 \leq 0.297$, and wherein a parameter $kh1=2\pi(t_Z/\lambda)$ and a parameter $kh2=2\pi(t_S/\lambda)$ are given within a region ABCDEFGHIJKLMNA shown in FIG. 4.

The 17th SAW device having above constitution is provided with propagation velocity V of 8,000 (m/s) or higher, temperature coefficient of frequency TCF of from −15 to 15 (ppm/° C.) and effective coupling coefficient $K^2$ of from 0.55 to 1.75 (%). Further, such constitution is advantageous in manufacturing, as mentioned in the 11th SAW device.

A 18th surface acoustic wave device according to the present invention is also a "type B" SAW device having a kh3 of 0.231 to 0.297, wherein the parameters kh1 and kh2 are given within a region AOPKLMNA in the two-dimensional Cartesian coordinate graph, the outer edge of the region AOPKLMNA shown in FIG. 4.

The 18th SAW device having this constitution is provided with propagation velocity V of from 10,000 or higher (m/s), temperature coefficient of frequency TCF of from −15 to 15 (ppm/° C.) and effective coupling coefficient $K^2$ of from 0.60 to 1.75 (%). Further, such constitution is advantageous in manufacturing, as mentioned in the 11th SAW device.

A 19th surface acoustic wave device for 2nd mode surface acoustic wave of a wavelength λ (μm) according to the present invention is a "type-B" SAW device shown in FIG. 6B; wherein a parameter $kh3=2\pi(t_A/\lambda)$ is: $0.297 \leq kh3 \leq 0.363$, and wherein the parameters kh1 and kh2 are given within a region ABCDEFGHIJKLA shown in FIG. 5.

The 19th SAW device having above constitution is provided with propagation velocity V of 8,000 (m/s) or higher, temperature coefficient of frequency TCF of from −15 to 15 (ppm/° C.) and effective coupling coefficient $K^2$ of from 0.30 to 1.7 (%). Further, such constitution is advantageous in manufacturing, as mentioned in the 11th SAW device.

A 20th surface acoustic wave device according to the present invention is also a "type B" SAW device having a kh3 of 0.297 to 0.363, wherein the parameters kh1 and kh2 are given within a region LMJKL shown in FIG. 5.

The 20th SAW device having this constitution is provided with propagation velocity V of from 10,000 or higher (m/s), temperature coefficient of frequency TCF of from −15 to 15 (ppm/° C.) and effective coupling coefficient $K^2$ of from 0.70 to 1.7 (%). Further, such constitution is advantageous in manufacturing, as mentioned in the 11th SAW device.

A 21st surface acoustic wave device for 2nd mode surface acoustic wave of a wavelength λ (μm) according to the present invention is a "type-C" SAW device shown in FIG. 6C; wherein a parameter $kh3=2\pi(t_A/\lambda)$ is: $0.033 \leq kh3 \leq 0.099$, and wherein a parameter $kh1=2\pi(t_Z/\lambda)$ and a parameter $kh2=2\pi(t_S/\lambda)$ are given within a region ABCDEFGHIJKLA shown in FIG. 1.

The 21st SAW device having above constitution is provided with propagation velocity V of 8,000 (m/s) or higher, temperature coefficient of frequency TCF of from −15 to 15 (ppm/° C.) and effective coupling coefficient $K^2$ of from 0.12 to 0.85 (%). Further, such constitution is more advantageous in manufacturing. Processing temperature for forming ZnO layer is not strictly limited when the "type C" constitution is employed, because the formation of ZnO layer, which requires relatively higher processing temperature, is accomplished before forming IDT which has relatively low melting/softening point.

A 22nd surface acoustic wave device according to the present invention is also a "type C" SAW device having a kh3 of 0.033 to 0.099, wherein the parameters kh1 and kh2 are given within a region ABIJKLA shown in FIG. 1.

The 22nd SAW device having this constitution is provided with propagation velocity V of from 10,000 or higher (m/s), temperature coefficient of frequency TCF of from −15 to 15 (ppm/° C.) and effective coupling coefficient $K^2$ of from 0.12 to 0.85 (%). Further, such constitution is more advantageous in manufacturing, as discussed in the 21 SAW device.

A 23rd surface acoustic wave device for 2nd mode surface acoustic wave of a wavelength λ (μm) according to the present invention is a "type-C" SAW device shown in FIG. 6C; wherein a parameter $kh3=2\pi(t_A/\lambda)$ is: $0.099 \leq kh3 \leq 0.165$, and wherein a parameter $kh1=2\pi(t_Z/\lambda)$ and a parameter $kh2=2\pi(t_S/\lambda)$ are given within a region ABCDEFGHIJKLMA shown in FIG. 2.

The 23rd SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.85 (%). Further, such constitution is more advantageous in manufacturing, as mentioned in the 21st SAW device.

A 24th surface acoustic wave device according to the present invention is also a "type-C" SAW device having a kh3 of 0.099 to 0.165, wherein the parameters kh1 and kh2 are given within a region ABCNJKLMA shown in FIG. 2.

The 24th SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.80 (%). Further, such constitution is more advantageous in manufacturing, as discussed in the 21st SAW device.

A 25th surface acoustic wave device for 2nd mode surface acoustic wave of a wavelength λ (μm) according to the present invention is a "type-C" SAW device shown in FIG. 6C; wherein a parameter $kh3=2\pi(t_A/\lambda)$ is: 0.165≦kh3≦0.231, and wherein a parameter $kh1=2\pi(t_Z/\lambda)$ and a parameter $kh2=2\pi(t_S/\lambda)$ are given within a region ABCDEFGHIJKLMA shown in FIG. 3.

The 25th SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.85 (%). Further, such constitution is more advantageous in manufacturing, as mentioned in the 21st SAW device.

A 26th surface acoustic wave device according to the present invention is also a "type C" SAW device having a kh3 of 0.165 to 0.231, wherein the parameters kh1 and kh2 are given within a region ABNOJKLMA shown in FIG. 3.

The 26th SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.65 (%). Further, such constitution is more advantageous in manufacturing, as discussed in the 21st SAW device.

A 27th surface acoustic wave device for 2nd mode surface acoustic wave of a wavelength λ (μm) according to the present invention is a "type-C" SAW device shown in FIG. 6C; wherein a parameter $kh3=2\pi(t_A/\lambda)$ is: 0.231≦kh3≦0.297, and wherein a parameter $kh1=2\pi(t_Z/\lambda)$ and a parameter $kh2=2\pi(t_S/\lambda)$ are given within a region ABCDEFGHIJKLMNA shown in FIG. 4.

The 27th SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.82 (%). Further, such constitution is more advantageous in manufacturing, as mentioned in the 21st SAW device.

A 28th surface acoustic wave device according to the present invention is also a "type C" SAW device having a kh3 of 0.231 to 0.297, wherein the parameters kh1 and kh2 are given within a region AOPKLMNA in the two-dimensional Cartesian coordinate graph, the outer edge of the region AOPKLMNA shown in FIG. 4.

The 28th SAW device having this constitution is provided with propagation velocity V of from 10,000 or higher (m/s), temperature coefficient of frequency TCF of from −15 to 15 (ppm/° C.) and effective coupling coefficient $K^2$ of from 0.05 to 0.50 (%). Further, such constitution is more advantageous in manufacturing, as discussed in the 21st SAW device.

A 29th surface acoustic wave device for 2nd mode surface acoustic wave of a wavelength λ (μm) according to the present invention is a "type-C" SAW device shown in FIG. 6C; wherein a parameter $kh3=2\pi(t_A/\lambda)$ is: 0.297≦kh3≦0.363, and wherein a parameter $kh1=2\pi(t_Z/\lambda)$ and a parameter $kh2=2\pi(t_S/\lambda)$ are given within a region ABCDEFGHIJKLA shown in FIG. 5.

The 29th SAW device having above constitution is provided with propagation velocity V of 8,000 (m/s) or higher, temperature coefficient of frequency TCF of from −15 to 15 (ppm/° C.) and effective coupling coefficient $K^2$ of from 0.05 to 0.75 (%). Further, such constitution is more advantageous in manufacturing, as mentioned in the 21st SAW device.

A 30th surface acoustic wave device according to the present invention is also a "type-C" SAW device having a kh3 of 0.297 to 0.363, wherein the parameters kh1 and kh2 are given within a region LMJKL shown in FIG. 5.

The 30th SAW device having this constitution is provided with propagation velocity V of from 10,000 or higher (m/s), temperature coefficient of frequency TCF of from −15 to 15 (ppm/° C.) and effective coupling coefficient $K^2$ of from 0.07 to 0.35 (%). Further, such constitution is more advantageous in manufacturing, as discussed in the 21st SAW device.

A 31st surface acoustic wave device for 2nd mode surface acoustic wave of a wavelength λ (μm) according to the present invention is a "type-D" SAW device shown in FIG. 6D; wherein a parameter $kh3=2\pi(t_A/\lambda)$ is: 0.033≦kh3≦0.099, and wherein a parameter $kh1=2\pi(t_Z/\lambda)$ and a parameter $kh2=2\pi(t_S/\lambda)$ are given within a region ABCDEFGHIJKLA shown in FIG. 1.

The 31st SAW device having above constitution is provided with propagation velocity V of 8,000 (m/s) or higher, temperature coefficient of frequency TCF of from −15 to 15 (ppm/° C.) and effective coupling coefficient $K^2$ of from 0.85 to 2.0 (%). Further, such constitution is advantageous in manufacturing, because ZnO having better formability is employed.

A 32nd surface acoustic wave device according to the present invention is also a "type D" SAW device having a kh3 of 0.033 to 0.099, wherein the parameters kh1 and kh2 are given within a region ABIJKLA shown in FIG. 1.

The 32nd SAW device having this constitution is provided with propagation velocity V of from 10,000 or higher (m/s), temperature coefficient of frequency TCF of from −15 to 15 (ppm/° C.) and effective coupling coefficient $K^2$ of from 1.05 to 2.0 (%). Further, such constitution is advantageous in manufacturing, as discussed in the 31st SAW device.

A 33rd surface acoustic wave device for 2nd mode surface acoustic wave of a wavelength λ (μm) according to the present invention is a "type-D" SAW device shown in FIG. 6D; wherein a parameter $kh3=2\pi(t_A/\lambda)$ is: 0.099≦kh3≦0.165, and wherein a parameter $kh1=2\pi(t_Z/\lambda)$ and a parameter $kh2=2\pi(t_S/\lambda)$ are given within a region ABCDEFGHIJKLMA shown in FIG. 2.

The 33rd SAW device having above constitution is provided with propagation velocity V of 8,000 (m/s) or higher, temperature coefficient of frequency TCF of from −15 to 15 (ppm/° C.) and effective coupling coefficient $K^2$ of from 0.75 to 1.80 (%). Further, such constitution is advantageous in manufacturing, as mentioned in the 31st SAW device.

A 34th surface acoustic wave device according to the present invention is also a "type D" SAW device having a kh3 of 0.099 to 0.165, wherein the parameters kh1 and kh2 are given within a region ABCNJKLMA in the two-dimensional Cartesian coordinate graph, the outer edge of the region ABCNJKLMA shown in FIG. 2.

The 34th SAW device having this constitution is provided with propagation velocity V of from 10,000 or higher (m/s), temperature coefficient of frequency TCF of from −15 to 15 (ppm/° C.) and effective coupling coefficient $K^2$ of from 0.75 to 1.80 (%). Further, such constitution is advantageous in manufacturing, as discussed in the 31st SAW device.

A 35th surface acoustic wave device for 2nd mode surface acoustic wave of a wavelength λ (μm) according to the present invention is a "type-D" SAW device shown in FIG. 6D; wherein a parameter $kh3 = 2\pi(t_A/\lambda)$ is: 0.165≦kh3≦0.231, and wherein a parameter $kh1=2\pi(t_Z/\lambda)$ and a parameter $kh2=2\pi(t_S/\lambda)$ are given within a region ABCDEFGHIJKLMA shown in FIG. 3.

The 35th SAW device having above constitution is provided with propagation velocity V of 8,000 (m/s) or higher, temperature coefficient of frequency TCF of from −15 to 15 (ppm/° C.) and effective coupling coefficient $K^2$ of from 0.65 to 1.7 (%). Further, such constitution is advantageous in manufacturing, as mentioned in the 31st SAW device.

A 36th surface acoustic wave device according to the present invention is also a "type D" SAW device having a kh3 of 0.165 to 0.231, wherein the parameters kh1 and kh2 are given within a region ABNOJKLMA shown in FIG. 3.

The 36th SAW device having this constitution is provided with propagation velocity V of from 10,000 or higher (m/s), temperature coefficient of frequency TCF of from −15 to 15 (ppm/° C.) and effective coupling coefficient $K^2$ of from 0.65 to 1.7 (%). Further, such constitution is advantageous in manufacturing, as discussed in the 31st SAW device.

A 37th surface acoustic wave device for 2nd mode surface acoustic wave of a wavelength λ (μm) according to the present invention is a "type-D" SAW device shown in FIG. 6D; wherein a parameter $kh3 = 2\pi(t_A/\lambda)$ is: 0.231≦kh3≦0.297, and wherein a parameter $kh1=2\pi(t_Z/\lambda)$ and a parameter $kh2=2\pi(t_S/\lambda)$ are given within a region ABCDEFGHIJKLMNA shown in FIG. 4.

The 37th SAW device having above constitution is provided with propagation velocity V of 8,000 (m/s) or higher, temperature coefficient of frequency TCF of from −15 to 15 (ppm/° C.) and effective coupling coefficient $K^2$ of from 0.55 to 1.6 (%). Further, such constitution is advantageous in manufacturing, as mentioned in the 31st SAW device.

A 38th surface acoustic wave device according to the present invention is also a "type D" SAW device having a kh3 of 0.231 to 0.297, wherein the parameters kh1 and kh2 are given within a region AOPKLMNA shown in FIG. 4.

The 38th SAW device having this constitution is provided with propagation velocity V of from 10,000 or higher (m/s), temperature coefficient of frequency TCF of from −15 to 15 (ppm/° C.) and effective coupling coefficient $K^2$ of from 0.55 to 1.6 (%). Further, such constitution is advantageous in manufacturing, as discussed in the 31st SAW device.

A 39th surface acoustic wave device for 2nd mode surface acoustic wave of a wavelength λ (μm) according to the present invention is a "type-D" SAW device shown in FIG. 6D; wherein a parameter $kh3 = 2\pi(t_A/\lambda)$ is: 0.297≦kh3≦0.363, and wherein a parameter $kh1=2\pi(t_Z/\lambda)$ and a parameter $kh2=2\pi(t_S/\lambda)$ are given within a region ABCDEFGHIJKLA shown in FIG. 5.

The 39th SAW device having above constitution is provided with propagation velocity V of 8,000 (m/s) or higher, temperature coefficient of frequency TCF of from −15 to 15 (ppm/° C.) and effective coupling coefficient $K^2$ of from 0.40 to 1.4 (%). Further, such constitution is advantageous in manufacturing, as mentioned in the 31st SAW device.

A 40th surface acoustic wave device according to the present invention is also a "type D" SAW device having a kh3 of 0.297 to 0.363, wherein the parameters kh1 and kh2 are given within a region LMJKL shown in FIG. 5.

The 40th SAW device having this constitution is provided with propagation velocity V of from 10,000 or higher (m/s), temperature coefficient of frequency TCF of from −15 to 15 (ppm/° C.) and effective coupling coefficient $K^2$ of from 0.60 to 1.4 (%). Further, such constitution is advantageous in manufacturing, as discussed in the 31st SAW device.

A 41st surface acoustic wave device for 2nd mode surface acoustic wave of a wavelength λ (μm) according to the present invention is a "type-F" SAW device shown in FIG. 6F; wherein a parameter $kh3 = 2\pi(t_A/\lambda)$ is: 0.033≦kh3≦0.099, and wherein a parameter $kh1=2\pi(t_Z/\lambda)$ and a parameter $kh2=2\pi(t_S/\lambda)$ are given within a region ABCDEFGHIJKLA shown i FIG. 1.

The 41st SAW device having above constitution is provided with propagation velocity V of 8,000 (m/s) or higher, temperature coefficient of frequency TCF of from −15 to 15 (ppm/° C.) and effective coupling coefficient $K^2$ of from 0.2 to 1.6 (%). Further, such constitution is advantageous in manufacturing, because ZnO having better formability is employed.

A 42nd surface acoustic wave device according to present invention is also a "type F" SAW device having a kh3 of 0.033 to 0.099, wherein the parameters kh1 and kh2 are given within a region ABIJKLA shown in FIG. 1.

The 42nd SAW device having this constitution is provided with propagation velocity V of from 10,000 or higher (m/s), temperature coefficient of frequency TCF of from −15 to 15 (ppm/° C.) and effective coupling coefficient $K^2$ of from 0.55 to 1.6 (%). Further, such constitution is advantageous in manufacturing, as discussed in the 41st SAW device.

A 43rd surface acoustic wave device for 2nd mode surface acoustic wave of a wavelength λ (μm) according to the present invention is a "type-F" SAW device shown in FIG. 6F; wherein a parameter $kh3 = 2\pi(t_A/\lambda)$ is: 0.099≦kh3≦0.165, and wherein a parameter $kh1=2\pi(t_Z/\lambda)$ and a parameter $kh2=2\pi(t_S/\lambda)$ are given within a region ABCDEFGHIJKLMA shown in FIG. 2.

The 43rd SAW device having above constitution is provided with propagation velocity V of 8,000 (m/s) or higher, temperature coefficient of frequency TCF of from −15 to 15 (ppm/° C.) and effective coupling coefficient $K^2$ of from 0.25 to 1.6 (%). Further, such constitution is advantageous in manufacturing, as mentioned in the 41st SAW device.

A 44th surface acoustic wave device according to the present invention is also a "type F" SAW device having a kh3 of 0.099 to 0.165, wherein the parameters kh1 and kh2 are given within a region ABCNJKLMA shown in FIG. 2.

The 44th SAW device having this constitution is provided with propagation velocity V of from 10,000 or higher (m/s), temperature coefficient of frequency TCF of from −15 to 15 (ppm/° C.) and effective coupling coefficient $K^2$ of from 0.80 to 1.6 (%). Further, such constitution is advantageous in manufacturing, as discussed in the 41st SAW device.

A 45th surface acoustic wave device for 2nd mode surface acoustic wave of a wavelength λ (μm) according to the present invention is a "type-F" SAW device shown in FIG. 6F; wherein a parameter $kh3 = 2\pi(t_A/\lambda)$ is: 0.165≦kh3≦0.231, and wherein a parameter $kh1=2\pi(t_Z/\lambda)$ and a parameter $kh2=2\pi(t_S/\lambda)$ are given within a region ABCDEFGHIJKLMA shown in FIG. 3.

The 45th SAW device having above constitution is provided with propagation velocity V of 8,000 (m/s) or higher, temperature coefficient of frequency TCF of from −15 to 15

(ppm/° C.) and effective coupling coefficient $K^2$ of from 0.25 to 1.6 (%). Further, such constitution is advantageous in manufacturing, as mentioned in the 41st SAW device.

A 46th surface acoustic wave device according to the present invention is also a "type F" SAW device having a kh3 of 0.165 to 0.231, wherein the parameters kh1 and kh2 are given within a region ABNOJKLMA in the two-dimensional Cartesian coordinate graph, the outer edge of the region ABCNJKLMA shown in FIG. 3.

The 46th SAW device having this constitution is provided with propagation velocity V of from 10,000 or higher (m/s), temperature coefficient of frequency TCF of from −15 to 15 (ppm/° C.) and effective coupling coefficient $K^2$ of from 0.65 to 1.6 (%). Further, such constitution is advantageous in manufacturing, as discussed in the 41st SAW device.

A 47th surface acoustic wave device for 2nd mode surface acoustic wave of a wavelength $\lambda$ ($\mu$m) according to the present invention is a "type-F" SAW device shown in FIG. 6F; wherein a parameter $kh3=2\pi(t_A/\lambda)$ is: $0.231 \leq kh3 \leq 0.297$, and wherein a parameter $kh1=2\pi(t_Z/\lambda)$ and a parameter $kh2=2\pi(t_S/\lambda)$ are given within a region ABCDEFGHIJKLMNA shown in FIG. 4.

The 47th SAW device having above constitution is provided with propagation velocity V of 8,000 (m/s) or higher, temperature coefficient of frequency TCF of from −15 to 15 (ppm/° C.) and effective coupling coefficient $K^2$ of from 0.3 to 1.45 (%). Further, such constitution is advantageous in manufacturing, as mentioned in the 41st SAW device.

A 48th surface acoustic wave device according to the present invention is also a "type F" SAW device having a kh3 of 0.231 to 0.297, wherein the parameters kh1 and kh2 are given within a region AOPKLMNA shown in FIG. 4.

The 48th SAW device having this constitution is provided with propagation velocity V of from 10,000 or higher (m/s), temperature coefficient of frequency TCF of from −15 to 15 (ppm/° C.) and effective coupling coefficient $K^2$ of from 0.55 to 1.45 (%). Further, such constitution is advantageous in manufacturing, as discussed in the 41st SAW device.

A 49th surface acoustic wave device for 2nd mode surface acoustic wave of a wavelength $\lambda$ ($\mu$m) according to the present invention is a "type-F" SAW device shown in FIG. 6F; wherein a parameter $kh3=2\pi(t_A/\lambda)$ is: $0.297 \leq kh3 \leq 0.363$, and wherein a parameter $kh1=2\pi(t_Z/\lambda)$ and a parameter $kh2=2\pi(t_S/\lambda)$ are given within a region ABCDEFGHIJKLA shown in FIG. 5.

The 49th SAW device having above constitution is provided with propagation velocity V of 8,000 (m/s) or higher, temperature coefficient of frequency TCF of from −15 to 15 (ppm/° C.) and effective coupling coefficient $K^2$ of from 0.35 to 1.35 (%). Further, such constitution is advantageous in manufacturing, as mentioned in the 41st SAW device.

A 50th surface acoustic wave device according to the present invention is also a "type F" SAW device having a kh3 of 0.297 to 0.363, wherein the parameters kh1 and kh2 are given within a region LMJKL in the two-dimensional Cartesian coordinate graph, the outer edge of the region LMJKL shown in FIG. 5.

The 50th SAW device having this constitution is provided with propagation velocity V of from 10,000 or higher (m/s), temperature coefficient of frequency TCF of from −15 to 15 (ppm/° C.) and effective coupling coefficient $K^2$ of from 0.70 to 1.35 (%). Further, such constitution is advantageous in manufacturing, as mentioned in the 41st SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

All of the first to 50th SAW devices according to the present invention also have less propagation loss when these utilize 2nd mode SAW than in the case when these devices utilize 1st mode SAW. The first to 50th SAW devices according to the present invention can achieve propagation loss of 0.03 dB/$\lambda$ for 2 GHz when these devices utilize 2nd mode SAW, although these devices achieve propagation loss of 0.05 dB/$\lambda$ for 2 GHz when these devices utilize 1st mode SAW.

The "type-A" SAW device according to the present invention may have a combination of kh1 and kh2 for kh3=0.044, which is given within a region defined by an upper line obtained by increasing kh2 from a first primary combination line (A1-B1-C1-D1-E1-F1-G1) shown in FIG. 28 by 10% and a lower line obtained by decreasing kh2 from the first primary combination line (A1-B1-C$_1$-D1-E1-F1-G1) by 10%. The device may have a combination of kh1 and kh2 for kh3=0.066, which is given within a region defined by an upper line obtained by increasing kh2 from a second primary combination line (A2-B2-C2-D2-E2-F2-G2) shown in FIG. 28 by 10% and a lower line obtained by decreasing kh2 from the second primary combination line (A2-B2-C2-D2-E2-F2-G2) by 10%. The device may have a combination of kh1 and kh2 for kh3=0.099, which is given within a region defined by an upper line obtained by increasing kh2 from a third primary combination line (A3-B3-C3-D3-E3-F3-G3) shown in FIG. 28 by 10% and a lower line obtained by decreasing kh2 from the third primary combination line (A3-B3-C3-D3-E3-F3-G3) by 10%. The device may have a combination of kh1 and kh2 for kh3=0.132, which is given within a region defined by an upper line obtained by increasing kh2 from a primary combination line fourth (A4-B4-C4-D4-E4-F4-G4) shown in FIG. 28 by 10% and a lower line obtained by decreasing kh2 from the fourth primary combination line (A4-B4-C4-D4-E4-F4-G4) by 10%. The device may have a combination of kh1 and kh2 for kh3=0.198, which is given within a region defined by an upper line obtained by increasing kh2 from a fifth primary combination line (A5-B5-C5-D5-E5-F5-G5) shown in FIG. 28 by 10% and a lower line obtained by decreasing kh2 from the fifth primary combination line (A5-B5-C5-D5-E5-F5-G5) by 10%.

The device may have a combination of kh1 and kh2 for kh3=0.264, which is given within a region defined by an upper line obtained by increasing kh2 from a sixth primary combination line (A6-B6-C6-D6-E6-F6-G6) shown in FIG. 28 by 10% and a lower line obtained by decreasing kh2 from the sixth primary combination line (A6-B6-C6-D6-E6-F6-G6) by 10%.

The "type-A" SAW device according to the present invention may also have a combination of kh1 and kh2 for $0.044 \leq kh3 \leq 0.066$, which is given within a region defined by an upper line obtained by increasing kh2 from a interpolated primary combination line (A12-B12-C12-D12-E12-F12-G12) by 10% and a lower line obtained by decreasing kh2 from the interpolated primary combination line (A12-B12-C12-D12-E12-F12-G12) by 10%. Each of the points A12, B12, C12, D12, E12, F12 and G12 constituting the interpolated primary combination line (A12-B12-C12-D12-E12-F12-G12) is obtained by implementing linear-interpolation between respective point of the first primary combination line A1, B1, C1, D1, E1, F1 and G1 and the corresponding point of the second primary combination line A2, B2, C2, D2, E2, F2 and G2 having the identical kh1 value, respectively. The linear interpolation (or linear insertion, or linear interposition) between, for example, A1

($kh1_A$, $kh2_{A1}$) and A2 ($kh1_A$, $Kh2_{A2}$) ($kh1_A$=0.600), gives the interpolated point A12 ($kh1$, $kh2_{A12}$), by an equation:

$$kh2_{A12}=kh2_{A1}+(kh2_{A2}-kh2_{A1})\times(kh3-kh3_{A1})/(kh3_{A2}-kh3_{A1}):$$

where $kh3_{A1}$ is a kh3 for the first primary combination line (0.044), $kh3_{A2}$ is a kh3 for the second primary combination line (0.066), and kh3 is from $kh3_{A1}$ (0.044) to $kh3_{A2}$ (0.066). $kh2_{A1}$ is 0.645 and $kh2_{A2}$ is 0.671.

The "type-A" SAW device according to the present invention may also have a combination of kh1 and kh2 for $0.066 \leq kh3 \leq 0.099$, which is given within a region defined by an upper line obtained by increasing kh2 from a interpolated primary combination line (A23-B23-C23-D23-E23-F23-G23) by 10% and a lower line obtained by decreasing kh2 from the interpolated primary combination line (A23-B23-C23-D23-E23-F23-G23) by 10%. Each of the points A23, B23, C23, D23, E23, F23 and G23 constituting the interpolated primary combination line (A23-B23-C23-D23-E23-F23-G23) is obtained by implementing the linear-interpolation between respective point of the second primary combination line A2, B2, C2, D2, E2, F2 and G2 and the corresponding point of the third primary combination line A3, B3, C3, D3, E3, F3 and G3 having the identical kh1 value, respectively, by using equations such as:

$$kh2_{A23}=kh2_{A2}+(kh2_{A3}-kh2_{A2})\times(kh3-kh3_{A2})/(kh3_{A3}-kh3_{A2}).$$

The "type-A" SAW device according to the present invention may also have a combination of kh1 and kh2 for $0.099 \leq kh3 \leq 0.132$, which is given within a region defined by an upper line obtained by increasing kh2 from a interpolated primary combination line (A34-B34-C34-D34-E34-F34-G34) by 10% and a lower line obtained by decreasing kh2 from the interpolated primary combination line (A34-B34-C34-D34-E34-F34-G34) by 10%. Each of the points A34, B34, C34, D34, E34, F34 and G34 constituting the interpolated primary combination line (A34-B34-C34-D34-E34-F34-G34) is obtained by implementing the linear-interpolation between respective point of the third primary combination line A3, B3, C3, D3, E3, F3 and G3 and the corresponding point of the fourth primary combination line A4, B4, C4, D4, E4, F4 and G4 having the identical kh1 value, respectively, by using equations such as:

$$kh2_{A34}=kh2_{A3}+(kh2_{A4}-kh2_{A3})\times(kh3-kh3_{A3})/(kh3_{A4}-kh3_{A3}).$$

The "type-A" SAW device according to the present invention may also have a combination of kh1 and kh2 for $0.132 \leq kh3 \leq 0.198$, which is given within a region defined by an upper line obtained by increasing kh2 from a interpolated primary combination line (A45-B 45-C45-D45-E45-F45-G45) by 10% and a lower line obtained by decreasing kh2 from the interpolated primary combination line (A45-B45-C45-D45-E45-F45-G45) by 10%. Each of the points A45, B45, C45, D45, E45, F45 and G45 constituting the interpolated primary combination line (A45-B45-C45-D45-E45-F45-G45) is obtained by implementing the linear-interpolation between respective point of the fourth primalry combination line A4, B4, C4, D4, E4, F4 and G4 and the corresponding point of the fifth primary combination line A5, B5, C5, D5, E5, F5 and G5 having the identical kh1 value, respectively, by using equations such as:

$$kh2_{A45}=kh2_{A4}+(kh2_{A5}-kh2_{A4})\times(kh3-kh3_{A4})/(kh3_{A5}-kh3_{A4}).$$

The "type-A" SAW device according to the present invention may also have a combination of kh1 and kh2 for $0.198 \leq kh3 \leq 0.264$, which is given within a region defined by an upper line obtained by increasing kh2 from a interpolated primary combination line (A56-B56-C56-D56-E56-F56-G56) by 10% and a lower line obtained by decreasing kh2 from the interpolated primary combination line (A56-B56-C56-D56-E56-F56-G56) by 10%. Each of the points A56, B56, C56, D56, E56, F56 and G56 constituting the interpolated primary combination line (A56-B56-C56-D56-E56-F56-G56) is obtained by implementing the linear-interpolation between respective point of the fifth primary combination line A5, B5, C5, D5, E5, F5 and G5 and the corresponding point of the sixth primary combination line A6, B6, C6, D6, E6, F6 and G6 having the identical kh1 value, respectively, by using equations such as:

$$kh2_{A56}=kh2_{A5}+(kh2_{A6}-kh2_{A5})\times(kh3-kh3_{A5})/(kh3_{A6}-kh3_{A5}).$$

Each of the SAW devices determined on the basis of the above mentioned primary combination lines and the interpolated primary combination lines has considerably excellent thermal stability among the aforementioned first to 50th SAW devices according to the present invention, while maintaining higher propagation velocity V>8,000 m/sec. and reasonable $K^2$ which are the equivalent level to the aforementioned first to 50th SAW devices. More specifically, the superior thermal stability is that the frequency variation on temperature change for the temperature range from −20° C. to 80° C. is within 500 ppm, that is, the frequency variation per 1° C. is within 5 ppm. Therefore, the above described SAW devices based on the primary and the interpolated primary combination lines are preferably employed for applications which require severer temperature stability. It should be also noted that the diamond SAW devices having the layer constitution of ($SiO_2$ protection layer)/(IDT)/(ZnO piezoelectric layer)/(diamond) and utilizing 2nd SAW mode additionally have an advantageous characteristics of the improved propagation loss over the diamond SAW devices having the layer constitution of ($SiO_2$ protection layer)/(ZnO piezoelectric layer)/(IDT)/(diamond) and utilizing 1st SAW mode. The combination of the former layer constitution and wave mode can present reduced insertion loss of less than 10 dB when used for the narrow-band filter having higher temperature stability at 2.5 GHz, while the combination of the latter layer constitution and wave mode can not reduce the insertion loss to such level for the use in the same application.

In yet another aspect of the invention, SAW devices according to the invention may comprise a interdigital transducers (IDT) including an input interdigital transducer for creating acoustic wave by applying electric power to the input IDT and an output interdigital transducer for receiving the acoustic wave to obtain electric power, wherein a pair number Ni of the fingers of the input IDT and a pair number No of the fingers of the output IDT satisfy the relationship: N=Ni+No=50–90 pairs, and wherein the aperture length of the input IDT or the output IDT is 10λ–50λ (λ: wavelength of the SAW). Further, the SAW devices additionally include at least two reflectors (or reflector electrodes), which are disposed to interpose the input and the output IDTs along the propagating direction of the SAW, wherein the reflectors comprise fingers, the total number of which is not more than 2×(100−N), where N=Ni+No.

When quartz is used as the substrate material for the application of the narrow-band filters, the possible minimum size of the electrode portion (i.e., the portion of the IDTs and the reflectors) is 200 μm×400 μm. This size should be further reduced to meet the current requirement for further miniaturizing the devices. The miniaturizing of the devices become more intensively required, as the whole communicating systems become smaller and lighter.

The conventional devices can not achieve the lower transmission loss of smaller than 10 dB, and it is desirable to have lower transmission loss as possible, because the devices having lower transmission loss is advantageous for applying communicating systems.

Although one can readily reduce the size of the electrode portion by reducing the pair number of the fingers or the aperture length of the IDTs, the resultant devices having reduced size of the electrode portion have deteriorated Q of less than 600 or higher transmission loss of higher than about 16 dB, when quartz is used for the substrate material. Thus, the miniaturization of the SAW devices comprising quartz substrate is limited to a certain level, if one attempts to maintain better device characteristics. Further, the SAW devices using conventional materials such as quartz have not achieve lower transmission loss of <10 dB, lower TCF of <5 ppm and higher Q of not less than 600 at 2.5 GHz, even though larger electrode portion is permitted.

The applicants of the invention have conducted a number of experimental evaluation, and found that, when diamond is used for the substrate material, pair number of the fingers can be considerably reduced without adversely affecting the Q value and the transmission loss, due to the excellent combined properties of the diamond and the ZnO piezoelectric material. Thus, the combination of the above-described layer constitution of the invention and the selected pattern of IDT and/or reflector can provides reduced size of the electrode portion of the devices to a level of 40–200 $\mu m \times 200$–400 $\mu m$, while maintaining higher propagation velocity and thermal stability than conventional devices, as well as achieving better $Q \geq 600$ and lower transmission loss of 6–10 dB. In addition, the SAW devices advantageously have a better processibility to provide higher yield, because the sufficient miniaturization can be achieved with relatively wider finger of IDTs or reflectors and the reduced pair number, according to the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 39A schematically illustrates a plan view of the electrode portion in Example 9; and FIG. 39B is a schematic enlarged view of a finger of IDT.

DESCRIPTION OF THE PREFERRED EMBODIMENTS

Figure 1:
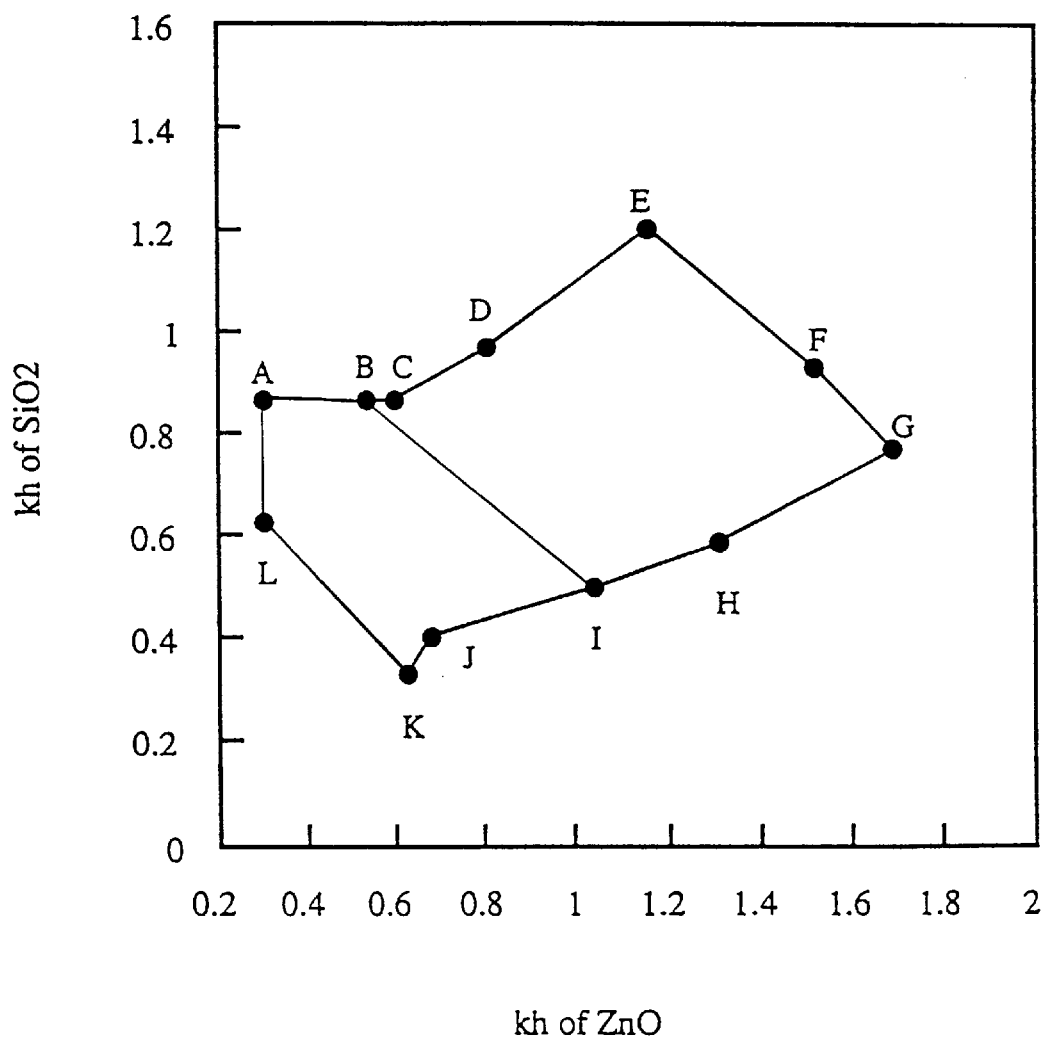
FIG. 1 is a graph in the two-dimensional Cartesian coordinate having abscissa axis of kh1(kh of ZnO) and ordinate axis of kh2(kh of $SiO_2$), illustrating the region ABCDEFGHIJKLA and the region ABIJKLA for $0.033 \leq kh3 \leq 0.099$.

The present invention will be described in detail as following, with reference to the accompanying drawings.

(Diamond)

The diamond material preferable for the use in the present invention may be either natural diamond or synthetic diamond. The diamond may be single crystalline diamond or polycrystalline diamond. The diamond plate/substrate itself can be used for fabricating SAW devices according to the present invention. Diamond layer/film formed on the other base material can also be employed.

The base material used for forming diamond film is not particularly limited, but may appropriately be selected depending on the usage of the SAW device. For example, the base material to be available in the present invention may comprise semiconductor materials such as crystalline silicon, amorphus silicon, metals, glass and ceramics. The process may appropriately be selected from known synthesis processes such as CVD(Chemical Vapor Deposition) including microwave plasma CVD, plasma enhanced CVD, PVD (Physical Vapor Deposition), sputtering, ion plating, plasma jet method, flame method and hot filament method.

In the case where the diamond film formed on the base material is employed for fabrication of SAW device according to the present invention, a parameter kh$_d$, which is defined as kh$_d$=2$\pi$t$_d$/$\lambda$, where t$_d$ is a thickness of the diamond film/layer and $\lambda$ is a wavelength of SAW, is preferably 4 or higher, and more preferably kh$_d$ is 8 or higher, because such thicker diamond film can provides less fluctuation in operating performances of the SAW device.

The plane orientation of the diamond may be any of (111), (100) and (110), etc., or may be any combination of these plane orientations.

(ZnO layer)

ZnO layer, that is disposed on the diamond and functions as piezoelectric layer of the SAW device according to the present invention, is preferably polycrystalline, and c-axis oriented, in view of piezoelectric property. By "c-axis oriented", it is meant that ZnO layer have a (001) plane that is parallel to a base layer, such as diamond layer, on which the ZnO layer is disposed.

(SiO$_2$ layer)

SiO$_2$ layer, that is formed on the ZnO layer, functions as protecting or passivating material for the ZnO layer and IDT according to the present invention, as well as functioning maintain the thermal stability of the device. SiO$_2$ is preferably an amorphous SiO$_2$ layer because of its better formability and processibility.

When device temperature increases, the SAW propagation velocity through SiO$_2$ layer increases while the SAW propagation velocities through diamond and ZnO layer decrease. Thus, SiO$_2$ layer can compensate the variation of the SAW propagation velocity through diamond and ZnO layers to provide the operation stability for temperature variation.

(Interdigital transducer and reflector)

Interdigital transducer (IDT) employed for the SAW devices according to the present invention is an element which creates or receive surface acoustic wave (SAW) through piezoelectric (or electro-mechanical) transformation of the piezoelectric material. The "single-type" electrode as shown in the schematic plan view of FIG. 26A or the "double-type" electrode as shown in the schematic plan view of FIG. 26B or any type of electrode may typically be used for the present invention.

The IDT comprises an input IDT for creating surface acoustic wave by being applied with electric power and an output IDT for receiving the surface acoustic wave to obtain electric energy. The SAW device according to the present invention may further include at least one pair of reflectors such as grating reflectors which interpose the input and the output IDTs along the propagating direction of the surface acoustic wave, so that the multiple-reflection of SAW is achieved between the reflectors to create a standing wave. Any of electric conductive materials can be used for the IDT or the reflectors. Aluminum (Al) or aluminum alloy may preferably be used as the material for the IDT because of its better processibility.

When device temperature increases, the SAW propagation velocity through diamond layer, aluminum IDT and ZnO layer decreases while the SAW propagation velocities through and $SiO_2$ layer increase.

(Short-Circuiting Electrode)

The short-circuiting electrode to be disposed as desired, is an electrode having a function of providing an equipotential state to an electric field so as to change the SAW characteristics of the device. This electrode may preferably comprise a (thin) film of a metal such as Al, Au or Al—Cu. Since the short-circuiting electrode has different function from that of the IDT, the material of the short-circuiting electrode may not be same as that of the IDT.

The thickness of the short-circuiting electrode is not particularly limited, as long as it can function as a short-circuiting electrode of a SAW device. The thickness of the short-circuiting electrode may preferably be in the range of about 50 to 3,000 Å (more preferably, about 100 to 500 Å). When the thickness is less than 50 Å, it is difficult to obtain an equipotential state as described above. On the other hand, when the thickness exceeds 3,000 Å, it may affect the reflection of SAW.

For example, the short-circuiting electrode may preferably has a planner shape of a "solid electrode" having an area substantially equal to that of the IDT to be used in combination therewith.

EXAMPLES

The following examples were carried out to determine optimum kh1 and kh2, which provide propagation velocity (V), electrical-mechanical coupling coefficient ($K^2$), temperature coefficient of frequency (TCF) and propagation loss, by focusing a thickness of aluminum IDT.

Example 1

Figure 6A:
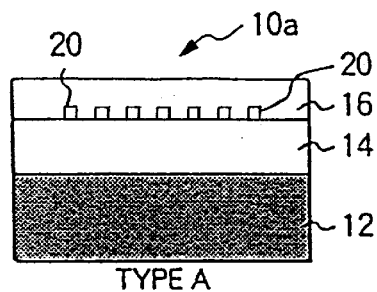
FIGS. 6A to 6G are schematic sectional views illustrating layer structures (type A to type G) according to the present invention.

The "type A" of SAW devices, illustrated in FIG. 6A, having different thickness of layers 14 and 16 and IDT, were prepared, and the desired thickness of ZnO and $SiO_2$ layers were evaluated for 2nd SAW mode so as to provide improved propagation velocity (V), effective coupling coefficient $K^2$, temperature coefficient of frequency TCF and propagation loss.

More specifically, each of the SAW devices of Examples 1 includes: a 20 μm thick of diamond 20; one of twenty different thicknesses within the range of 0.20 to 2.5 μm, of ZnO layer; one of twenty different thicknesses within the range of 210 to 4600 angstrom for single and double types of Al IDT; and one of twenty different thicknesses within the range of 0.15 to 2.0 μm, of $SiO_2$. The desired thicknesses of ZnO and $SiO_2$ layers and Al IDT are expressed by the parameters kh1, kh2 and kh3 for 2nd mode SAW having wavelength λ:

kh1=$2\pi(t_Z/\lambda)$, $t_Z$: thickness of ZnO layer;
kh2=$2\pi(t_S/\lambda)$, $t_S$: thickness of $SiO_2$ layer; and
kh3=$2\pi(t_A/\lambda)$, $t_A$: thickness of aluminum IDT.

A polycrystalline diamond film was formed on a (100) plane of monocrystalline silicon having dimension of 10×10×1 (mm), via microwave plasma CVD process. The Silicon substrate was placed within a vacuum CVD chamber of a microwave plasma CVD apparatus, and the CVD chamber was evacuated. Then a reactant gas which contains $CH_4$ and $H_2$(volumetric flow rate ratio; $CH_4$:$H_2$=1:200) was introduced. Diamond layer 12 having thickness of 20 μm was then deposited in the plasma created under the condition of:microwave power of 400 W, pressure of about 40 Torr and temperature of 850° C. The deposition rate of the diamond was about 1.0 μm/hr. The deposited diamond layer was allowed to stand for 10 minutes in the air of 450° C., to enhance the resistance of diamond layer.

After the deposited diamond surface was polished, the Si substrate having diamond layer thereon was transferred to a vacuum chamber of a magnetron sputtering apparatus to deposit ZnO layer 14 onto the diamond layer 12. A polycrystalline ZnO target was included within the chamber. The ZnO target was sputtered with flowing a sputtering gas containing Ar and $O_2$ (Ar:$O_2$=1:1) through the chamber, under the sputtering condition of: sputtering power of 150 W and substrate temperature of 380° C. The deposition rate of the ZnO layer was 1.8 μm/hr. The thickness of ZnO layer could be controlled by adjusting the deposition duration under the constant deposition rate (1.8 μm/hr).

Figure 26A:
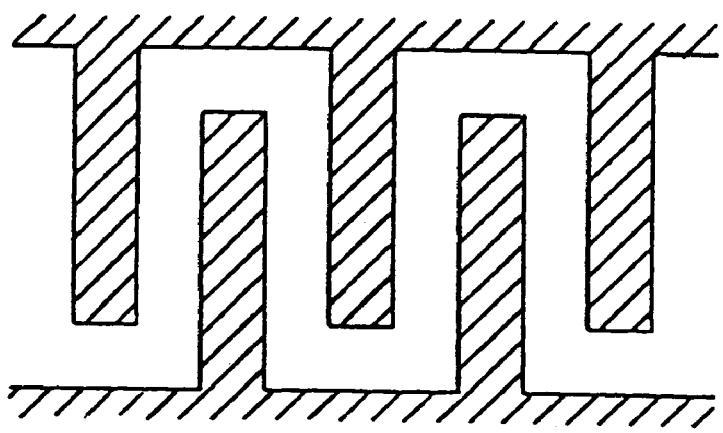
FIG. 26A schematically illustrates a planar shape of an IDT (single-type electrode)
Figure 26B:
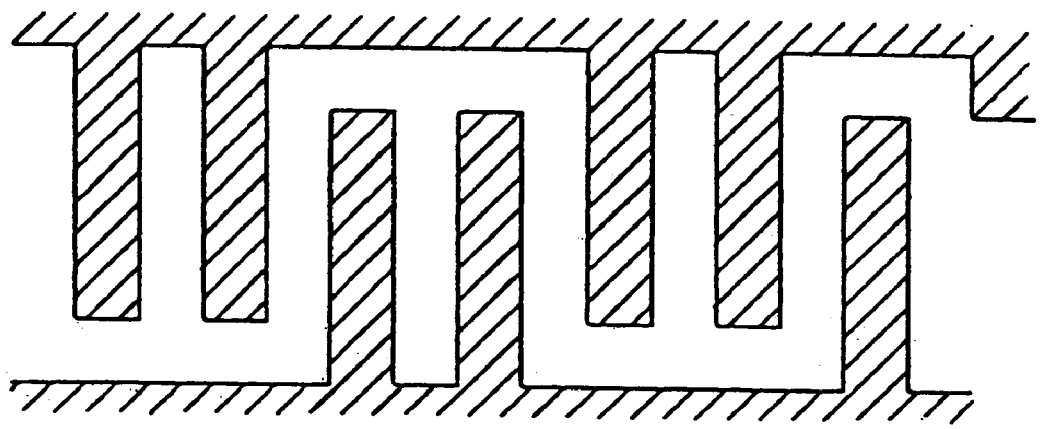
FIG. 26B schematically illustrates a planar shape of an IDT (double-type electrode)

Aluminum IDTs 20 having planer shape of one of single-type and double-type electrodes as shown in FIGS. 26A and 26B, respectively (electrode element width d=1 μm; aperture length (pitch)=200 μm so as to provide wavelength=4 μm for single type IDT, aperture length (pitch)=400 μm so as to provide wavelength=8 μm for double type IDT) was formed on ZnO layer 14 by resistance heating processing and subsequent etching. Thus, the SAW devices having single type IDT and the SAW devices having double type IDT were formed. The thickness of Al IDT could be controlled by adjusting the duration of the resistance heating processing.

Then, after ZnO target in the apparatus was replaced by Si target, an $SiO_2$ layer 16 having predetermined thickness was formed over the IDTs via RF sputtering process under the condition of: pressure of $1\times10^{-2}$ Torr, substrate temperature of 150° C. and Ar:$O_2$=1:1, RF power of 200 W. The deposition rate of the $SiO_2$ layer was 0.54 μm/hr. The thickness of $SiO_2$ layer could be controlled by adjusting the deposition duration under the constant deposition rate (0.54 μm/hr).

With respect to each of the SAW devices illustrated in FIG. 6A, radio frequency (RF) power was applied to the input IDT to generate SAW of 2nd mode. The propagation velocities V (m/s) of the generated SAW of 2nd mode were determined depending on a relationship of V=f×λ. (f: center frequency, λ=4d=4 μm for single type IDT, λ=8d=8 μm for double type IDT). The effective coupling coefficient ($K^2$) was also evaluated by measuring the radiation conductance (wherein the real part is denoted by "G") of the IDT by using a network analyzer ("Network Analyzer 8719A", commercially available from Yokogawa Hewlett Packard (YHP), Japan), and by using following formula:

$K^2=G/(8 \cdot f_0 \cdot C \cdot N)$ ($f_0$: center frequency, C: total electrostatic capacitance of IDT, N: pair number of IDT).

TCF measurement was carried out by the following manner: SAW device was heated by an external heater from room temperature to 70° C. The central frequency $F_0$ was measured at every 10° C. from the room temperature to 70° C. Proportional relationship between the central frequency and the device temperature. TCF was given by the slope of the relationship.

Further, propagation loss was evaluated by the following manner: SAW devices having same layer/electrode constitution but different spacing between input IDT and output IDT (e.g., 50 wavelength, 100 wavelength and 150 wave length) were fabricated. A relationship of insertion loss with the spacing was evaluated to be proportional. Then the propagation loss was obtained by the slop of the relationship.

The thickness $t_Z$ (μm) of the ZnO layers of each SAW devices, and the thickness $t_S$ (μm) of the SiO$_2$ layers of each SAW device were measured by cutting off the device after the measurement of device performances as described above, and observing the resultant section of the device with a scanning electron microscope (SEM) at a magnification of 1000–5000×. Thus, the values of the parameters of $kh1=2\pi(t_Z/\lambda)$ and $kh2=2\pi(t_S/\lambda)$ were determined for each of the SAW devices.

Figure 7:
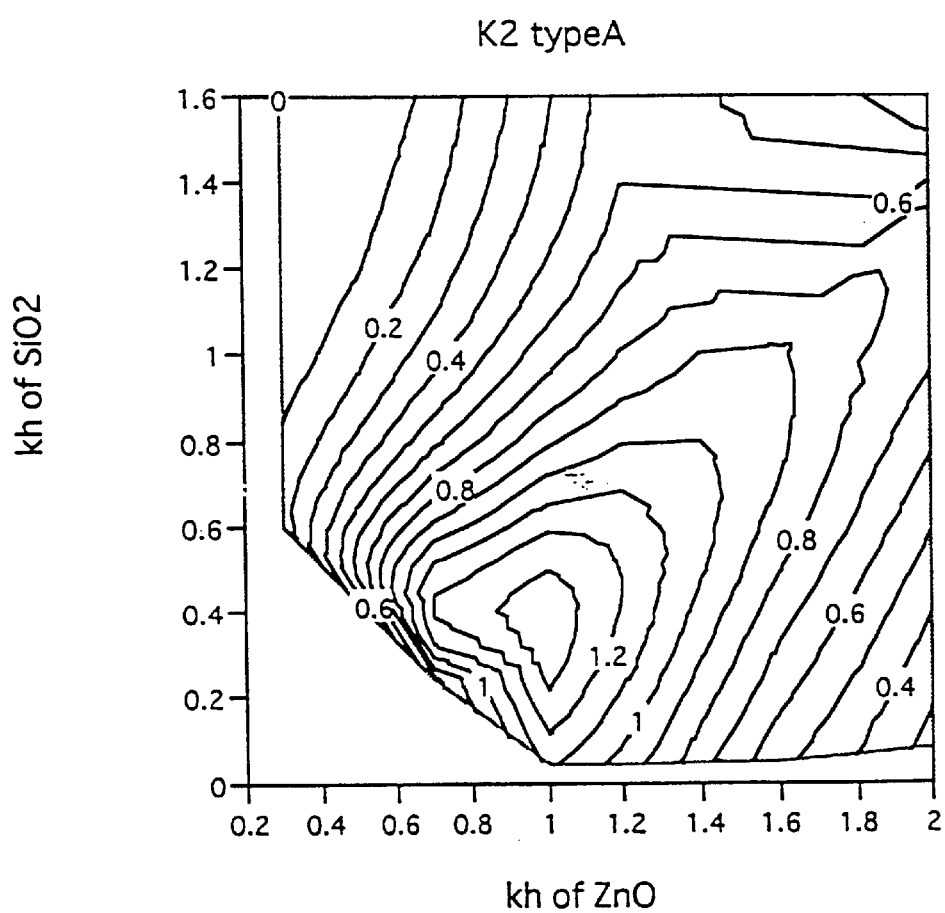
FIG. 7 is a graph showing relationship of parameters kh1 and kh2 for the SAW device of "type A" at various effective coupling coefficients $K^2s$, which was obtained in Example 1.

Variation of the effective coupling coefficient K$^2$ with the thickness of ZnO layer 14 and SiO$_2$ layer is illustrated in FIG. 7. FIG. 7 is a graph having abscissa axis of kh1 and ordinate axis of kh2, showing the relationship of the parameters kh1 and kh2 at the given effective coupling coefficient K$^2$. The numerical value at each curve is the value of K$^2$ in %. The K$^2$ value in FIG. 3 do not depends on value of kh3.

Figure 14:
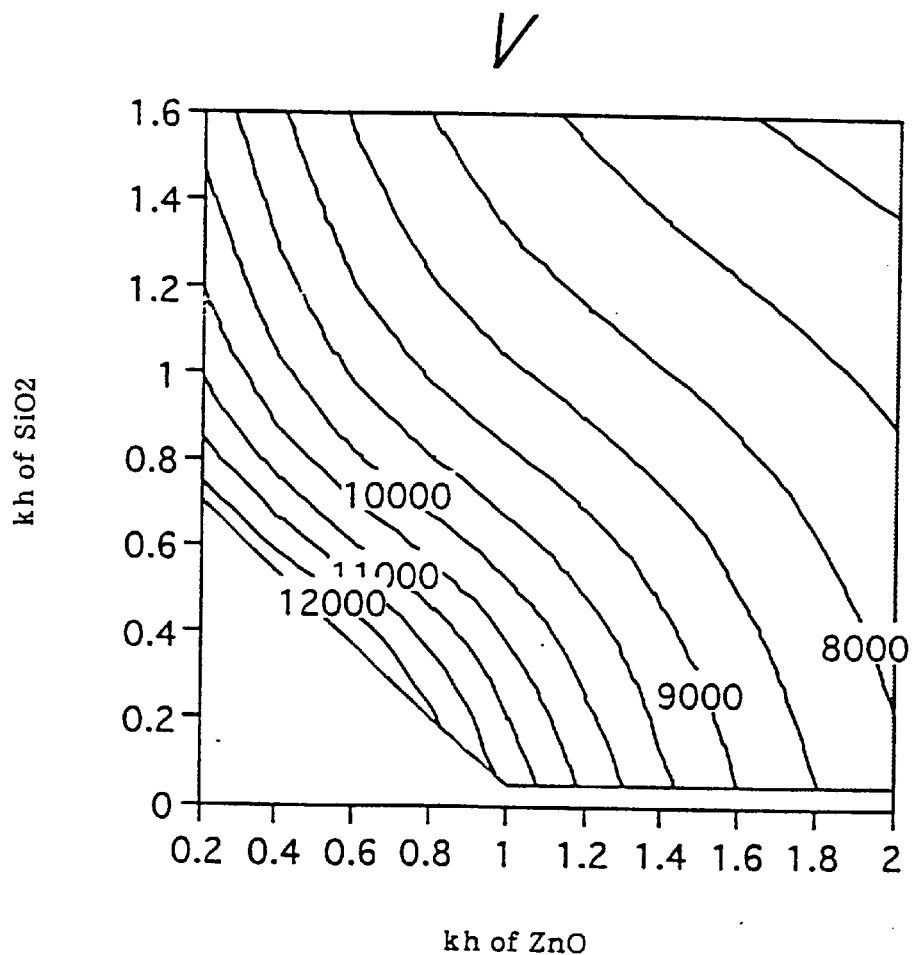
FIG. 14 is a graph showing relationship of parameters kh1 and kh2 for the SAW device of "type A", "type B", "type C", "type D", "type E", "type F" and "type G", at various propagation velocities Vs, in the case of kh3=0.066.
Figure 15:
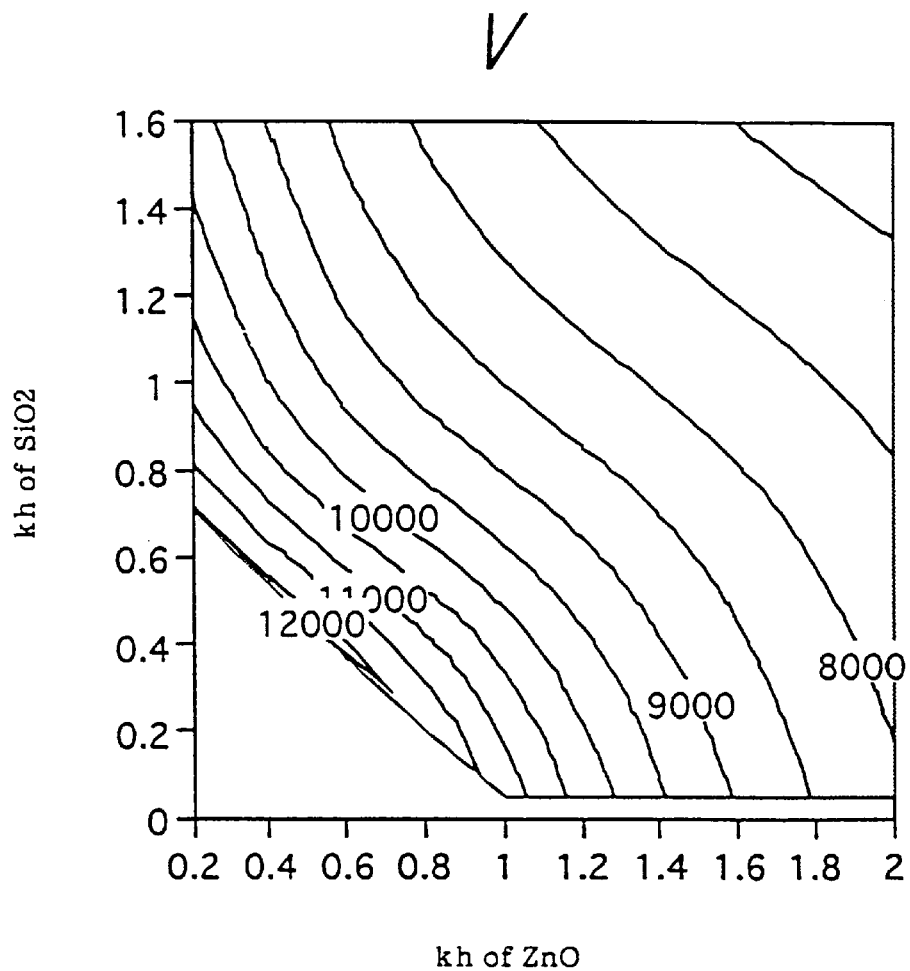
FIG. 15 is a graph showing relationship of parameters kh1 and kh2 for the SAW device of "type A", "type B", "type C", "type D", "type E", "type F" and "type G", at various propagation velocities Vs, in the case of kh3=0.132.
Figure 16:
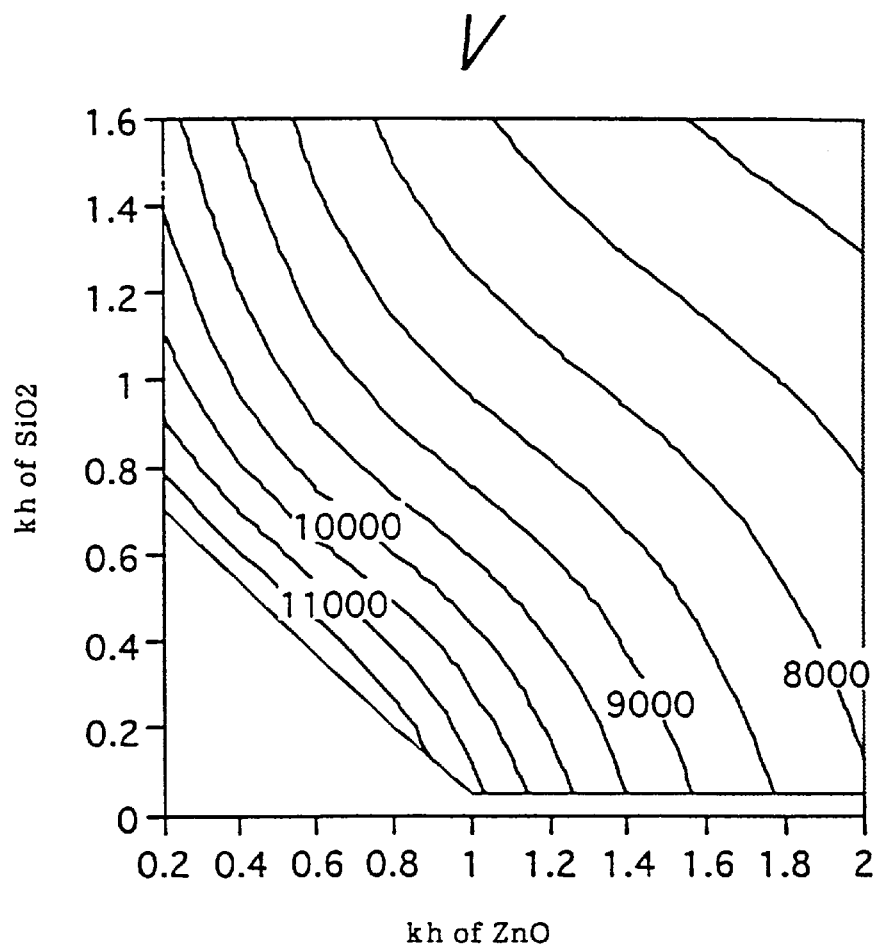
FIG. 16 is a graph showing relationship of parameters kh1 and kh2 for the SAW device of "type A", "type B", "type C", "type D", "type E", "type F" and "type G", at various propagation velocities Vs, in the case of kh3=0.198.
Figure 17:
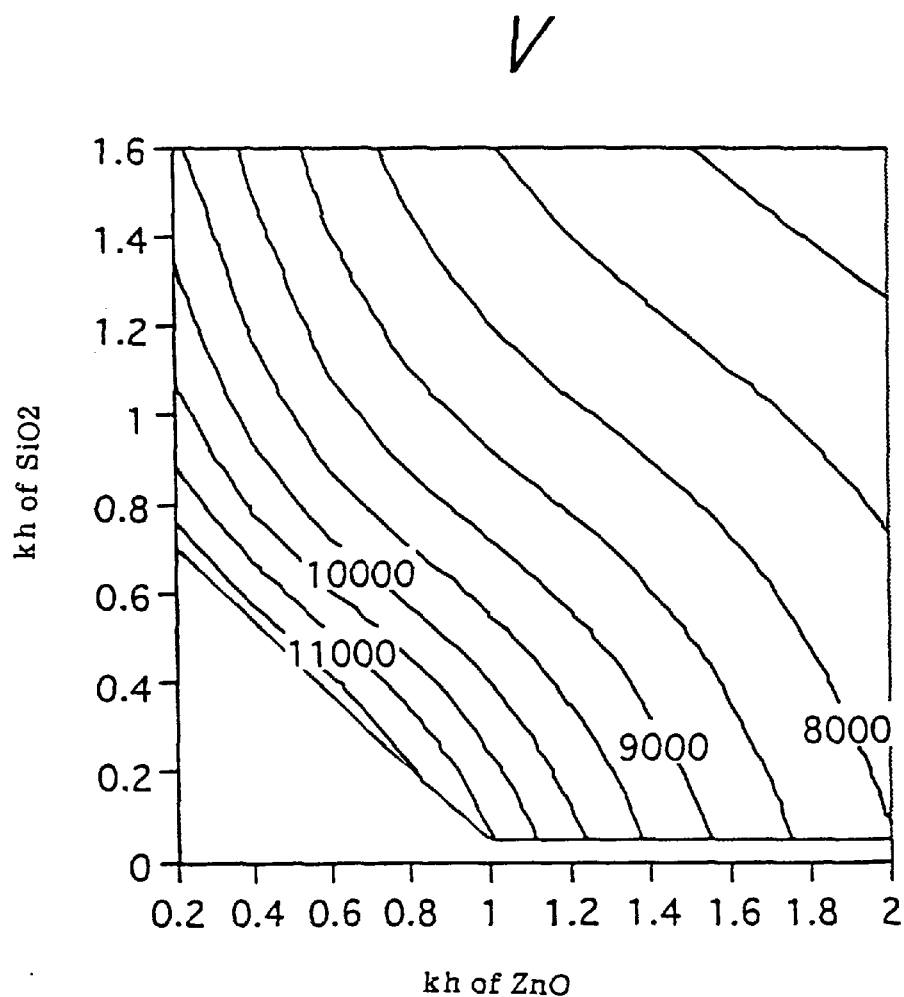
FIG. 17 is a graph showing relationship of parameters kh1 and kh2 for the SAW device of "type A", "type B", "type C", "type D", "type E", "type F" and "type G", at various propagation velocities Vs, in the case of kh3=0.264.
Figure 18:
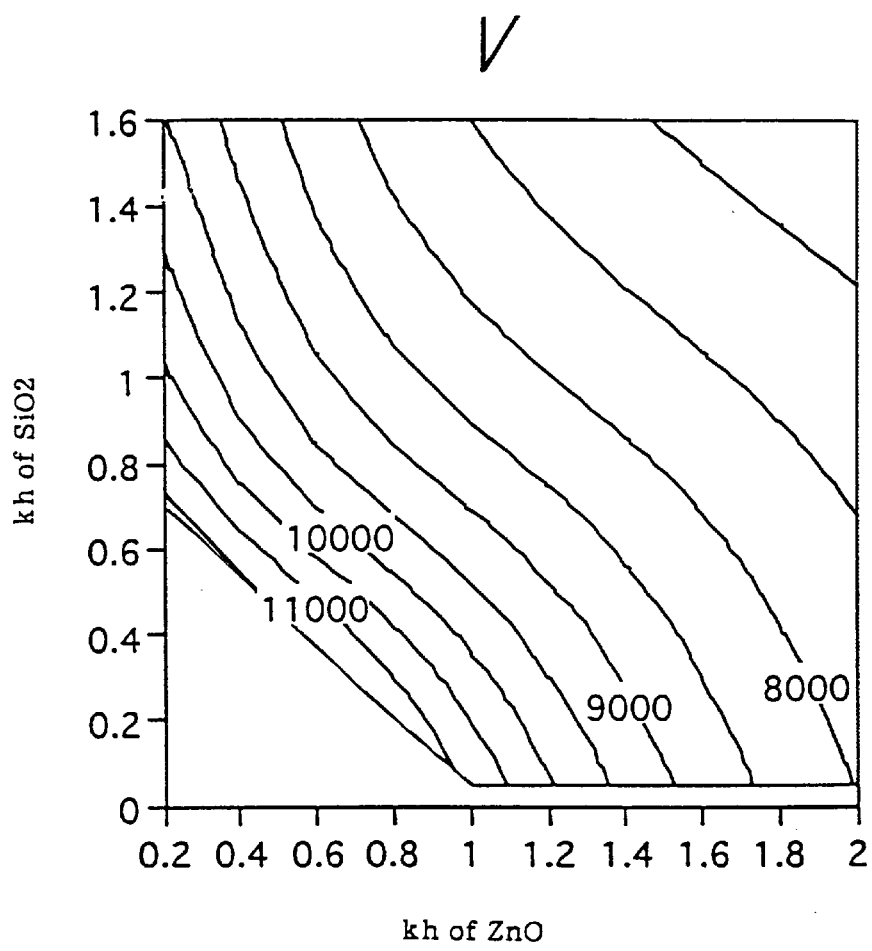
FIG. 18 is a graph showing relationship of parameters kh1 and kh2 for the SAW device of "type A", "type B", "type C", "type D", "type E", "type F" and "type G", at various propagation velocities Vs, in the case of kh3=0.330.
Figure 19:
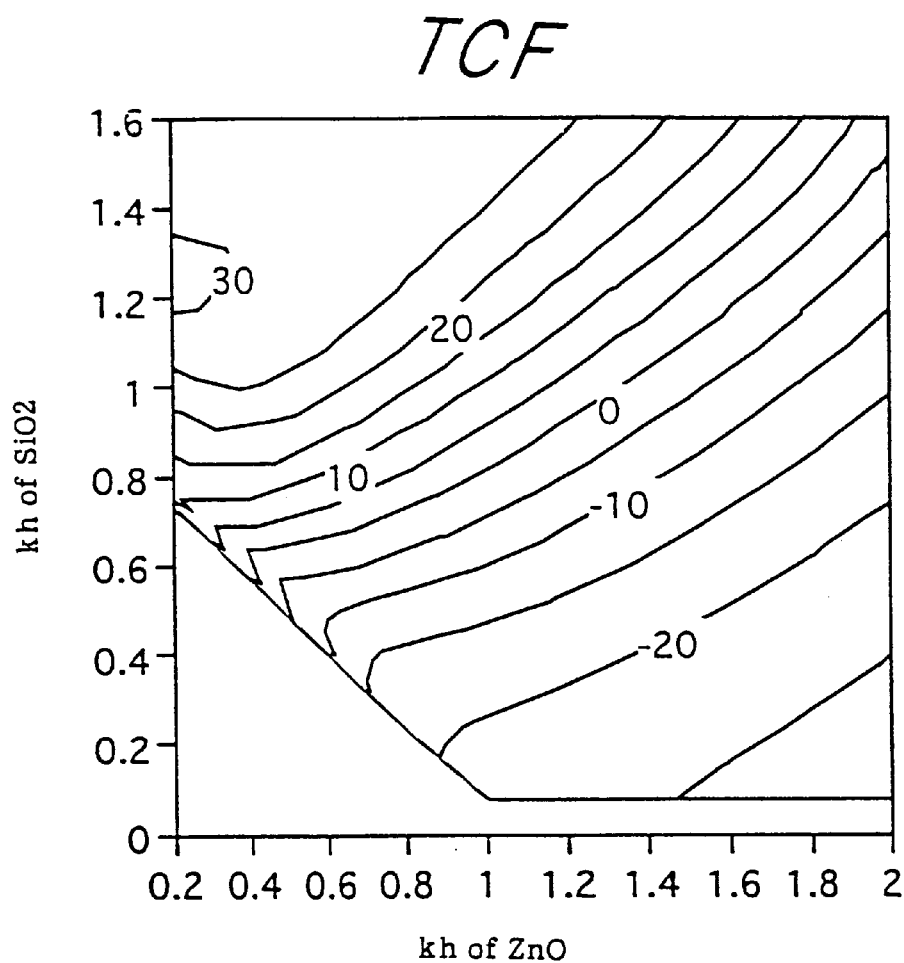
FIG. 19 is a graph showing relationship of parameters kh1 and kh2 for the SAW device of "type A", "type B", "type C", "type D", "type E", "type F" and "type G", at various TCFs in the case of kh3=0.066.
Figure 20:
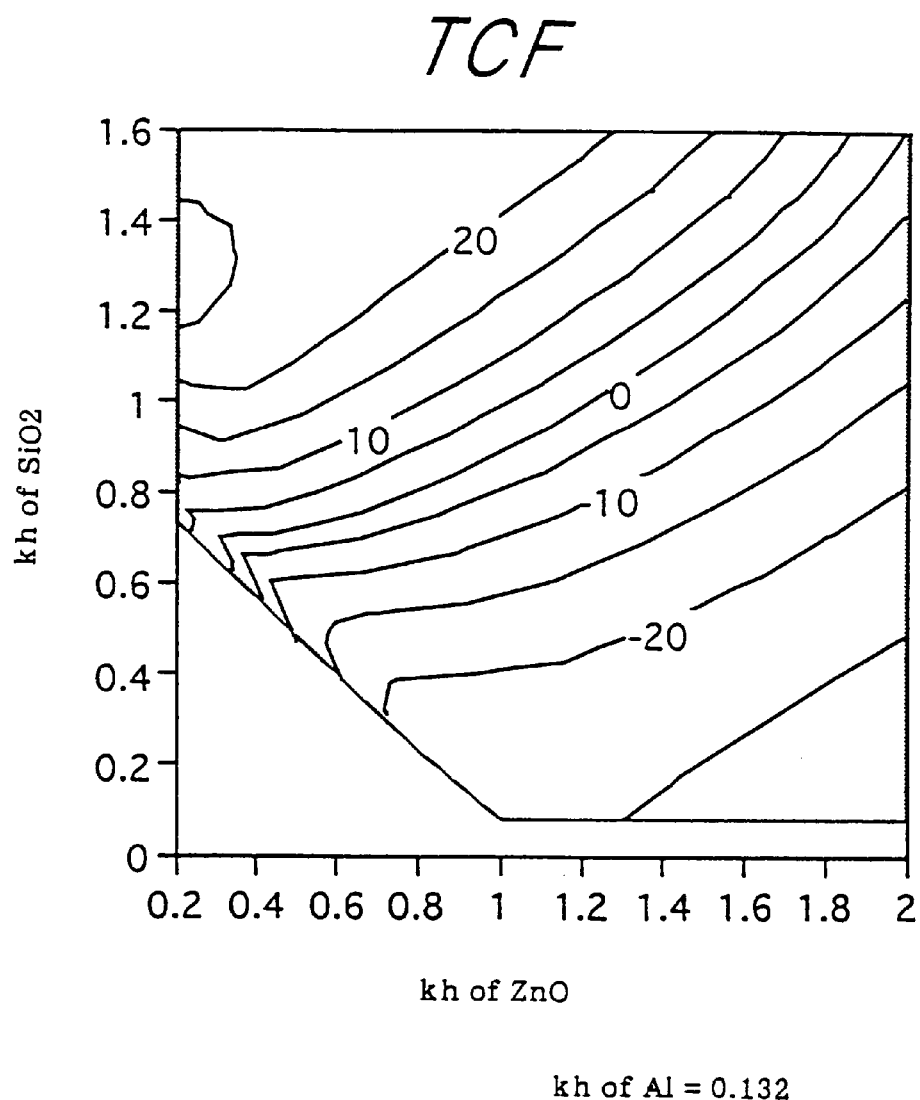
FIG. 20 is a graph showing relationship of parameters kh1 and kh2 for the SAW device of "type A", "type B", "type C", "type D", "type E", "type F" and "type G", at various TCFs in the case of kh3=0.132.
Figure 21:
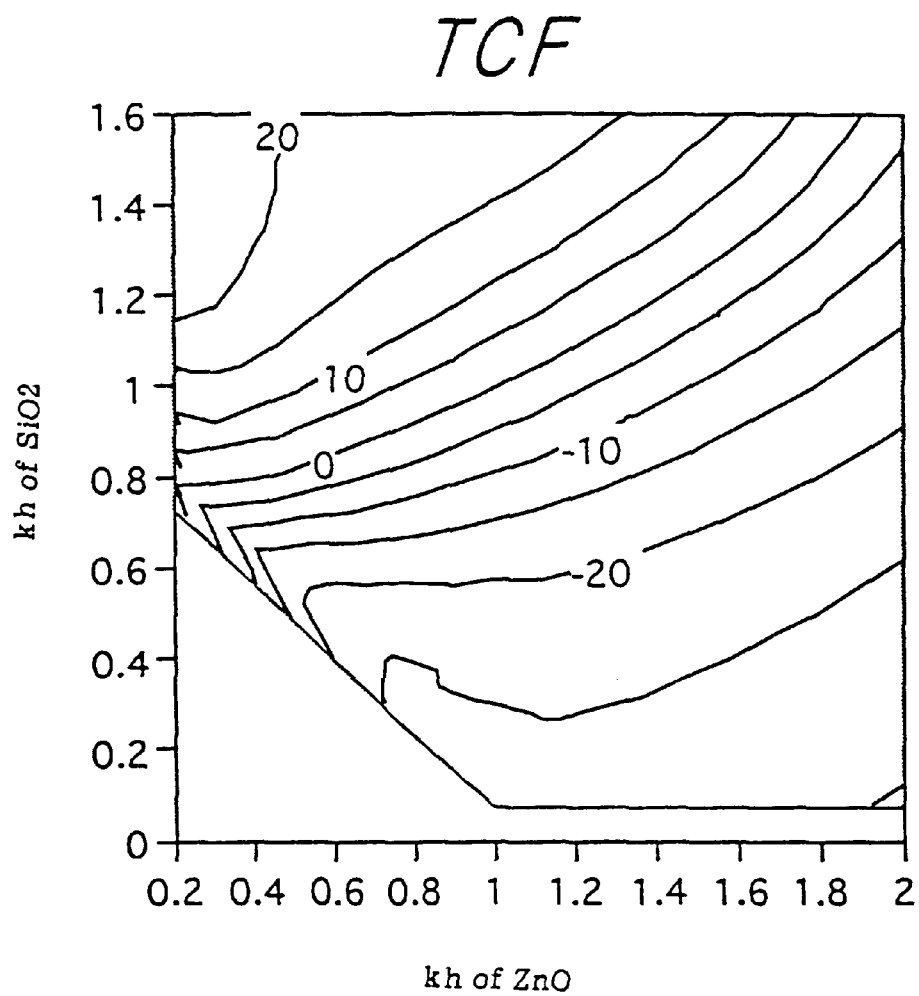
FIG. 21 is a graph showing relationship of parameters kh1 and kh2 for the SAW device of "type A", "type B", "type C", "type D", "type E", "type F" and "type G", at various TCFs in the case of kh3=0.198.
Figure 22:
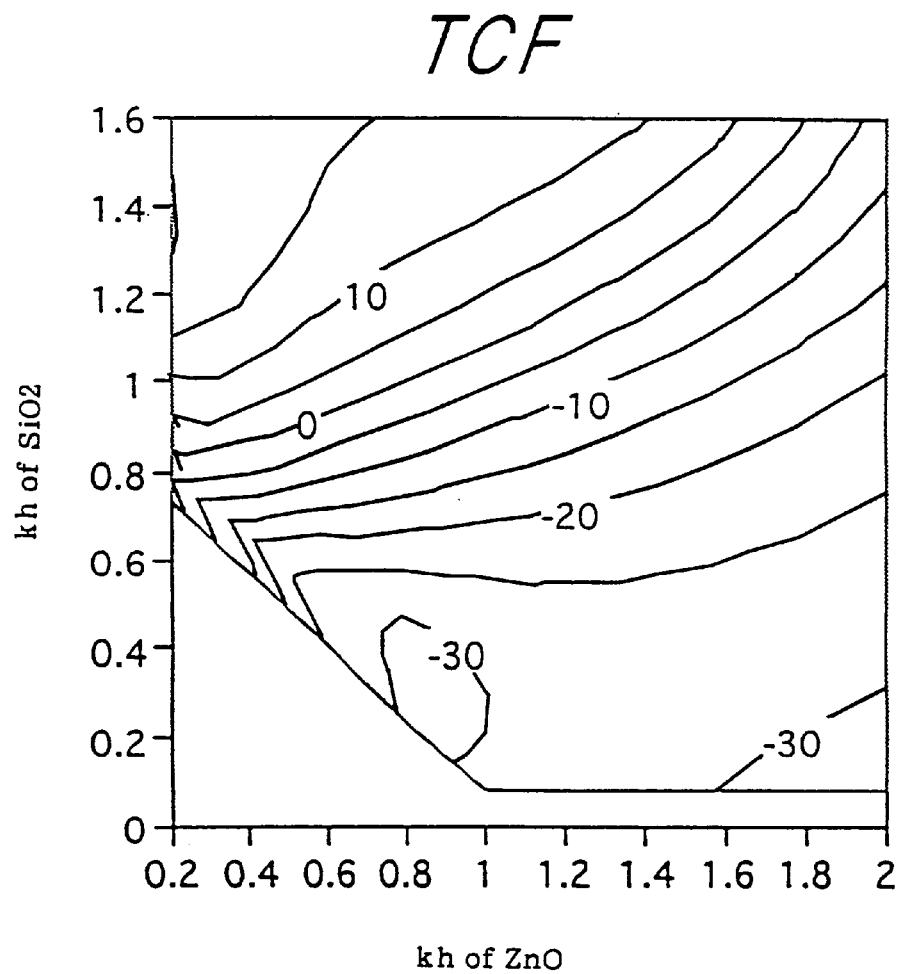
FIG. 22 is a graph showing relationship of parameters kh1 and kh2 for the SAW device of "type A", "type B", "type C", "type D", "type E", "type F" and "type G", at various TCFs in the case of kh3=0.264.
Figure 23:
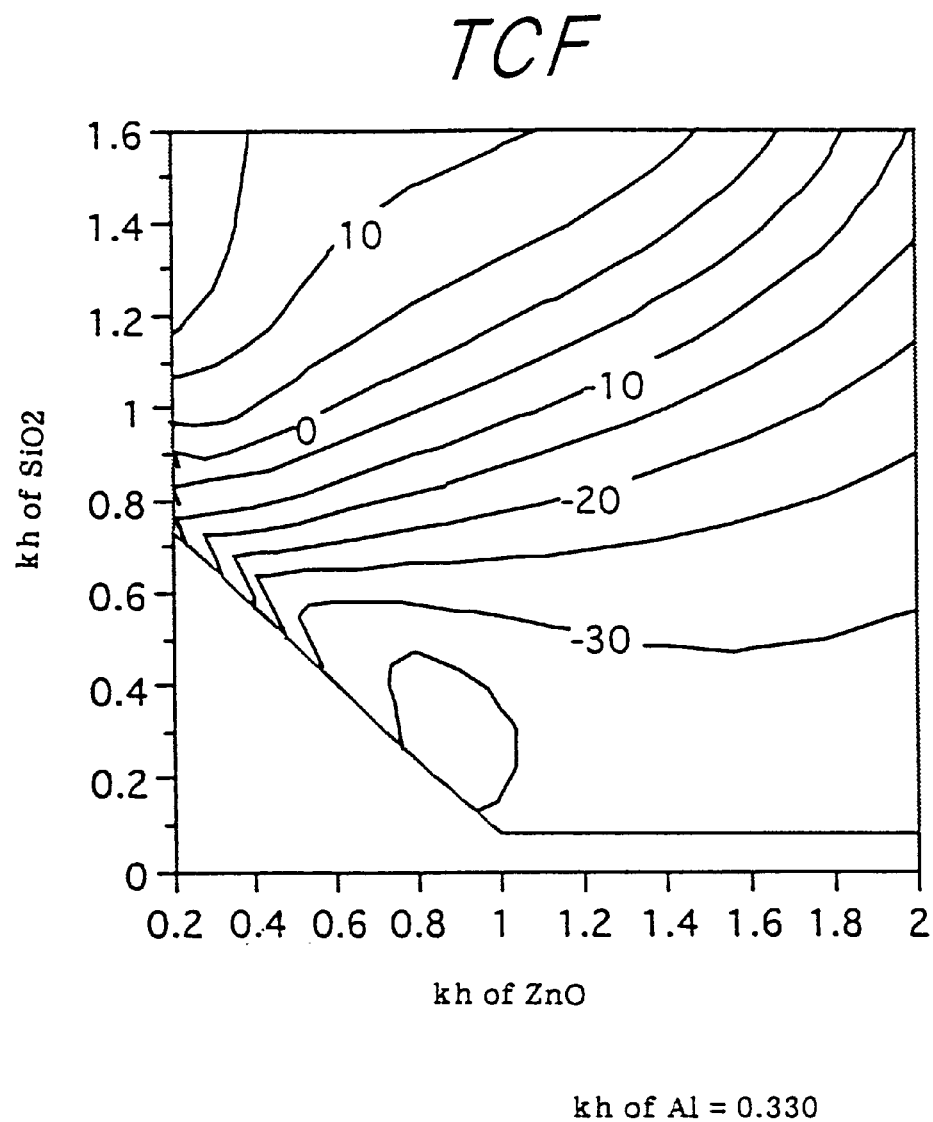
FIG. 23 is a graph showing relationship of parameters kh1 and kh2 for the SAW device of "type A", "type B", "type C", "type D", "type E", "type F" and "type G", at various TCFs in the case of kh3=0.330.
Figure 24:
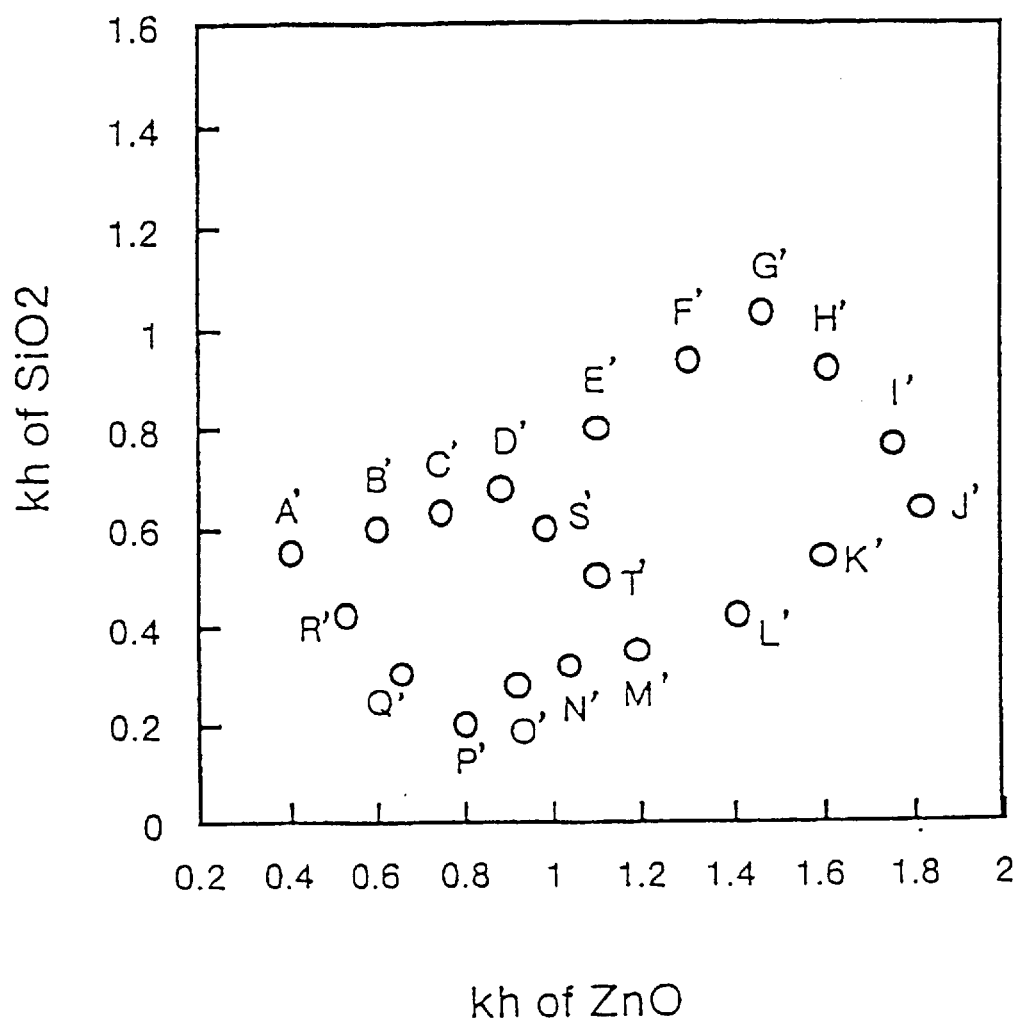
FIG. 24 is a graph in the two-dimensional Cartesian coordinate having abscissa axis of kh1(kh of ZnO) and ordinate axis of kh2(kh of SiO$_2$), illustrating the region A'B'C'D'E'F'G'H'I'J'K'L'M'N'O'P'Q'R'A' and the region A'B'C'D'S'T'M'N'O'P'Q'R'A', which are obtained in the first preliminary evaluation.
Figure 25:
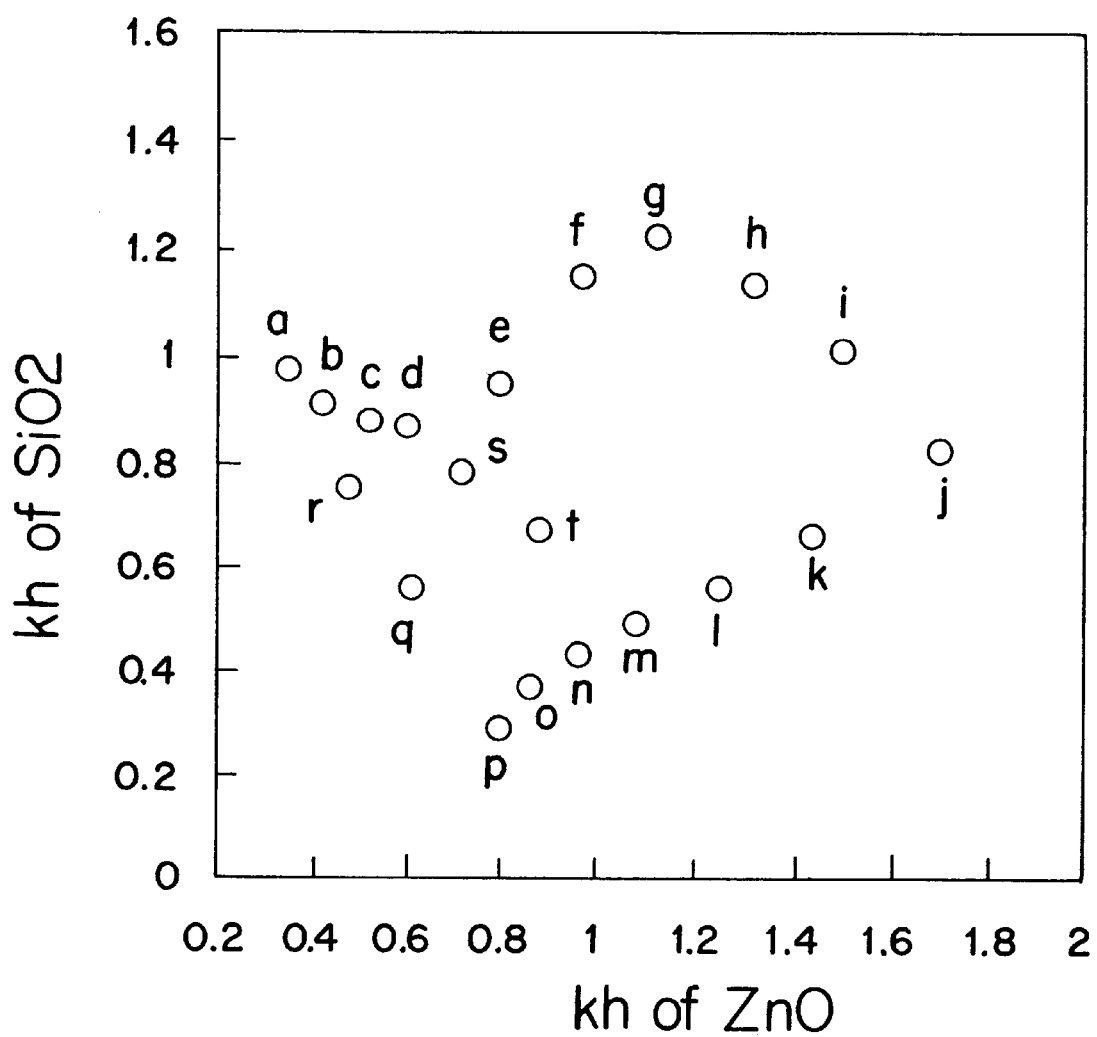
FIG. 25 is a graph in the two-dimensional Cartesian coordinate having abscissa axis of kh1(kh of ZnO) and ordinate axis of kh2(kh of SiO$_2$), illustrating the region abcdefghijklmnopqra and the region abcdstmnopqra, which are obtained in the second preliminary evaluation.

Similarly, the relationship of propagation velocity (V) and TCF with $t_Z$ and $t_S$ were evaluated. V and TCF, unlike K$^2$, vary with a value of kh3, and the exemplary results for specific kh3 are shown. The propagation velocity V (m/sec) with the parameters $kh1=2\pi(t_Z/\lambda)$ and $kh2=2\pi(t_S/\lambda)$ in the case of kh3=0.066, is shown in FIG. 14. V (m/sec) with the parameters kh1(kh os ZnO) and kh2(kh of SiO$_2$) in the case of kh3=0.132, is shown in FIG. 15. Similarly, V in the case of kh3=0.198, is shown in FIG. 16, V in the case of kh3=0.264, is shown in FIG. 17, and V in the case of kh3=0.330, is shown in FIG. 18. The relationship of TCF (ppm/° C.) with kh1 and kh2 for kh3=0.066 is also shown in FIG. 19. Similarly, TCF in the case of kh3=0.132, is shown in FIG. 20, TCF in the case of kh3=0.198, is shown in FIG. 21, TCF in the case of kh3=0.264, is shown in FIG. 22, and TCF in the case of kh3=0.330, is shown in FIG. 23.

Further, measured propagation loss was 0.05 dB/wavelength for 1st mode SAW, and 0.03 dB/wavelength for 2nd mode SAW.

Examples 2–7

Figure 6B:
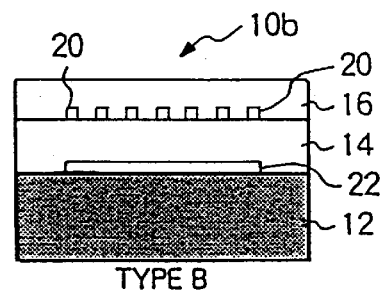
Figure 6C:
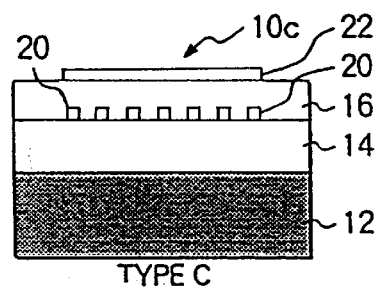
Figure 6D:
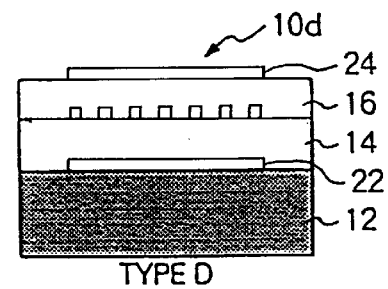
Figure 6E:
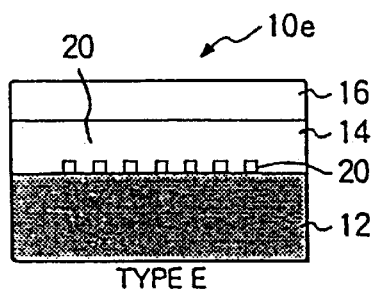
Figure 6F:
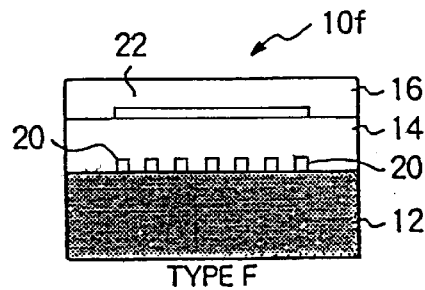
Figure 6G:
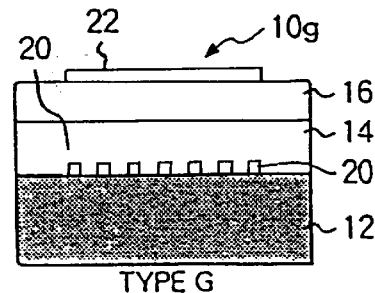

In Examples 2–7, following SAW devices were fabricated by similar fabricating processes as used in Example 1: "type B" SAW device 10b (FIG. 6B) was made in Example 2; "type C" SAW device 10c (FIG. 6C) was made in Example 3; "type D" SAW device 10d (FIG. 6D) was made in Example 4; "type E" SAW device 10e (FIG. 6E) was made in Example 5; "type F" SAW device 10f (FIG. 6F) was made in Example 6; and "type G" SAW device 10g (FIG. 6G) was made in Example 7.

As seen in these figures, the arrangement of IDT is different by Examples. In Example 2 (type B), Example 3 (type C) and Example 4 (type D), IDT 20 was formed onto ZnO layer 14 after ZnO layer 14 had been deposited, as described in Example 1. In Example 5 (type E), Example 6 (type F) and Example 7 (type G), IDT 20 was formed by the same forming process as used in Example 1, after polishing the surface of diamond layer 12 and before depositing ZnO layer; and then ZnO layer 14 was deposited onto diamond layer 12 to cover IDT 20.

In Example 2 (type B), Example 3 (type C), Example 4 (type D), Example 6 (type F) and Example 7 (type G), short circuiting electrodes 22 and 24 are included in the SAW device. The formation of the short circuiting electrodes 22 and 24 was carried out by the following manner: in Examples 2 (B) and 6 (F), after diamond 12 was deposited and polished, an aluminum layer having thickness of 50 to 250 angstrom was formed by resistive heating method. Then the aluminum layer was patterned via conventional photolithography to form short circuiting electrode 22, which has a geometrically corresponding to the location of IDT 20. In Example 3 (C) and Example 7 (G), short circuiting electrode 22, which has a geometry corresponding to the location of IDT 20, was formed on SiO$_2$ layer 16 via similar process as used in Examples 2 and 6, after depositing SiO$_2$ layer 16. In Example 4, short circuiting electrode 22 was formed onto diamond 12, and short circuiting electrode 24 was formed onto ZnO layer 14. In both formation processes for electrodes 2 and 24, similar processing as used in Examples 2 and 3 was employed. Each of electrodes 22 and 24 has a geometry corresponding to the location of IDT 20.

As carried out in Example 1, plurality of SAW devices having different thickness of layers 14 and 16, were prepared in each Example, and the desired thickness of ZnO and SiO$_2$ layers were evaluated for 2nd SAW mode so as to provide improved propagation velocity (V), effective coupling coefficient K$^2$, temperature coefficient of frequency TCF and propagation loss.

More specifically, each of the SAW devices of each of the Examples 2–7 includes: a 20 μm thick of diamond 20; one of twenty different thicknesses within the range of 210 to 4600 angstrom, of Al IDT; one of twenty different thicknesses within the range of 0.20 to 2.5 μm of ZnO layer; and one of twenty different thicknesses within the range of 0.15 to 2.0 μm of SiO$_2$. In the Examples 2–7, each of the thicknesses of the layers and IDT were controlled by adjusting the deposition duration (deposition time) under constant deposition rate. The desired thicknesses of ZnO and SiO$_2$ layers are expressed by the parameters kh1 and kh2 for 2nd mode SAW having wavelength λ, as in Example 1:

$kh1=2\pi(t_Z/\lambda)$, $t_Z$: thickness of ZnO layer;
$kh2=2\pi(t_S/\lambda)$, $t_S$: thickness of SiO$_2$ layer; and
$kh3=2\pi(t_A/\lambda)$, $t_A$: thickness of Al IDT.

Effective coupling coefficient K$^2$ of each of the SAW devices was evaluated by similar manner as used in Example 1.

Figure 8:
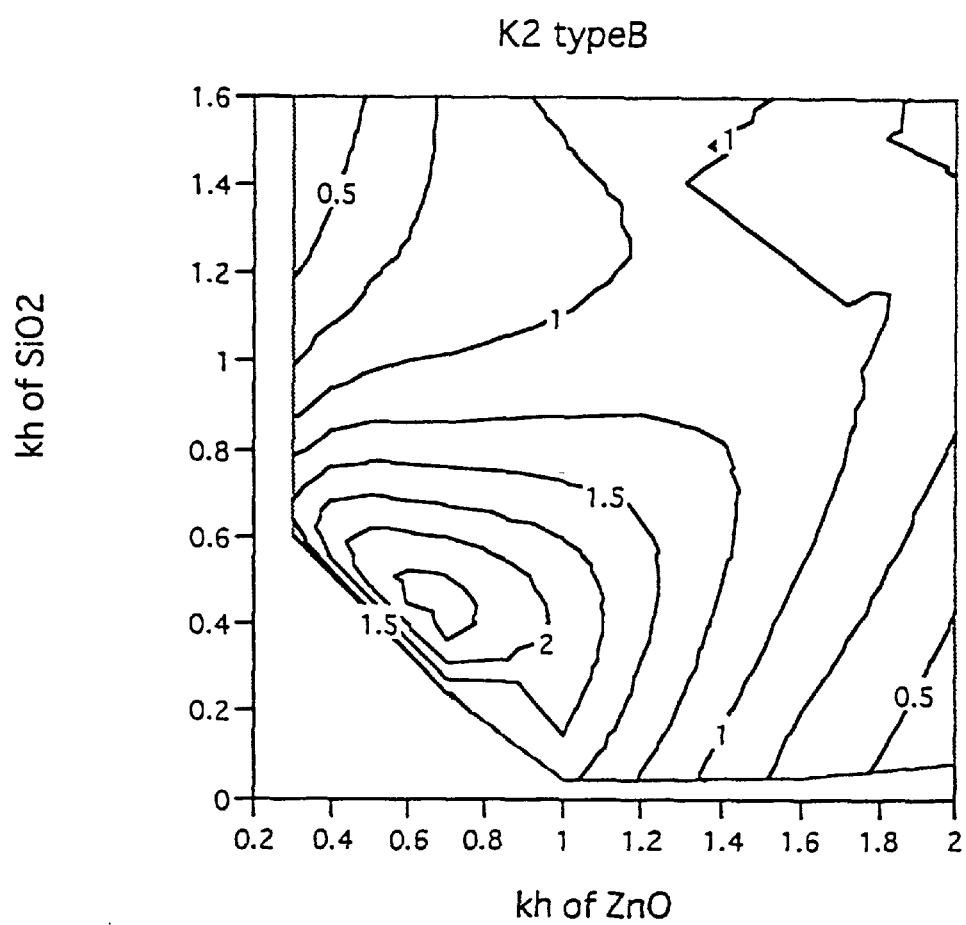
FIG. 8 is a graph showing relationship of parameters kh1 and kh2 for the SAW device of "type B" at various effective coupling coefficients $K^2s$ which was obtained in Example 2.
Figure 9:
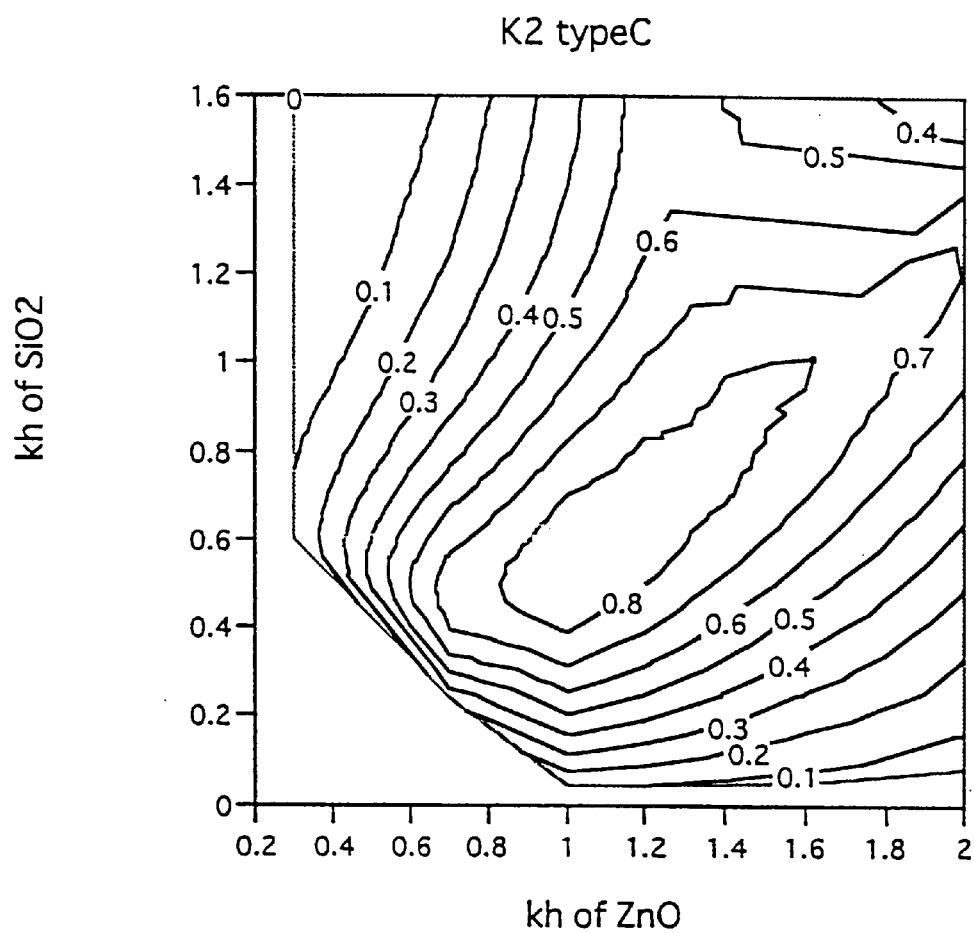
FIG. 9 is a graph showing relationship of parameters kh1 and kh2 for the SAW device of "type C" at various effective coupling coefficients $K^2s$ which was obtained in Example 3.
Figure 10:
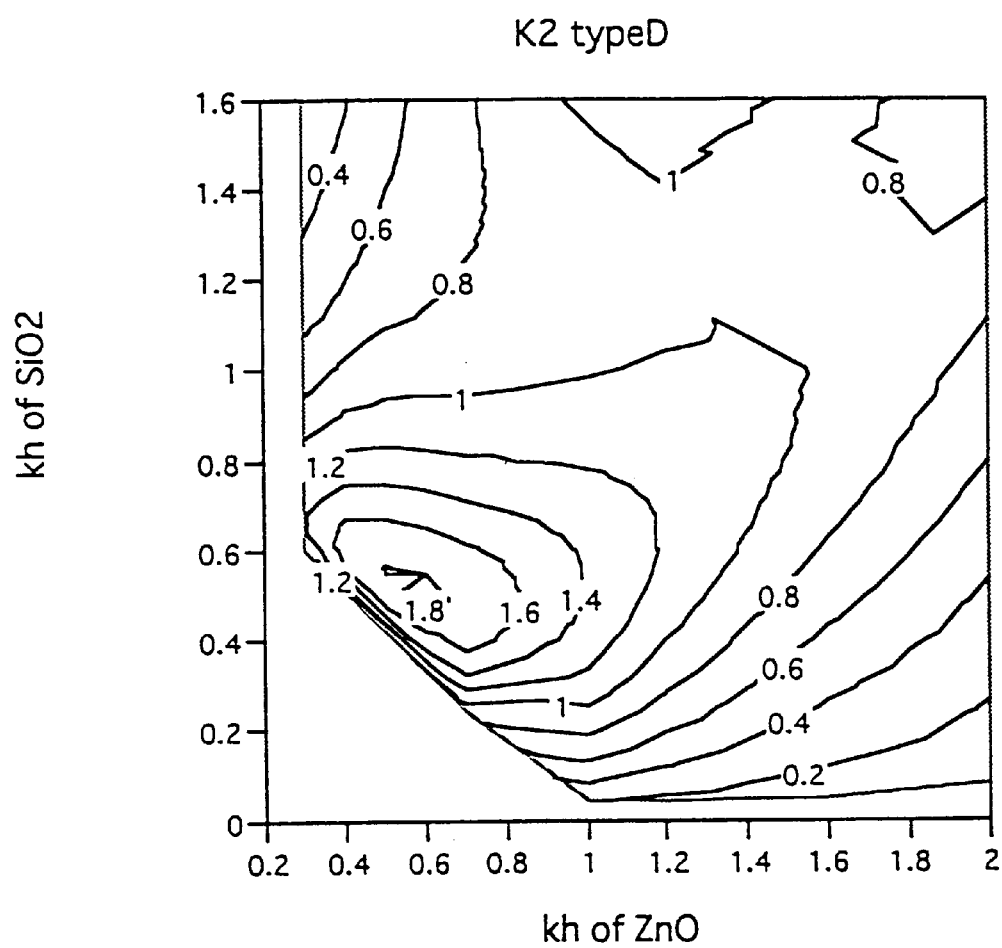
FIG. 10 is a graph showing relationship of parameters kh1 and kh2 for the SAW device of "type D" at various effective coupling coefficients $K^2s$, which was obtained in Example 4.
Figure 11:
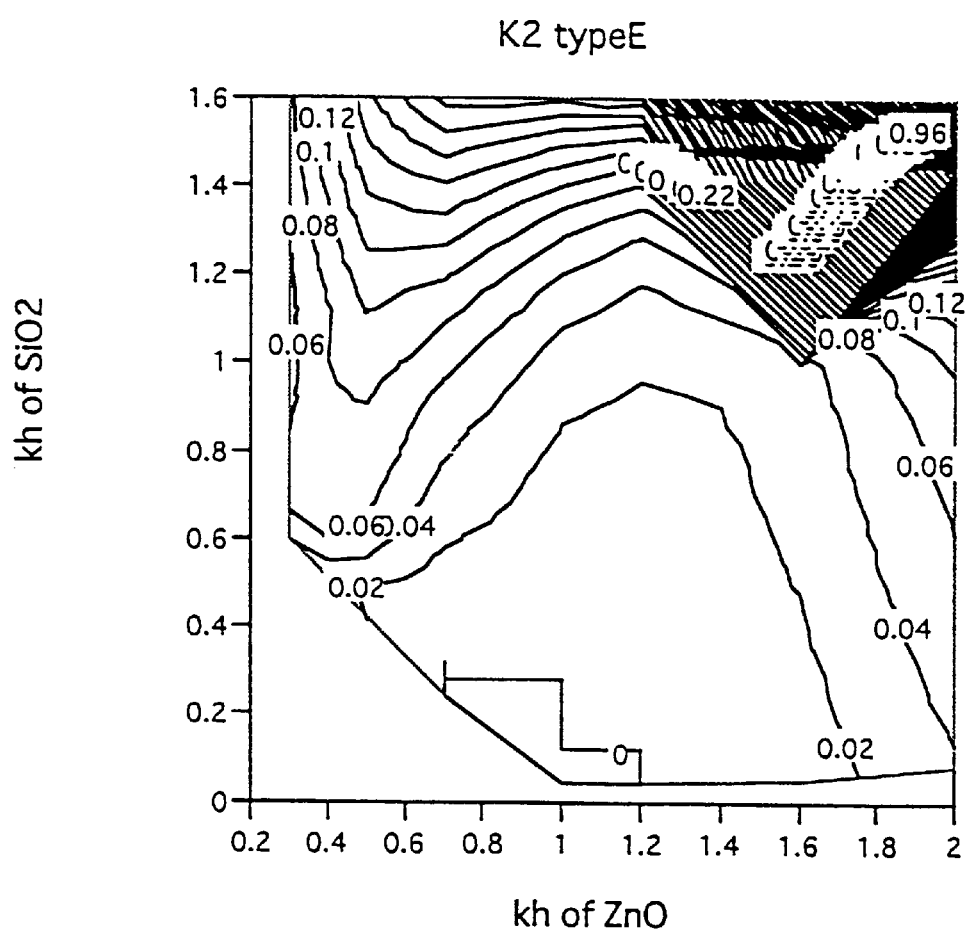
FIG. 11 is a graph showing relationship of parameters kh1 and kh2 for the SAW device of "type E" at various effective coupling coefficients $K^2s$, which was obtained in Example 5.
Figure 12:
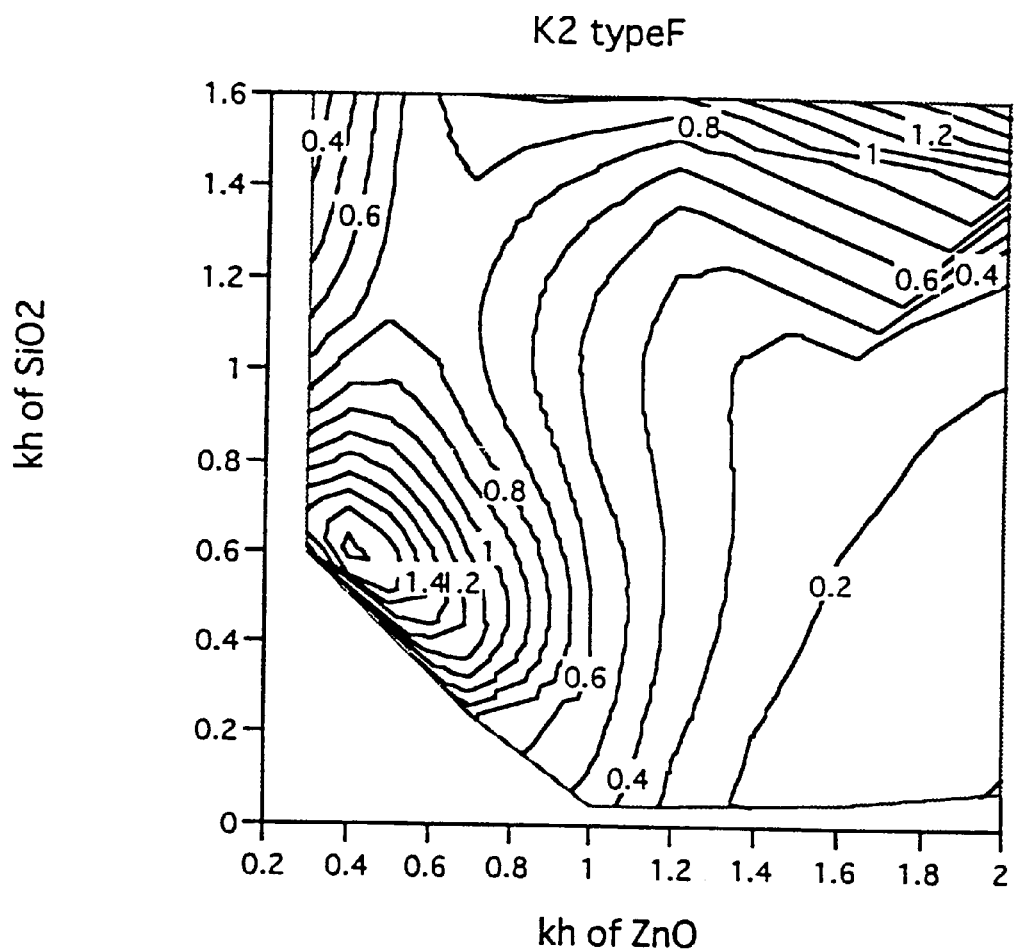
FIG. 12 is a graph showing relationship of parameters kh1 and kh2 for the SAW device of "type F" at various effective coupling coefficients $K^2s$, which was obtained in Example 6.
Figure 13:
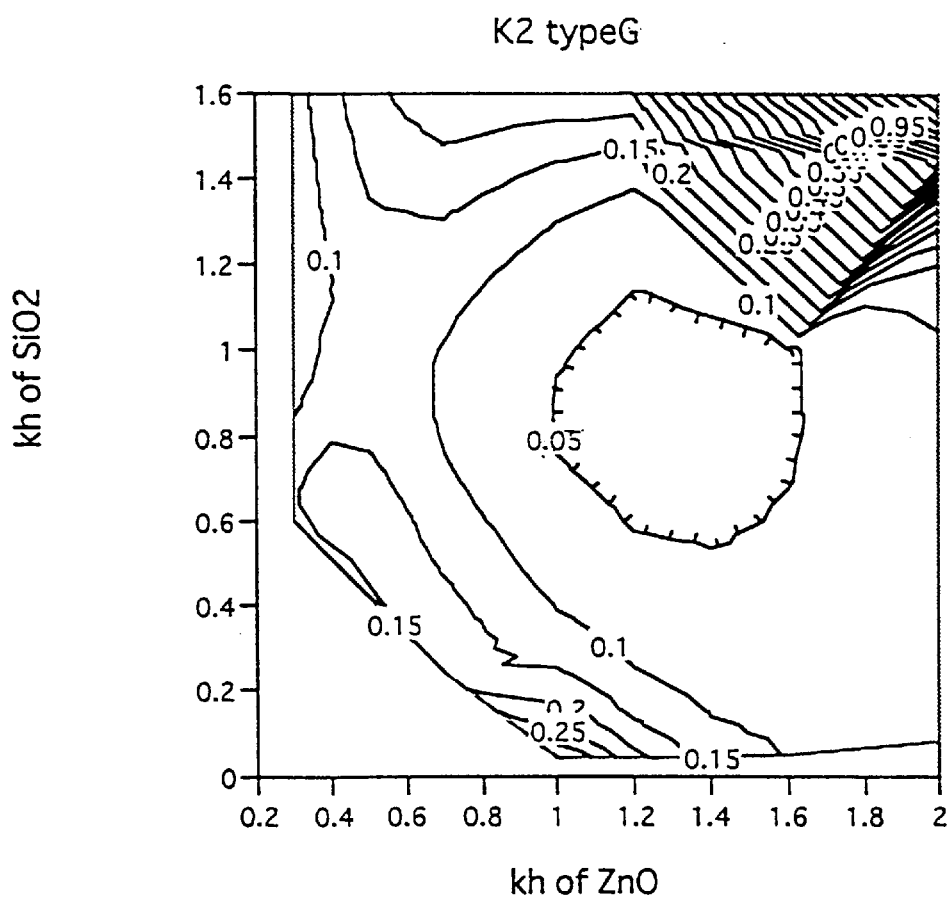
FIG. 13 is a graph showing relationship of parameters kh1 and kh2 for the SAW device of "type G" at various effective coupling coefficients $K^2s$, which was obtained in Example 7.

Variation of the effective coupling coefficient K$^2$ (%) with the thickness of ZnO layer 14 and SiO$_2$ layer is illustrated in FIGS. 8 to 13. FIGS. 8 to 13 are graph having abscissa axis of kh1 and ordinate axis of kh2, showing the relationship of the parameters kh1 and kh2 at the given effective coupling coefficient K$^2$ in Examples 2 to 7, respectively. The numerical value at each curve is the value of K$^2$ in %. FIG. 8 illustrates the relationship obtained in Example 2; FIG. 9 shows the results of Example 3; FIG. 10 shows the results of Example 4; FIG. 11 shows the results of Example 5; FIG. 12 shows the results of Example 6; and FIG. 13 shows the results of Example 7.

Propagation velocity V (m/sec) and TCF (ppm/° C.) of each of the SAW devices were obtained by similar manner as used in Example 1. The same result as in Example 1 in relationship of V with kh1 and kh2, is obtained in each of Example 2–7. Thus, the relationship of the propagation velocity V (m/sec) with the parameters $kh1=2\pi(t_Z/\lambda)$ and $kh2=2\pi(t_S/\lambda)$ in Each of Example 2–7 is shown in FIGS. 14 to 18. In TCF, the same result as in Example 1 is also obtained in each of Example 2–7. Thus, the relationship of TCF (ppm/° C.) with these parameters is also shown in FIGS. 19 to 23.

Further, measured propagation loss was 0.05 dB/wavelength for 1st mode SAW, and 0.03 dB/wavelength for 2nd mode SAW, in each of Examples 2–7.

Evaluation of the obtained result in Examples 1–7

As described in above Examples 1 to 7, a series of efforts to optimize the thickness of piezoelectric ZnO layer 14 and passivating SiO$_2$ layer 16 for each thickness of IDT, were carried out for the SAW devices of various device constitutions as illustrated in FIGS. 6A to 6G. A number of obtained results were collectively analyzed and evaluated to provide the optimized relationships of kh1 and kh2 for each constitution of SAW devices according to the present invention. Thus, dimensionless thicknesses of ZnO and SiO$_2$ layers 14 and 16 for each constitution of SAW devices according to the present invention were obtained for given wavelength of SAW. In the evaluation on the basis of the obtained results of Examples, significant improvement in device performances was achieved by optimizing dimensionless thicknesses kh1 and kh2 for the SAW devices having layer/electrode constitutions of "type A", "type B", "type C", "type D" and "type F".

Figure 2:
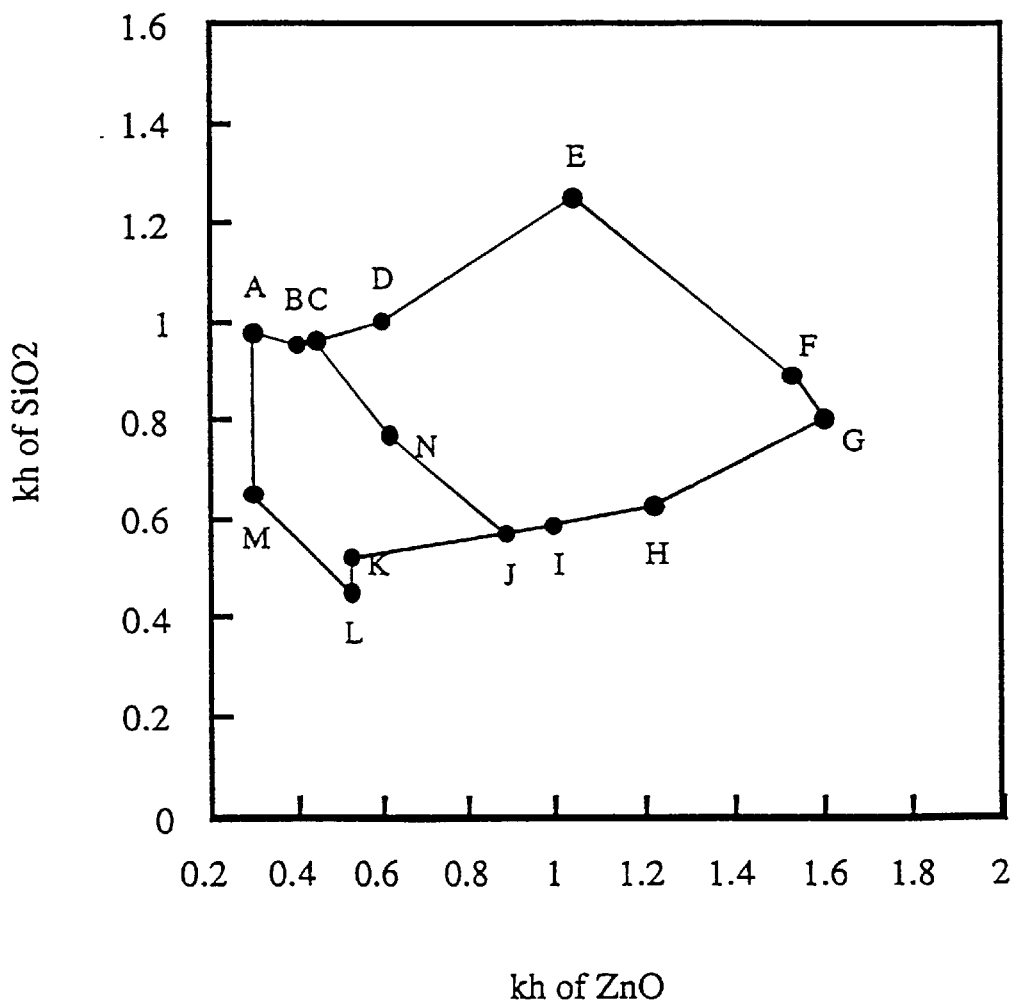
FIG. 2 is a graph in the two-dimensional Cartesian coordinate having abscissa axis of kh1(kh of ZnO) and ordinate axis of kh2(kh of $SiO_2$), illustrating the region ABCDEFGHIJKLMA and the region ABCNJKLMA for $0.099 \leq kh3 \leq 0.165$.
Figure 3:
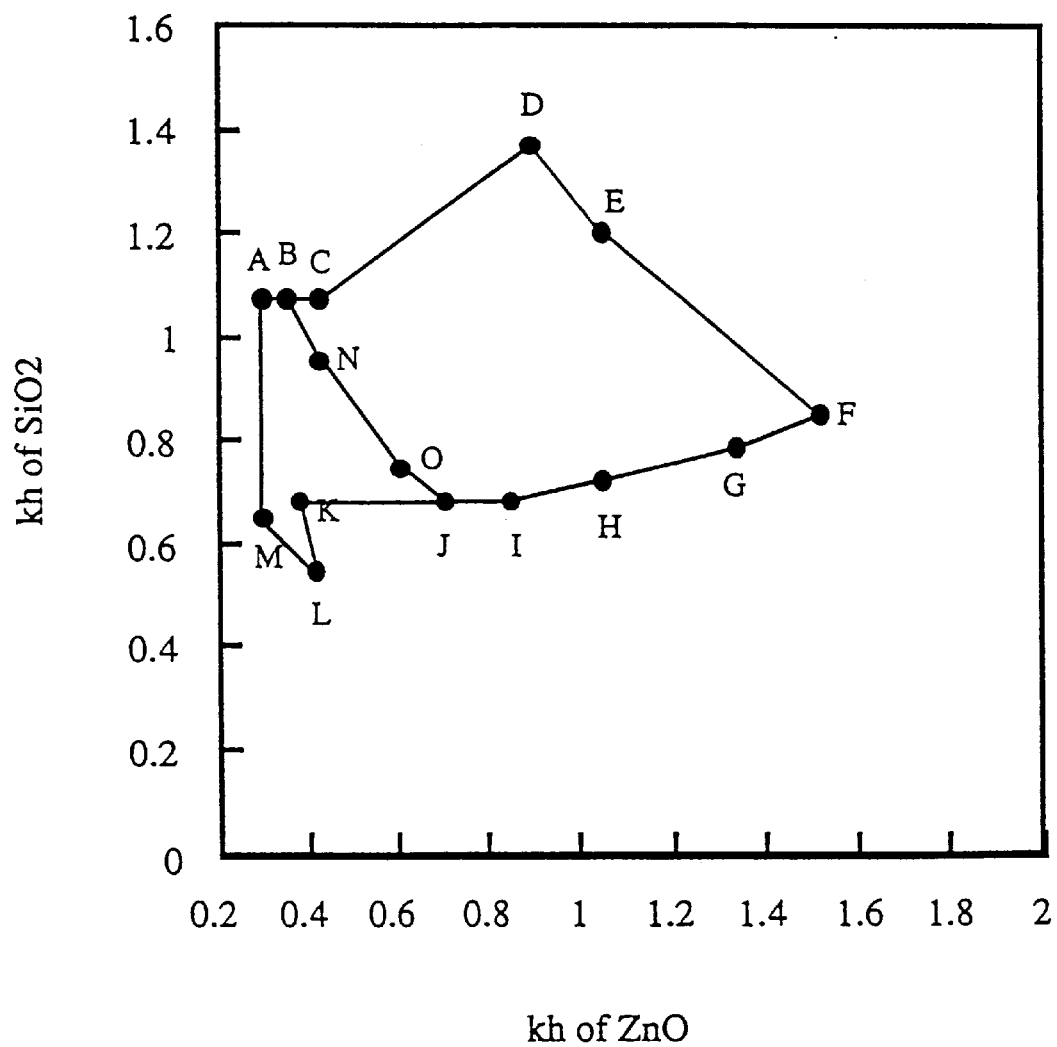
FIG. 3 is a graph in the two-dimensional Cartesian coordinate having abscissa axis of kh1(kh of ZnO) and ordinate axis of kh2(kh of $SiO_2$), illustrating the region ABCDEFGHIJKLMA and the region ABNOJKLMA for $0.165 \leq kh3 \leq 0.231$.
Figure 4:
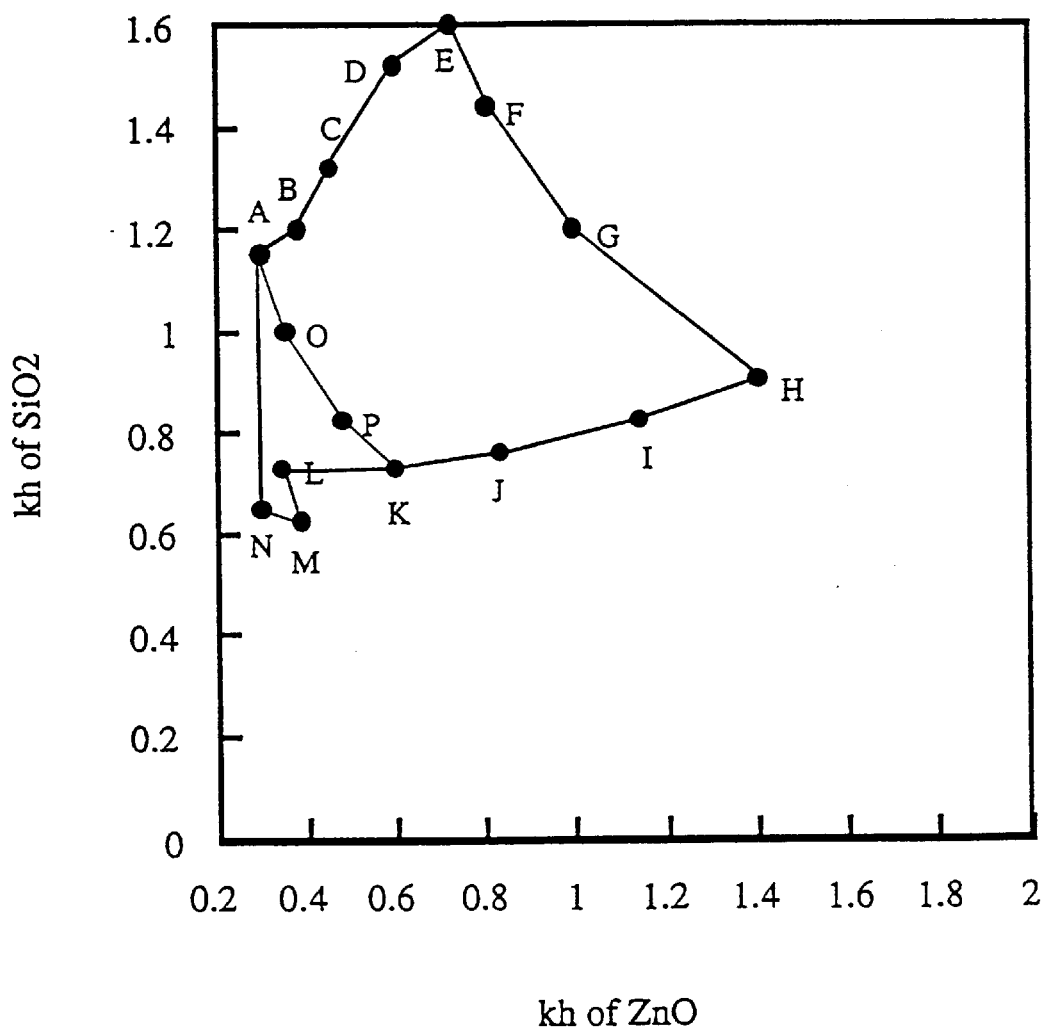
FIG. 4 is a graph in the two-dimensional Cartesian coordinate having abscissa axis of kh1(kh of ZnO) and ordinate axis of kh2(kh of $SiO_2$), illustrating the region ABCDEFGHIJKLMNA and the region AOPKLMNA for $0.231 \leq kh3 \leq 0.297$.
Figure 5:
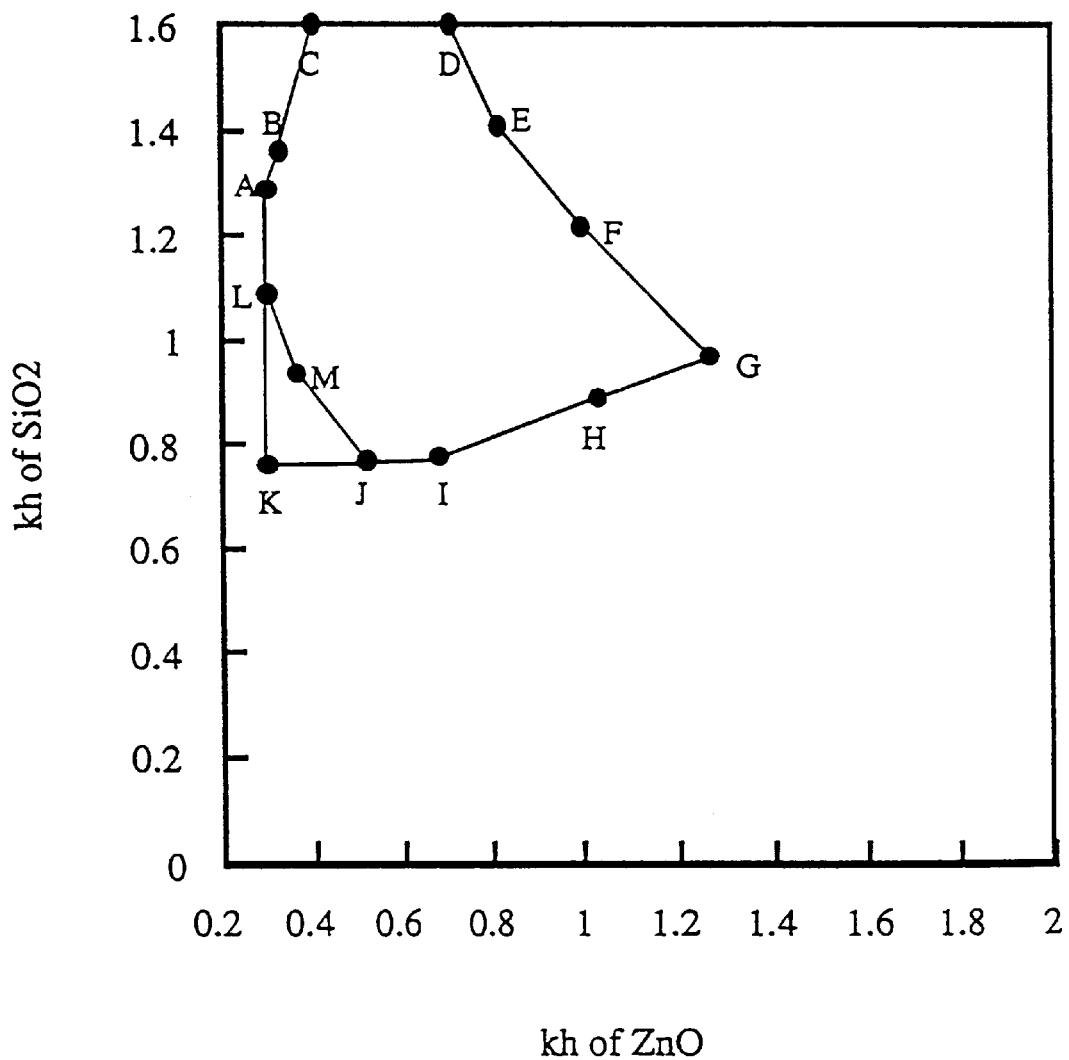
FIG. 5 is a graph in the two-dimensional Cartesian coordinate having abscissa axis of kh1(kh of ZnO) and ordinate axis of kh2(kh of $SiO_2$), illustrating the region ABCDEFGHIJKLA and the region LMJKL for $0.297 \leq kh3 \leq 0.363$.

The distribution of the optimized values of kh1 and kh2, which is obtained by the evaluation of results of Examples 1 to 7 (shown in FIGS. 7 to 23), is shown in FIGS. 1 to 5 by kh3 range. FIG. 1 shows an optimum range of kh1 (kh of ZnO) and kh2 (kh of SiO$_2$) for 0.033≦kh3≦0.099. FIG. 2 shows an optimum range of kh1 and kh2 for 0.099≦kh3≦0.165. FIG. 3 shows an optimum range of kh1 and kh2 for 0.165≦kh3≦0.231. FIG. 4 shows an optimum range of kh1 and kh2 for 0.231≦kh3≦0.297. FIG. 5 shows an optimum range of kh1 and kh2 for 0.297≦kh3≦0.363.

It was found that, in the case of 0.033≦kh3≦0.099, the SAW device having improved performances can be fabricated to have ZnO and SiO$_2$ layers, that have the optimized dimensionless thickness kh1 and kh2 given within the region ABCDEFGHIJKLA shown in FIG. 1. More preferably, SAW device having more improved performances can be fabricated to have kh1 and kh2 given within the region ABIJKLA shown in FIG. 1.

In the case of 0.099≦kh3≦0.165, the SAW device having improved performances can be fabricated to have ZnO and SiO$_2$ layers, that have the optimized dimensionless thickness kh1 and kh2 given within the region ABCDEFGHIJKLMA shown in FIG. 2. More preferably, SAW device having more improved performances can be fabricated to have kh1 and kh2 given within the region ABCNJKLMA shown in FIG. 2.

In the case of 0.165≦kh3≦0.231, the SAW device having improved performances can be fabricated to have ZnO and SiO$_2$ layers, that have the optimized dimensionless thickness kh1 and kh2 given within the region ABCDEFGHIJKLMA shown in FIG. 3. More preferably, SAW device having more improved performances can be fabricated to have kh1 and kh2 given within the region ABNOJKLMA shown in FIG. 3.

In the case of 0.231≦kh3≦0.297, the SAW device having improved performances can be fabricated to have ZnO and SiO$_2$ layers, that have the optimized dimensionless thickness kh1 and kh2 given within the region ABCDEFGHIJKLMNA shown in FIG. 4. More preferably, SAW device having more improved performances can be fabricated to have kh1 and kh2 given within the region AOPKLMNA shown in FIG. 4.

In the case of 0.297≦kh3≦0.363, the SAW device having improved performances can be fabricated to have ZnO and SiO$_2$ layers, that have the optimized dimensionless thickness kh1 and kh2 given within the region ABCDEFGHIJKLA shown in FIG. 5. More preferably, SAW device having more improved performances can be fabricated to have kh1 and kh2 given within the region LMJKL shown in FIG. 5.

The improved performances V, TCF and K$^2$ can be seen with reference to FIGS. 7 to 23. The detailed improvement have been described in the above "SUMMARY OF THE INVENTION" for SAW devices of types A, B, C, D and F.

Figure 27A:
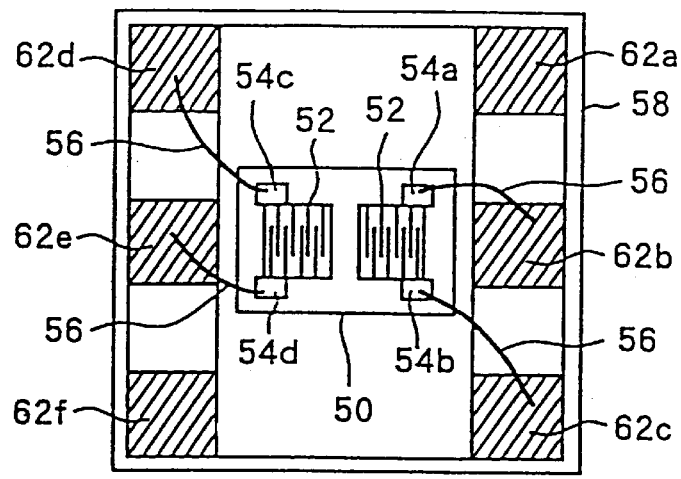
FIG. 27A is a schematic plan view of a exemplary packaged SAW device.
Figure 27B:
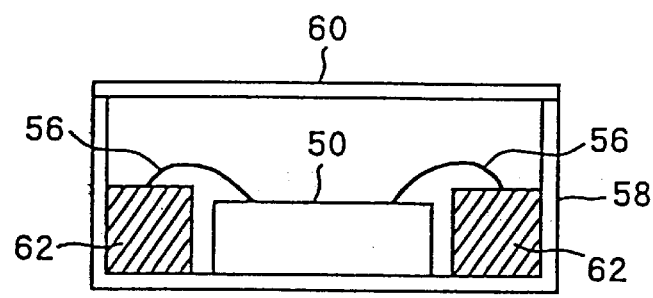
FIG. 27B is a schematic side cross sectional view of the packaged SAW device.
Figure 27C:
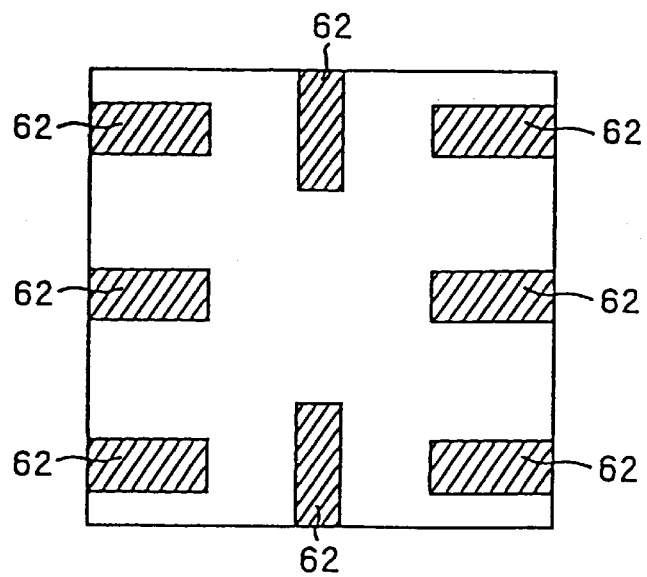
FIG. 27C is a bottom view of the package.

FIGS. 27A to 27C shows an exemplary packaged SAW devices according to the present invention. FIG. 27A is a plan view of a package 58 without lid 60. FIG. 27B is a side cross sectional view of the package, and FIG. 27C is a bottom view of the package. Package 58 is provided with pads 62a–62f for electrodes. A SAW device 50 of the present invention is centrally positioned on the bottom of package 58. Electrodes 54a, 54b, 54c and 54d are provided for the purpose of input to and output from a IDT 52 of SAW device 50. Electrodes 54a, 54b, 54c and 54d are connected to each of pads 62 via wires 56. Lid 60 is welded to package 58, as shown in FIG. 27B.

The packaged SAW device shown in FIGS. 27A to 27C is typically used for various applications, and, for example, used for filters which is typically used in optical communication equipments.

Example 8

The eighth Example according to the present invention was carried out to further improve thermal or temperature stability of the SAW devices.

SAW devices having layer structure of "type-A" shown in FIG. 6A were manufactured through the similar process as used in Example 1, in which thicknesses of the ZnO and SiO$_2$ layers were selected to narrow the kh1 and kh2 down to an optimal range. TCF of the devices was evaluated in the similar method as used in Example 1.

The dimensionless thickness kh3 defined as kh3=2π(T$_A$/λ) for a wave length λ of 2nd mode-SAW and a thickness t$_A$ of IDT was selected for evaluating thermal stability: kh3= 0.044, 0.066, 0.099, 0.132, 0.198 and 0.264; kh1=2π(T$_Z$/λ) was also selected: kh1=0.600, 0.800, 1.000, 1.100, 1.200 and 1.400; and the kh2=2π(T$_S$/λ) was selected to give the smaller variation of TCF within 500 ppm for temperature range of −20° C. to 80° C., for each of the combinations (6×7=42 types) of the kh3 (6 types) and the kh1 (7 types).

FIGS. 29–34 disclose a portion of the experimental results on TCF variation of the SAW devices obtained in Example 8. The kh1, kh2, kh3 and the resultant temperature variation are listed below:

| FIG. | kh3 (-) | kh1 (-) | kh2 (-) | TCF variation for −20 to 80° C. (ppm) |
|---|---|---|---|---|
| 29 | 0.099 | 0.8 | 0.758 | 100 |
| 30 | 0.099 | 1.0 | 0.832 | 130 |
| 31 | 0.099 | 1.2 | 0.930 | 100 |
| 32 | 0.044 | 1.0 | 0.759 | 100 |
| 33 | 0.066 | 1.0 | 0.789 | 200 |
| 34 | 0.132 | 1.0 | 0.877 | 100. |

As shown in FIGS. 29–34, the SAW devices including the combinations of kh1, kh2 and kh3 listed above have very small frequency variation of 100–200 ppm for the temperature range of −20° C. to 80° C. Other SAW devices having other combination of kh1, kh2 and kh3 than listed above were evaluated to give suitable kh2 for obtaining very small frequency variation of 100–200 ppm for the temperature range of −20° C. to 80° C.

Figure 28:
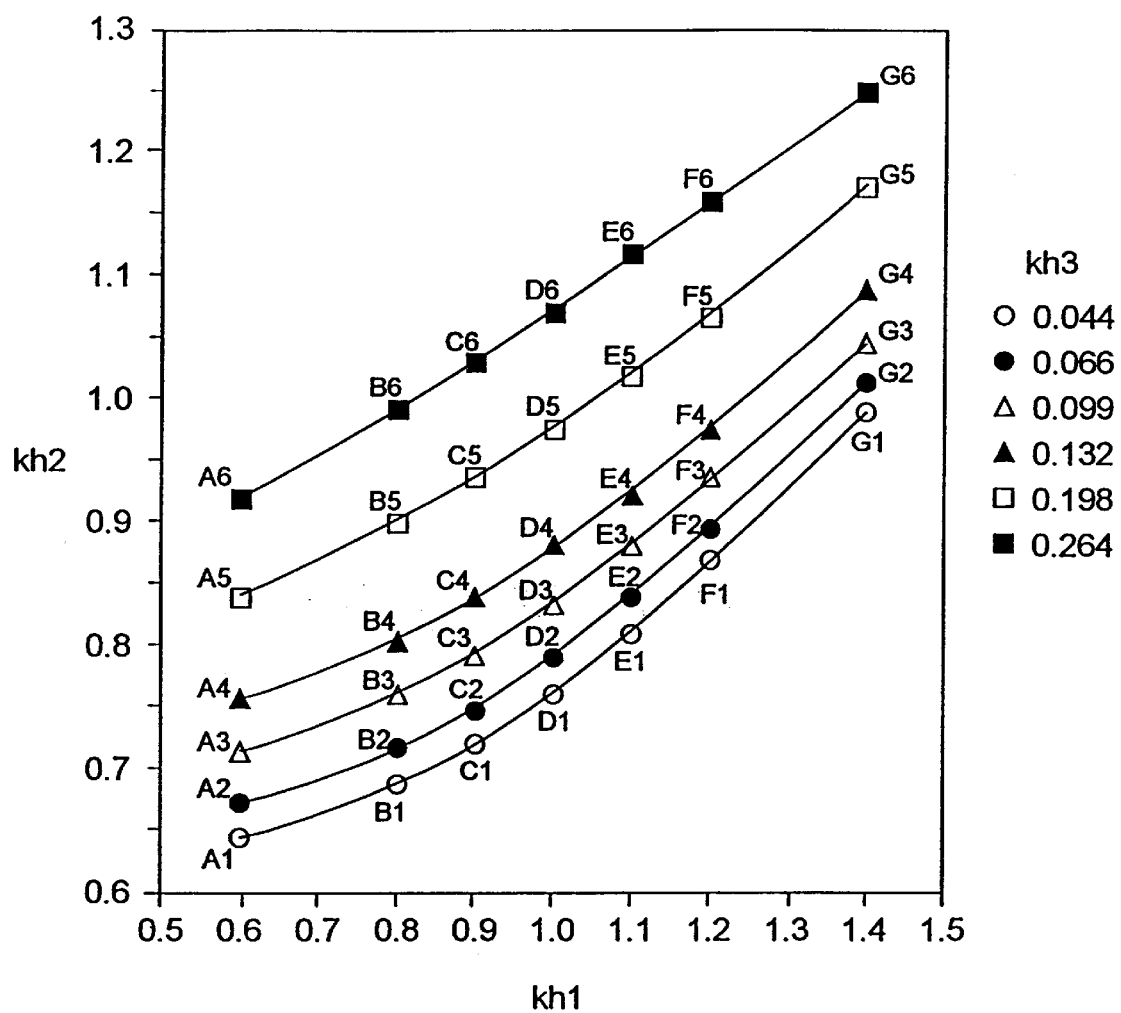
FIG. 28 is a graph showing first to sixth primary combination lines obtained in Example 8.
Figure 29:
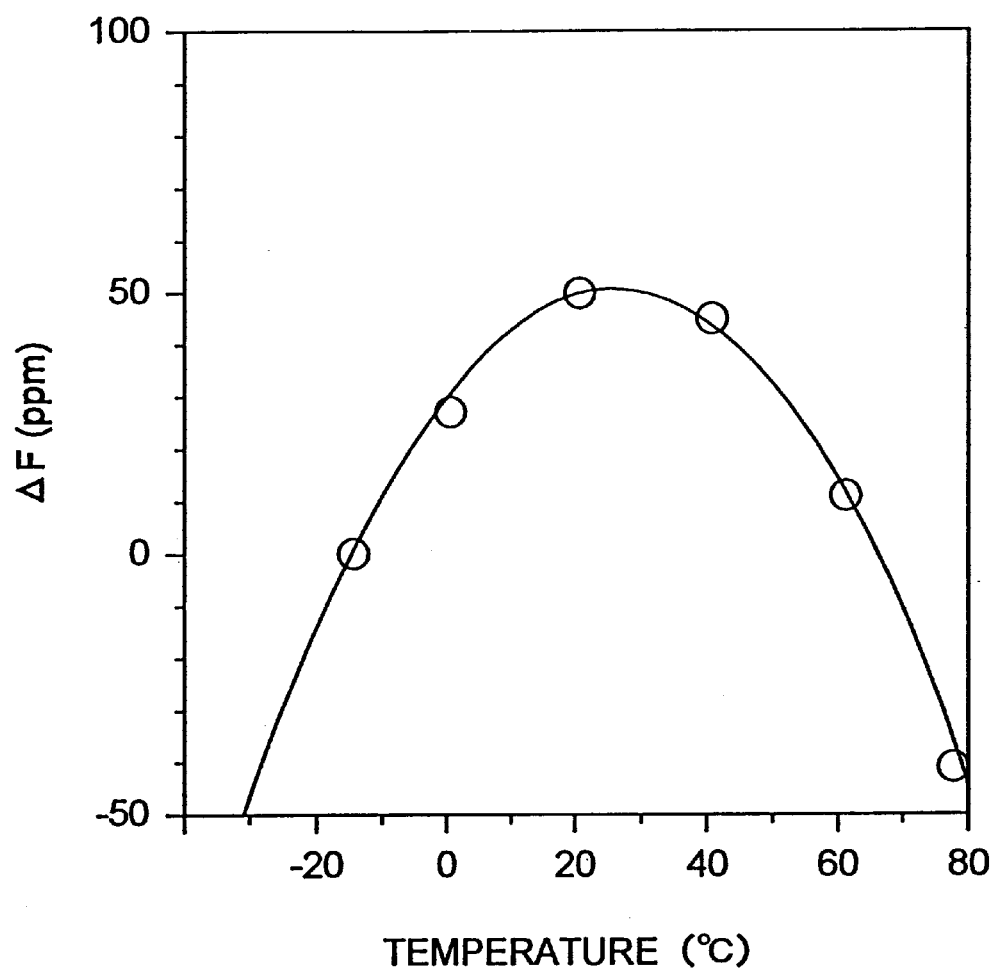
FIG. 29 is a graph showing temperature variation of TCF for the SAW device having kh3=0.099, kh1=0.8 and kh2=0.758.
Figure 30:
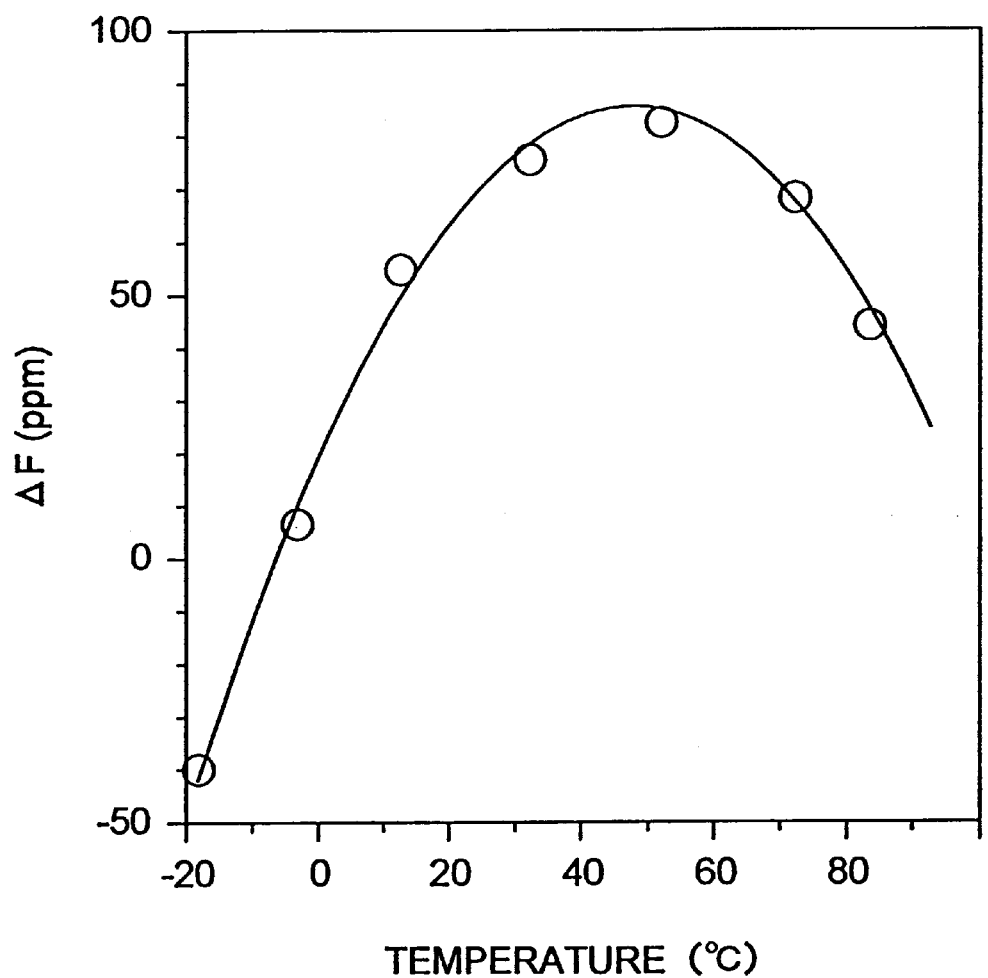
FIG. 30 is a graph showing temperature variation of TCF for the SAW device having kh3=0.099, kh1=1.0 and kh2=0.832.
Figure 31:
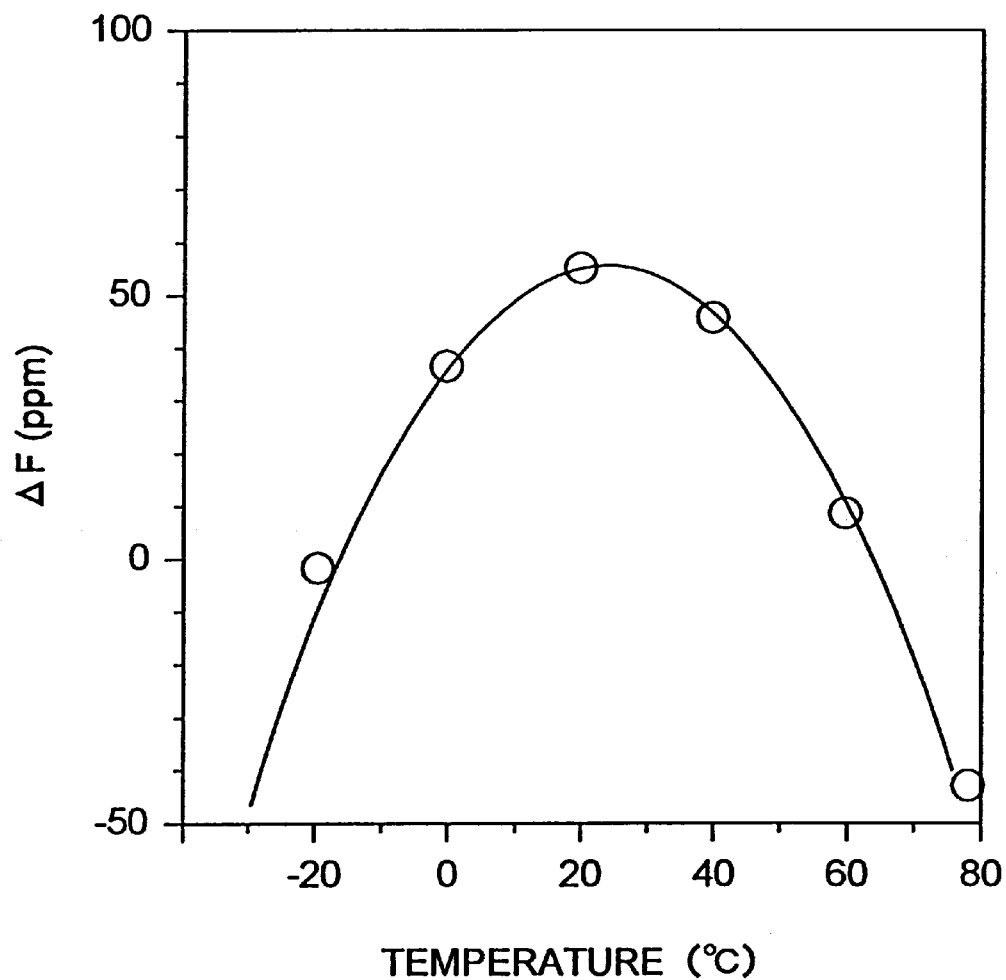
FIG. 31 is a graph showing temperature variation of TCF for the SAW device having kh3=0.099, kh1=1.2 and kh2=0.930.
Figure 32:
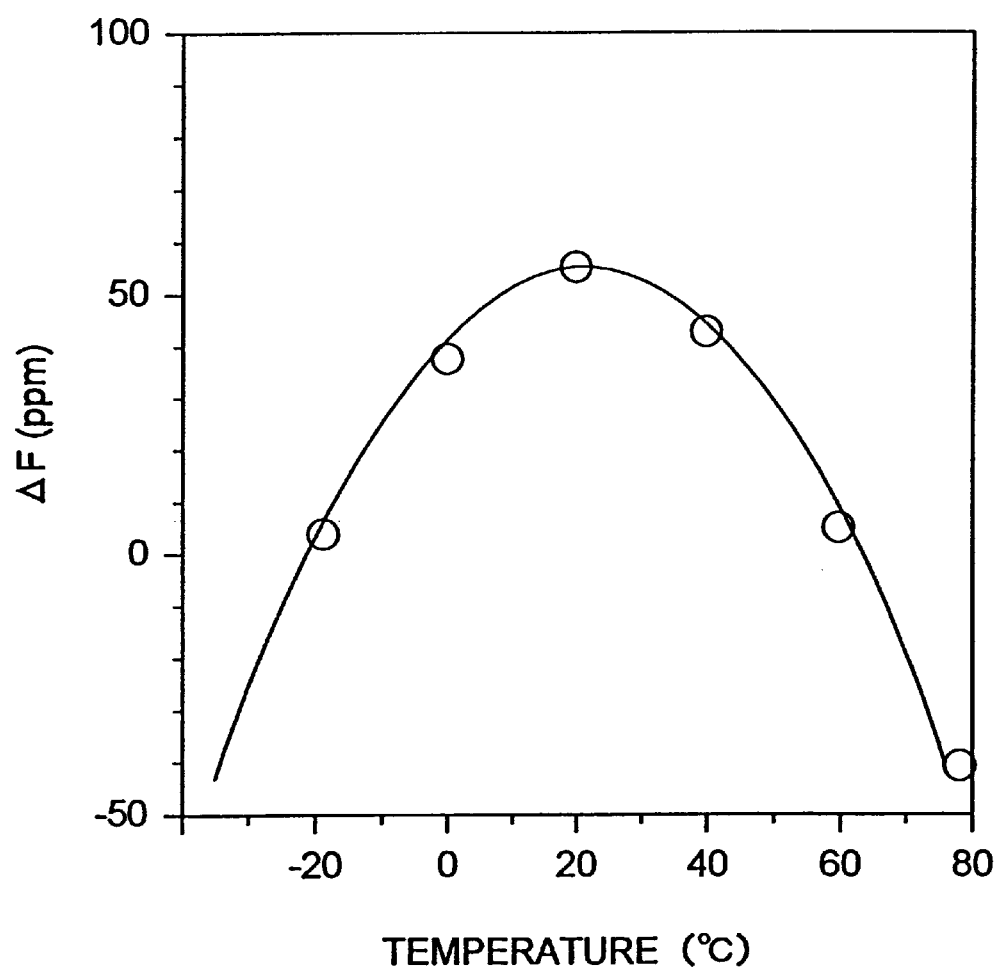
FIG. 32 is a graph showing temperature variation of TCF for the SAW device having kh3=0.044, kh1=1.0 and kh2=0.759.

The combinations of kh1 and kh2 for 6 kh3 values, obtained in this Example, is shown in FIG. 28.

FIG. 28, having abscissa of kh1 and ordinate of kh2, shows the combinations of kh1 and kh2 for 6 values of kh3, which gives very small frequency variation of 100–200 ppm. The obtained kh1 and kh2 for respective points in FIG. 28 are shown in TABLES 1–6.

TABLE 1 kh3 = 0.044

| point | kh1 | kh2 | increased kh2(+10%) | reduced kh2(−10%) |
|---|---|---|---|---|
| A1 | 0.600 | 0.645 | 0.710 | 0.581 |
| B1 | 0.800 | 0.684 | 0.752 | 0.616 |
| C1 | 0.900 | 0.718 | 0.790 | 0.646 |
| D1 | 1.000 | 0.759 | 0.835 | 0.683 |
| E1 | 1.100 | 0.809 | 0.890 | 0.728 |
| F1 | 1.200 | 0.866 | 0.953 | 0.779 |
| G1 | 1.400 | 0.987 | 1.086 | 0.888 |

TABLE 2 kh3 = 0.066

| point | kh1 | kh2 | increased kh2(+10%) | reduced kh2(−10%) |
|---|---|---|---|---|
| A2 | 0.600 | 0.671 | 0.738 | 0.604 |
| B2 | 0.800 | 0.713 | 0.784 | 0.642 |
| C2 | 0.900 | 0.747 | 0.822 | 0.672 |
| D2 | 1.000 | 0.789 | 0.868 | 0.710 |
| E2 | 1.100 | 0.837 | 0.921 | 0.753 |
| F2 | 1.200 | 0.891 | 0.980 | 0.802 |
| G2 | 1.400 | 1.011 | 1.112 | 0.910 |

TABLE 3 kh3 = 0.099

| point | kh1 | kh2 | increased kh2(+10%) | reduced kh2(−10%) |
|---|---|---|---|---|
| A3 | 0.600 | 0.713 | 0.784 | 0.642 |
| B3 | 0.800 | 0.758 | 0.834 | 0.682 |
| C3 | 0.900 | 0.790 | 0.869 | 0.711 |
| D3 | 1.000 | 0.832 | 0.915 | 0.749 |
| E3 | 1.100 | 0.879 | 0.967 | 0.791 |
| F3 | 1.200 | 0.930 | 1.023 | 0.837 |
| G3 | 1.400 | 1.046 | 1.151 | 0.941 |

TABLE 4 kh3 = 0.132

| point | kh1 | kh2 | increased kh2(+10%) | reduced kh2(−10%) |
|---|---|---|---|---|
| A4 | 0.600 | 0.755 | 0.831 | 0.680 |
| B4 | 0.800 | 0.803 | 0.883 | 0.723 |
| C4 | 0.900 | 0.837 | 0.921 | 0.753 |
| D4 | 1.000 | 0.877 | 0.965 | 0.789 |
| E4 | 1.100 | 0.922 | 1.014 | 0.830 |
| F4 | 1.200 | 0.972 | 1.069 | 0.875 |
| G4 | 1.400 | 1.083 | 1.191 | 0.975 |

TABLE 5 kh3 = 0.198

| point | kh1 | kh2 | increased kh2(+10%) | reduced kh2(−10%) |
|---|---|---|---|---|
| A5 | 0.600 | 0.837 | 0.921 | 0.753 |
| B5 | 0.800 | 0.897 | 0.987 | 0.807 |

TABLE 5-continued kh3 = 0.198

| point | kh1 | kh2 | increased kh2(+10%) | reduced kh2(−10%) |
|---|---|---|---|---|
| C5 | 0.900 | 0.933 | 1.026 | 0.840 |
| D5 | 1.000 | 0.973 | 1.070 | 0.876 |
| E5 | 1.100 | 1.017 | 1.119 | 0.915 |
| F5 | 1.200 | 1.063 | 1.169 | 0.957 |
| G5 | 1.400 | 1.167 | 1.284 | 1.050 |

TABLE 6 kh3 = 0.264

| point | kh1 | kh2 | increased kh2(+10%) | reduced kh2(−10%) |
|---|---|---|---|---|
| A6 | 0.600 | 0.914 | 1.005 | 0.823 |
| B6 | 0.800 | 0.989 | 1.088 | 0.890 |
| C6 | 0.900 | 1.029 | 1.132 | 0.926 |
| D6 | 1.000 | 1.069 | 1.176 | 0.962 |
| E6 | 1.100 | 1.111 | 1.222 | 1.000 |
| F6 | 1.200 | 1.156 | 1.272 | 1.040 |
| G6 | 1.400 | 1.257 | 1.383 | 1.131 |

It can be seen in FIG. 28 and the above tables that the SAW devices having combinations of kh1 and kh2, which are included in one of the lines (A1-B1-C1-D1-E1-F1-G1, A2-B2-C2-D2-E2-F2-G2, A3-B3-C3-D3-E3-F3-G3, A4-B4-C4-D4-E4-F4-G4, A5-B5-C5-D5-E5-F5-G5 and A6-B6-C6-D6-E6-F6-G6, these lines are referred as "primary combination lines") shown in FIG. 28, are provided with better thermal stability (100–200 ppm for −20 to 80° C.).

Further evaluations were carried out to obtain less restrictive conditions for good thermal stability ($\geq$500 ppm for −20 to 80° C.), by deviating a certain amount of kh2 from the primary combination lines. FIGS. 35–38 are graphs showing results of a series of experiments, which provide good temperature stability of $\geq$500 ppm for −20 to 80° C. at kh3=0.066 and kh1=1.0. The kh1, kh2, kh3 and the resultant temperature variation are listed below:

| FIG. | kh3 (−) | kh1 (−) | kh2 (−) | TCF variation for −20 to 80° C. (ppm) |
|---|---|---|---|---|
| 35 | 0.066 | 1.0 | 0.710 | 400 |
| 36 | 0.066 | 1.0 | 0.750 | 200 |
| 37 | 0.066 | 1.0 | 0.828 | 150 |
| 38 | 0.066 | 1.0 | 0.868 | 400 |

Figure 33:
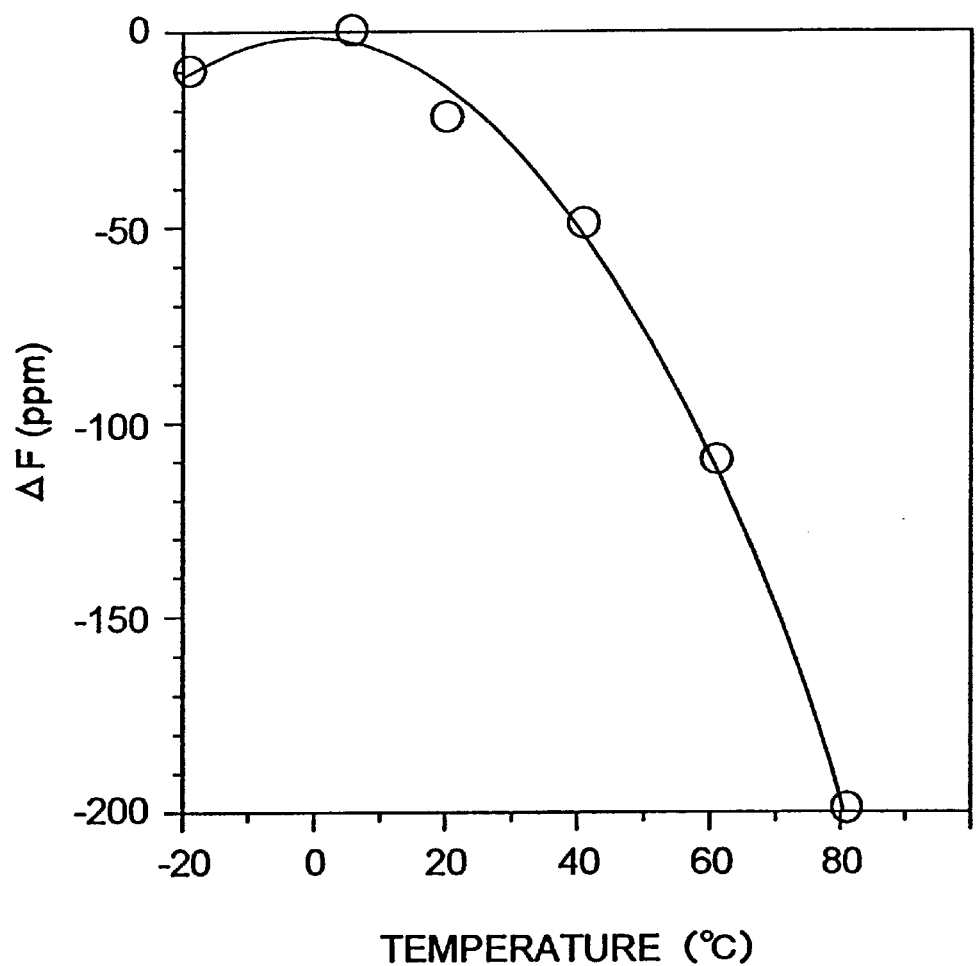
FIG. 33 is a graph showing temperature variation of TCF for the SAW device having kh3=0.066, kh1=1.0 and kh2=0.789.
Figure 34:
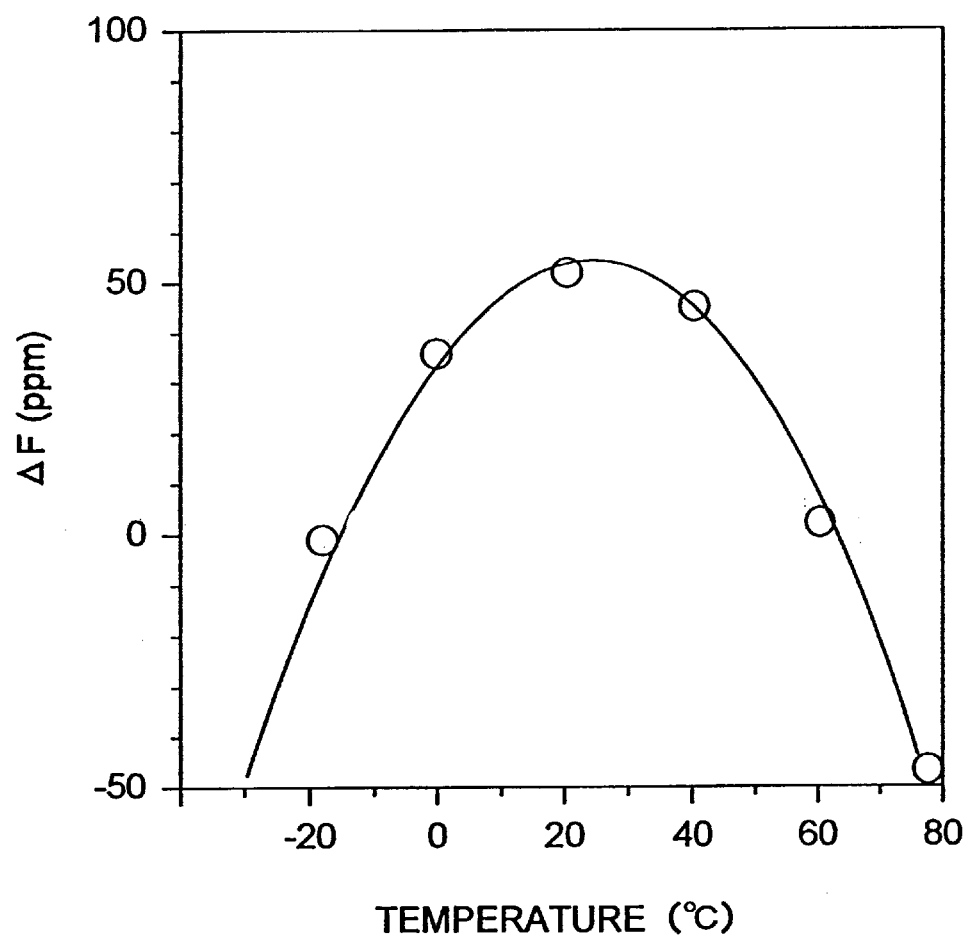
FIG. 34 is a graph showing temperature variation of TCF for the SAW device having kh3=0.132, kh1=1.0 and kh2=0.877.
Figure 35:
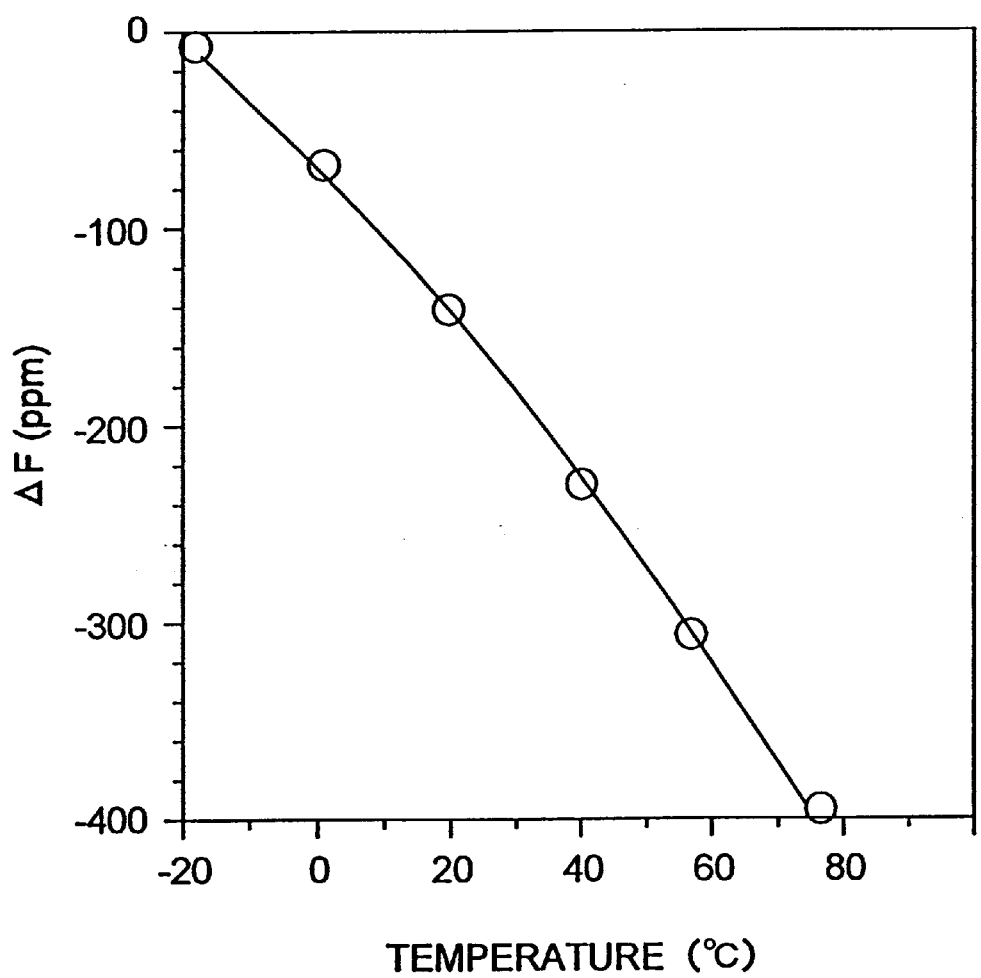
FIG. 35 is a graph showing temperature variation of TCF for the SAW device having kh3=0.066, kh1=1.0 and kh2=0.710.
Figure 36:
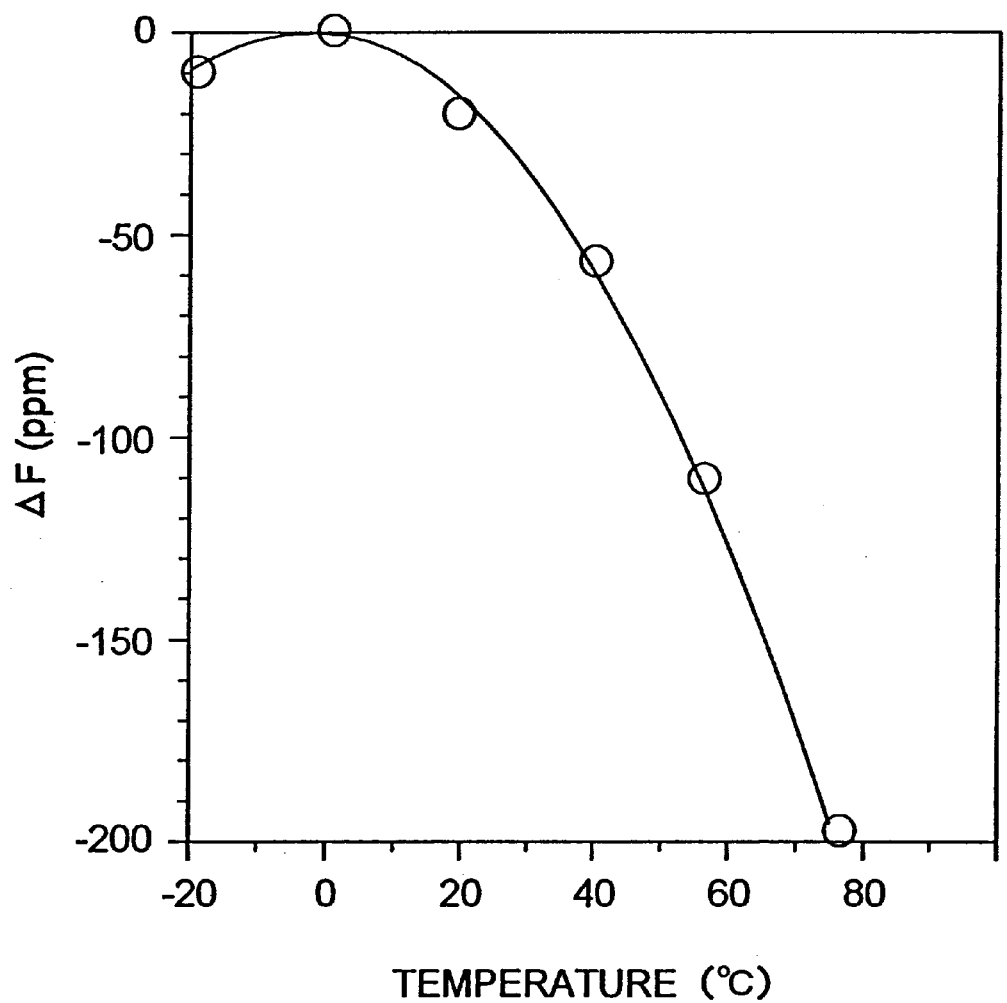
FIG. 36 is a graph showing temperature variation of TCF for the SAW device having kh3=0.066, kh1=1.0 and kh2=0.750.
Figure 37:
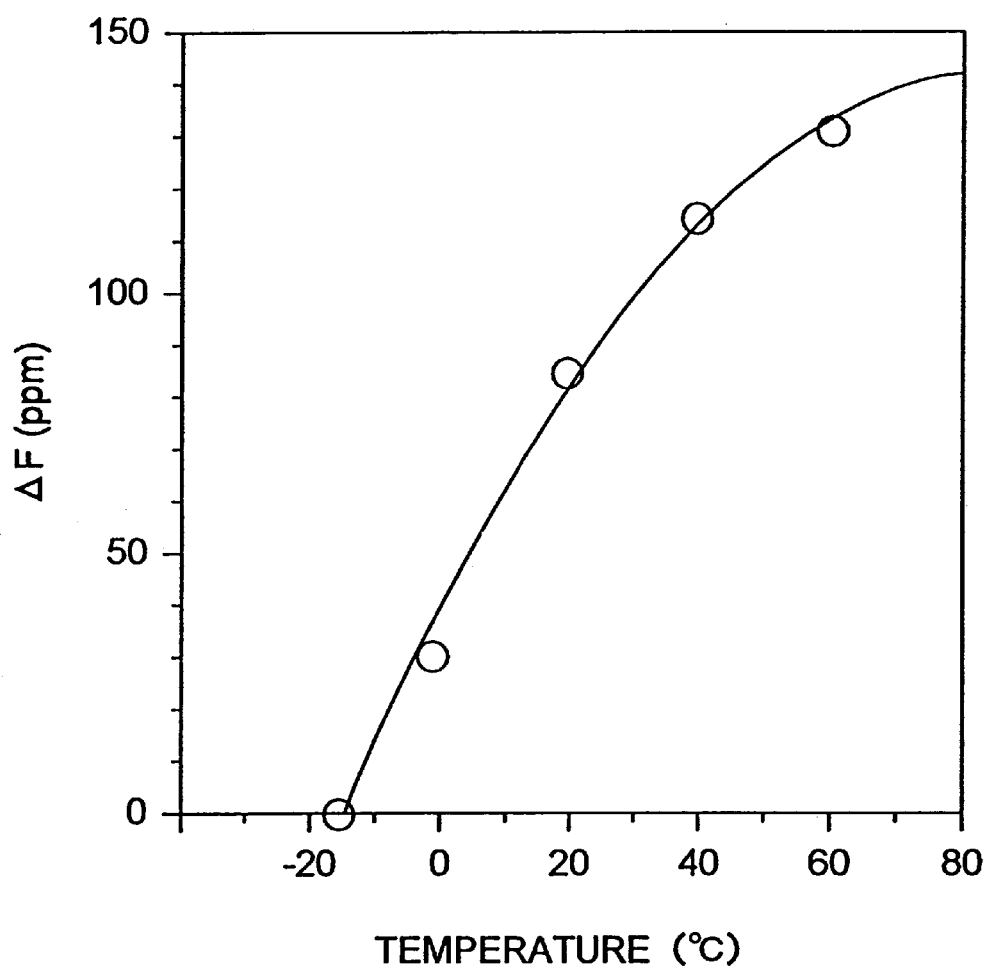
FIG. 37 is a graph showing temperature variation of TCF for the SAW device having kh3=0.066, kh1=1.0 and kh2=0.828.
Figure 38:
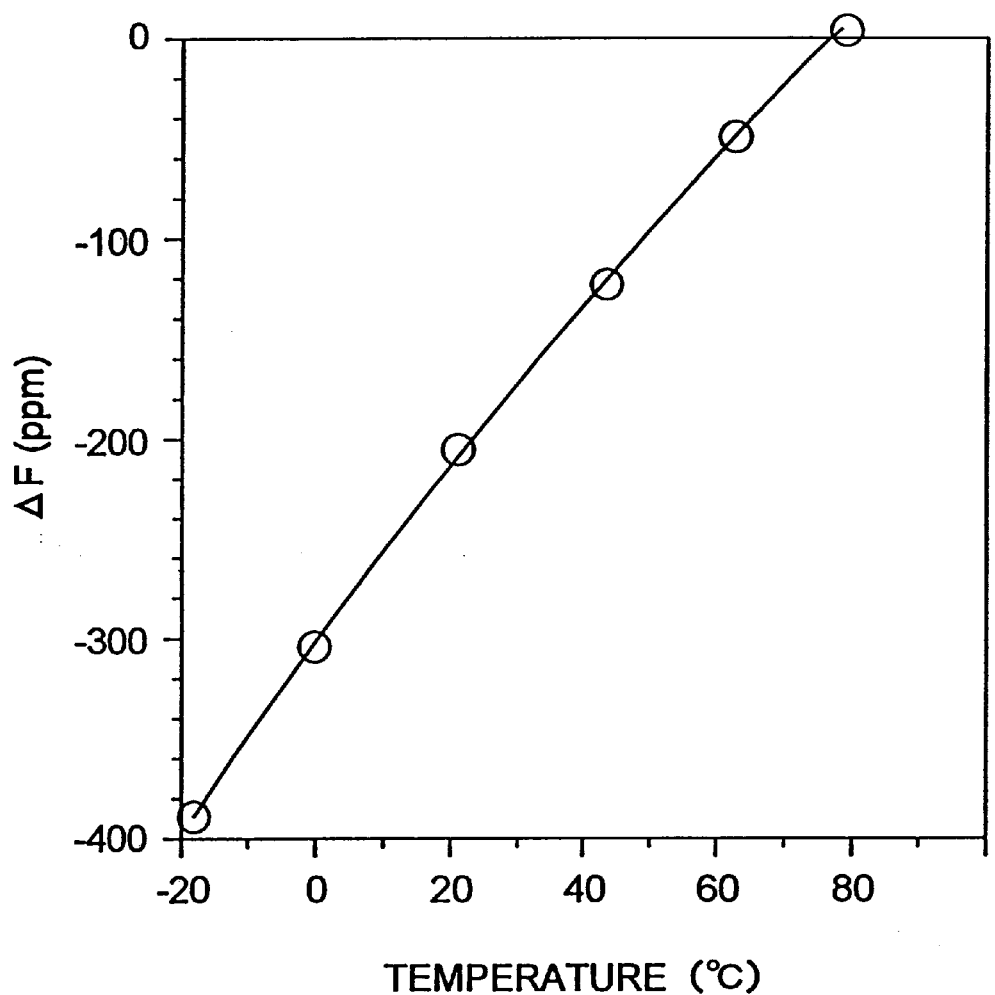
FIG. 38 is a graph showing temperature variation of TCF for the SAW device having kh3=0.066, kh1=1.0 and kh2=0.868.

As can be seen from the results shown in FIGS. 33 and 35–38, the SAW devices including the combinations of kh3=0.066 and kh1=1.000 have small frequency variation of within 500 ppm for the temperature range of −20° C. to 80° C., when kh2 is selected to be within +/−10% from kh2= 0.789 (FIG. 33, or point D2 along the primary combination line in FIG. 28). Similar evaluation were carried out for other points A2, B2, C2, E2, F2 and G2 in the primary combination line for kh2=0.066, and found that small frequency variation of within 500 ppm for the temperature range of −20° C. to 80° C. is obtained, when kh2 is selected to be within +/−10% from these points.

It is also found for other primary combination lines (A1-B1-C1-D1-E1-F1-G1, A3-B3-C3-D3-E3-F3-G3, A4-B4-C4-D4-E4-F4-G4, A5-B5-C5-D5-E5-F5-G5 and A6-B6C6-D6-E6-F6-G6) that small frequency variation of within 500 ppm for the temperature range of −20° C. to 80° C. is obtained, when kh2 is selected to be within +/−10% from the points in the lines. The increased (by 10%) and reduced (by 10%) values of kh2 for respective points in FIG. 28 are incorporated in TABLES 1–6.

Further, it is found that, for a kh3 of between 0.044 and 0.066, the linear interpolation (or linear insertion, or linear interposition) of kh2 with the kh3 value can provide A12, B12, C12, D12, E12, F12 and G12, which forms an interpolated primary combination line (A12-B12-C12-D12-E12-F12-G12). The interpolated primary combination line gives reduced TCF variation of 100–200 ppm for −20 to 80° C.

Example 9

The ninth Example according to the present invention was carried out to achieve miniaturization of the SAW device while maintaining its operating characteristics, by selecting electrode pattern for the specified layer structure of the device.

FIG. 39A illustrates a schematic plan view of an electrode portion of Example 9. The electrode portion comprises an input interdigital transducer 100 and an output interdigital transducer 110 facing input IDT 100, as shown in FIG. 39A. Input IDT 100 comprises two busbars 102 which are disposed in parallel relationship, and a plurality of fingers 104 each of which extends from one busbar toward the other busbar. Output IDT 110 also includes busbars 112 and fingers 114 as shown in FIG. 39A. Output IDT is positioned to receive surface acoustic wave created by input IDT 100. Each of fingers 104 extended from one busbar 102 alternates with each of fingers 104 extended from the other busbar 102. The number of pairs consisting of a finger extended from one busbar and a next finger extended from the other busbar is referred as "pair number of IDT". The overlapping length of fingers, as shown in FIG. 39A, is referred as "aperture length". The thickness or the width of a finger is referred as "finger width", the interval between fingers is referred as "finger interval and the distance between the centers of fingers is referred as "electrode interval", as shown in FIG. 39B. The wavelength λ of surface acoustic wave created by output IDT 100 equals to double the electrode interval (or equals to 2×(finger width+finger interval). These definition on geometric relationships of the electrode are schematically shown in FIG. 39B, which is an enlarged view of the fingers.

The electrode portion of this Example further includes at a pair of reflectors 120 and 130 which interpose the input and the output IDTs 100 and 110 along the propagating direction of the surface acoustic wave. The multiple-reflection of SAW is achieved between the reflectors 120 and 130 to create a standing wave. Unlike the fingers of IDTs 100 or 110, fingers 124 and 134 of reflectors 120 and 130 bridge both busbars 122 and 132, respectively.

48 types of SAW devices were manufactured in this Example: 4 types of layer structures for "type-A" structure shown in FIG. 6A×12 types of electrode patterns. Details of the layer structures 1–4 and the electrode patter 1–12 are listed below. Transmission loss and Q of these 48 types of SAW devices were measured.

LAYER STRUCTURE
structure 1:
diamond film (polycrystalline, CVD) thickness: 30 μm;
ZnO film (c-axis oriented polycrystalline, sputtering), thickness: 0.688 μm (kh1=1.2);
SiO$_2$ film (amorphous, sputtering), thickness: 0.496 μm (kh2=0.866);
Al electrode film for IDTs and reflectors (polycrystalline, sputtering), thickness: 0.027 μm (kh3=0.044):
structure 2:
diamond film (polycrystalline, CVD) thickness: 30 μm;
ZnO film (c-axis oriented polycrystalline, sputtering), thickness: 0.63 μm (kh1=1.1);
SiO$_2$ film (amorphous, sputtering), thickness: 0.48 μm (kh2=0.837);
Al electrode film for IDTs and reflectors (polycrystalline, sputtering), thickness: 0.038 μm (kh3=0.066):
structure 3:
diamond film (polycrystalline, CVD) thickness: 30 μm;
ZnO film (c-axis oriented polycrystalline, sputtering), thickness: 0.573 μm (kh1=1.0);
SiO$_2$ film (amorphous, sputtering), thickness: 0.477 μm (kh2=0.832);
Al electrode film for IDTs and reflectors (polycrystalline, sputtering), thickness: 0.057 μm (kh3=0.099): and
structure 4:
diamond film (polycrystalline, CVD) thickness: 30 μm;
ZnO film (c-axis oriented polycrystalline, sputtering), thickness: 0.516 μm (kh1=0.9);
SiO$_2$ film (amorphous, sputtering), thickness: 0.48 μm (kh2=0.837);
Al electrode film for IDTs and reflectors (polycrystalline, sputtering), thickness: 0.076 μm (kh3=0.132).

ELECTRODE PATTERN
pattern 1:
finger width=finger interval=0.9 μm (λ=3.6 μm);
pair number of IDT=20 pairs each for input IDT and output IDT (total 40 pairs);
number of fingers of reflectors=20 each for input side and output side (total 40 fingers);
aperture length of IDTs=15 λ;
electrode interval=3.5μ:
pattern 2:
finger width=finger interval=0.9 μm (λ=3.6 μm);
pair number of IDT=25 pairs each (total 50 pairs);
reflector fingers=20 each (total 40 fingers);
aperture length of IDTs=15 λ;
electrode interval=3.5μ:
pattern 3:
finger width=finger interval=0.9 μm (λ=3.6 μm);
pair number of IDT=30 pairs each (total 60 pairs);
reflector fingers=20 each (total 40 fingers);
aperture length of IDTs=15 λ;
electrode interval=3.5μ:
pattern 4:
finger width=finger interval=0.9 μm (λ=3.6 μm);
pair number of IDT=40 pairs each (total 80 pairs);
reflector fingers=20 each (total 40 fingers);
aperture length of IDTs=15 λ;
electrode interval=3.5μ:
pattern 5:
finger width=finger interval=0.9 μm (λ=3.6 μm);
pair number of IDT=45 pairs each (total 90 pairs);
reflector fingers=20 each (total 40 fingers);
aperture length of IDTs=15 λ;
electrode interval=3.5μ:
pattern 6:
finger width=finger interval=0.9 μm (λ=3.6 μm);
pair number of IDT=50 pairs each (total 100 pairs);
reflector fingers=20 each (total 40 fingers);
aperture length of IDTs=15 λ;
electrode interval=3.5μ:
pattern 7:
finger width=finger interval=0.9 μm (λ=3.6 μm);

pair number of IDT=30 pairs each (total 60 pairs);
reflector fingers=20 each (total 40 fingers);
aperture length of IDTs=5 λ;
electrode interval=3.5μ:

pattern 8:

finger width=finger interval=0.9 μm (λ=3.6 μm);
pair number of IDT=30 pairs each (total 60 pairs);
reflector fingers=20 each (total 40 fingers);
aperture length of IDTs=10 λ;
electrode interval=3.5μ:

pattern 9:

finger width=finger interval=0.9 μm (λ=3.6 μm);
pair number of IDT=30 pairs each (total 60 pairs);
reflector fingers=20 each (total 40 fingers);
aperture length of IDTs=30 λ;
electrode interval=3.5μ:

pattern 10:

finger width=finger interval=0.9 μm (λ=3.6 μm);
pair number of IDT=30 pairs each (total 60 pairs);
reflector fingers=20 each (total 40 fingers);
aperture length of IDTs=40 λ;
electrode interval=3.5μ:

pattern 11:

finger width=finger interval=0.9 μm (λ=3.6 μm);
pair number of IDT=30 pairs each (total 60 pairs);
reflector fingers=20 each (total 40 fingers);
aperture length of IDTs=50 λ;
electrode interval=3.5μ: and pattern 12:

finger width=finger interval=0.9 μm (λ=3.6 μm);
pair number of IDT=30 pairs each (total 60 pairs);
reflector fingers=20 each (total 40 fingers);
aperture length of IDTs=60 λ;
electrode interval=3.5μ.

The obtained transmission loss and Q of the 48 types of SAW device are shown in TABLE 7–10.

TABLE 7

[structure 1]

| structure | pattern | transmission loss (dB) | Q |
|---|---|---|---|
| 1 | 1 | 8.1 | 400 |
| 1 | 2 | 7.3 | 600 |
| 1 | 3 | 8.0 | 707 |
| 1 | 4 | 8.8 | 729 |
| 1 | 5 | 9.5 | 759 |
| 1 | 6 | 12.0 | 777 |
| 1 | 7 | 12.3 | 813 |
| 1 | 8 | 8.9 | 742 |
| 1 | 9 | 7.4 | 618 |
| 1 | 10 | 8.4 | 601 |
| 1 | 11 | 9.2 | 583 |
| 1 | 12 | 9.0 | 495 |

TABLE 8

[structure 2]

| structure | pattern | transmission loss (dB) | Q |
|---|---|---|---|
| 2 | 1 | 8.5 | 440 |
| 2 | 2 | 7.5 | 604 |
| 2 | 3 | 8.1 | 740 |
| 2 | 4 | 9.0 | 780 |
| 2 | 5 | 9.9 | 800 |
| 2 | 6 | 12.5 | 810 |

TABLE 8-continued

[structure 2]

| structure | pattern | transmission loss (dB) | Q |
|---|---|---|---|
| 2 | 7 | 12.2 | 860 |
| 2 | 8 | 9.0 | 802 |
| 2 | 9 | 7.9 | 620 |
| 2 | 10 | 8.5 | 608 |
| 2 | 11 | 9.2 | 598 |
| 2 | 12 | 9.5 | 460 |

TABLE 9

[structure 3]

| structure | pattern | transmission loss (dB) | Q |
|---|---|---|---|
| 3 | 1 | 8.9 | 480 |
| 3 | 2 | 7.8 | 644 |
| 3 | 3 | 8.6 | 762 |
| 3 | 4 | 9.5 | 788 |
| 3 | 5 | 9.9 | 817 |
| 3 | 6 | 13.3 | 859 |
| 3 | 7 | 12.4 | 882 |
| 3 | 8 | 9.7 | 837 |
| 3 | 9 | 8.3 | 650 |
| 3 | 10 | 8.5 | 649 |
| 3 | 11 | 9.4 | 625 |
| 3 | 12 | 9.9 | 487 |

TABLE 10

[structure 4]

| structure | pattern | transmission loss (dB) | Q |
|---|---|---|---|
| 4 | 1 | 9.7 | 499 |
| 4 | 2 | 8.5 | 685 |
| 4 | 3 | 8.8 | 770 |
| 4 | 4 | 9.6 | 791 |
| 4 | 5 | 9.9 | 842 |
| 4 | 6 | 13.8 | 880 |
| 4 | 7 | 13.4 | 889 |
| 4 | 8 | 9.8 | 872 |
| 4 | 9 | 8.9 | 693 |
| 4 | 10 | 9.6 | 681 |
| 4 | 11 | 9.9 | 655 |
| 4 | 12 | 11.0 | 507 |

In order to apply the SAW devices such as the SAW device according to the present invention for narrow-band filters or resonators, the device is required to have higher Q of greater than 600. It is also advantageous over the conventional SAW devices to have lower transmission loss of less than 10 dB.

It is found that the SAW devices having IDT of <25 pairs provides lower Q of less than 600 (i.e., pattern 1), according to the experimental results shown in TABLES 7–10. It is also found that the SAW devices having IDT of >50 pairs provides higher transmission loss of greater than 10 dB (i.e., pattern 6).

It is also found that the smaller aperture length of IDT of <10λ provides higher transmission loss of greater than 10 dB (i.e., pattern 7). It is further found that the greater aperture length of IDT of <50λ provides lower Q of less than 600 (i.e., pattern 12).

It is known that smaller value of the out of band suppression is preferable for the packaged SAW devices. The SAW device of Example 9 can provide smaller value of the out of band suppression than conventional quartz SAW devices or the diamond SAW devices having layer structure of $SiO_2$/IDT/ZnO.

The SAW devices according to the Example 9 can provide lower transmission power suppression of −45 dB at 3 GHz, while the transmission power suppression at 3 GHz for packaged conventional quartz SAW devices or the diamond SAW devices having layer structure of $SiO_2$/IDT/ZnO is limited to −40 dB.

In addition, the SAW devices of the ninth example according to the present invention can also provide higher propagation velocity V of 9,000 m/sec. Further, high center frequency of 2.5 GHz is achieved even though the IDT geometry using wider finger width of 0.9 μm is employed. That is, high center frequency of 2.5 GHz is achieved, while higher device yields is maintained by employing wider finger geometry. In contrast, conventional quartz SAW devices require narrower finger of less than 0.5 μm for high center frequency of 2.5 GHz, which requires high level-microprocessing technique.

Additionally, temperature variation on the center frequency can be limited within 100–200 ppm for −20 to 80° C.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a $SiO_2$ layer disposed over said interdigital transducer onto said ZnO layer, said $SiO_2$ layer having a thickness of $t_S$;
   wherein a parameter kh3=$2\pi(t_A/\lambda)$ is kh3=0.044;
   and wherein a parameter kh1=$2\pi(t_Z/\lambda)$ and a parameter kh2=$2\pi(t_S/\lambda)$ are given within a region defined by an upper line obtained by increasing kh2 from a primary combination line (A1-B1-C1-D1-E1-F1-G1) by 10% and a lower line obtained by decreasing kh2 from said primary combination line (A1-B1-C1-D1-E1-F1-G1) by 10%, in a two-dimensional Cartesin coordinate graph having abscissa axis of kh1 and ordinate axis of kh2,
   said primary combination line (A1-B1-C1-D1-E1-F1-G1) consisting of points A1, B1, C1, D1, E1, F1, G1 and lines A1-B1, B1-C1, C1-D1, D1-E1, E1-F1, F1-G1;
   said A1 being given by (kh1=0.600, kh2=0.645);
   said B1 being given by (kh1=0.800, kh2=0.684);
   said C1 being given by (kh1=0.900, kh2=0.718);
   said D1 being given by (kh1=1.000, kh2=0.759);
   said E1 being given by (kh1=1.100, kh2=0.809);
   said F1 being given by (kh1=1.200, kh2=0.866); and
   said G1 being given by (kh1=1.400, kh2=0.987).

2. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a $SiO_2$ layer disposed over said interdigital transducer onto said ZnO layer, said $SiO_2$ layer having a thickness of $t_S$;
   wherein a parameter kh3=$2\pi(t_A/\lambda)$ is kh3=0.066;
   and wherein a parameter kh1=$2\pi(t_Z/\lambda)$ and a parameter kh2=$2\pi(t_S/\lambda)$ are given within a region defined by an upper line obtained by increasing kh2 from a primary combination line (A2-B2-C2-D2-E2-F2-G2) by 10% and a lower line obtained by decreasing kh2 from said primary combination line (A2-B2-C2-D2-E2-F2-G2) by 10%, in a two-dimensional Cartesin coordinate graph having abscissa axis of kh1 and ordinate axis of kh2,
   said primary combination line (A2-B2-C2-D2-E2-F2-G2) consisting of points A2, B2, C2, D2, E2, F2, G2 and lines A2-B2, B2-C2, C2-D2, D2-E2, E2-F2, F2-G2;
   said A2 being given by (kh1=0.600, kh2=0.671);
   said B2 being given by (kh1=0.800, kh2=0.713);
   said C2 being given by (kh1=0.900, kh2=0.747);
   said D2 being given by (kh1=1.000, kh2=0.789);
   said E2 being given by (kh1=1.100, kh2=0.837);
   said F2 being given by (kh1=1.200, kh2=0.891); and
   said G2 being given by (kh1=1.400, kh2=1.011).

3. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a $SiO_2$ layer disposed over said interdigital transducer onto said ZnO layer, said $SiO_2$ layer having a thickness of $t_S$;
   wherein a parameter kh3=$2\pi(t_A/\lambda)$ is kh3=0.099;
   and wherein a parameter kh1=$2\pi(t_Z/\lambda)$ and a parameter kh2=$2\pi(t_S/\lambda)$ are given within a region defined by an upper line obtained by increasing kh2 from a primary combination line (A3-B3-C3-D3-E3-F3-G3) by 10% and a lower line obtained by decreasing kh2 from said primary combination line (A3-B3-C3-D3-E3-F3-G3) by 10%, in a two-dimensional Cartesin coordinate graph having abscissa axis of kh1 and ordinate axis of kh2,
   said primary combination line (A3-B3-C3-D3-E3-F3-G3) consisting of points A3, B3, C3, D3, E3, F3, G3 and lines A3-B3, B3-C3, C3-D3, D3-E3, E3-F3, F3-G3;
   said A3 being given by (kh1=0.600, kh2=0.713);
   said B3 being given by (kh1=0.800, kh2=0.758);
   said C3 being given by (kh1=0.900, kh2=0.790);
   said D3 being given by (kh1=1.000, kh2=0.832);
   said E3 being given by (kh1=1.100, kh2=0.879);
   said F3 being given by (kh1=1.200, kh2=0.930); and
   said G3 being given by (kh1=1.400, kh2=1.046).

4. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a $SiO_2$ layer disposed over said interdigital transducer onto said ZnO layer, said $SiO_2$ layer having a thickness of $t_S$;

wherein a parameter kh3=2π($t_A/\lambda$) is kh3=0.132;

and wherein a parameter kh1=2π($t_Z/\lambda$) and a parameter kh2=2π($t_S/\lambda$) are given within a region defined by an upper line obtained by increasing kh2 from a primary combination line (A4-B4-C4-D4-E4-F4-G4) by 10% and a lower line obtained by decreasing kh2 from said primary combination line (A4-B4-C4-D4-E4-F4-G4) by 10%, in a two-dimensional Cartesin coordinate graph having abscissa axis of kh1 and ordinate axis of kh2, said primary combination line (A4-B4-C4-D4-E4-F4-G4) consisting of points A4, B4, C4, D4, E4, F4, G4 and lines A4-B4, B4-C4, C4-D4, D4-E4, E4-F4, F4-G4;

said A4 being given by (kh1=0.600, kh2=0.755);
said B4 being given by (kh1=0.800, kh2=0.803);
said C4 being given by (kh1=0.900, kh2=0.837);
said D4 being given by (kh1=1.000, kh2=0.877);
said E4 being given by (kh1=1.100, kh2=0.922);
said F4 being given by (kh1=1.200, kh2=0.972); and
said G4 being given by (kh1=1.400, kh2=1.083).

5. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_Z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_S$;

wherein a parameter kh3=2π($t_A/\lambda$) is kh3=0.198;

and wherein a parameter kh1=2π($t_Z/\lambda$) and a parameter kh2=2π($t_S/\lambda$) are given within a region defined by an upper line obtained by increasing kh2 from a primary combination line (A5-B5-C5-D5-E5-F5-G5) by 10% and a lower line obtained by decreasing kh2 from said primary combination line (A5-B5-C5-D5-E5-F5-G5) by 10%, in a two-dimensional Cartesin coordinate graph having abscissa axis of kh1 and ordinate axis of kh2, said primary combination line (A5-B5-C5-D5-E5-F5-G5) consisting of points A5, B5, C5, D5, E5, F5, G5 and lines A5-B5, B5-C5, C5-D5, D5-E5, E5-F5, F5-G5;

said A5 being given by (kh1=0.600, kh2=0.837);
said B5 being given by (kh1=0.800, kh2=0.897);
said C5 being given by (kh1=0.900, kh2=0.933);
said D5 being given by (kh1=1.000, kh2=0.973);
said E5 being given by (kh1=1.100, kh2=1.017);
said F5 being given by (kh1=1.200, kh2=1.063); and
said G5 being given by (kh1=1.400, kh2=1.167).

6. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_Z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_S$;

wherein a parameter kh3=2π($t_A/\lambda$) is kh3=0.264;

and wherein a parameter kh1=2π($t_Z/\lambda$) and a parameter kh2=2π($t_S/\lambda$) are given within a region defined by an upper line obtained by increasing kh2 from a primary combination line (A6-B6-C6-D6-E6-F6-G6) by 10% and a lower line obtained by decreasing kh2 from said primary combination line (A6-B6-C6-D6-E6-F6-G6) by 10%, in a two-dimensional Cartesin coordinate graph having abscissa axis of kh1 and ordinate axis of kh2, said primary combination line (A6-B6-C6-D6-E6-F6-G6) consisting of points A6, B6, C6, D6, E6, F6, G6 and lines A6-B6, B6-C6, C6-D6, D6-E6, E6-F6, F6-G6;

said A6 being given by (kh1=0.600, kh2=0.914);
said B6 being given by (kh1=0.800, kh2=0.989);
said C6 being given by (kh1=0.900, kh2=1.029);
said D6 being given by (kh1=1.000, kh2=1.069);
said E6 being given by (kh1=1.100, kh2=1.111);
said F6 being given by (kh1=1.200, kh2=1.156); and
said G6 being given by (kh1=1.400, kh2=1.257).

7. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_Z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_S$;

wherein a parameter kh3=2π($t_A/\lambda$) is 0.044≦kh3≦0.066:

and wherein a parameter kh1=2π($t_Z/\lambda$) and a parameter kh2=2π($t_S/\lambda$) are given within a region defined by an upper line obtained by increasing kh2 from a interpolated primary combination line (A12-B12-C12-D12-E12-F12-G12) by 10% and a lower line obtained by decreasing kh2 from said interpolated primary combination line (A12-B12-C12-D12-E12-F12-G12) by 10%, in a two-dimensional Cartesin coordinate graph having abscissa axis of kh1 and ordinate axis of kh2, said interpolated primary combination line (A12-B12-C12-D12-E12-F12-G12) consisting of points A12, B12, C12, D12, E12, F12, G12 and lines A12-B12, B12-C12, C12-D12, D12-E12, E12-F12, F12-G12;

said A12 being given by the linear interpolation between A1 (kh1=0.600, kh2=0.645) and A2 (kh1=0.600, kh2=0.671);

said B12 being given by the linear interpolation between B1 (kh1=0.800, kh2=0.684) and B2 (kh1=0.800, kh2=0.713);

said C12 being given by the linear interpolation between C1 (kh1=0.900, kh2=0.718) and C2 (kh1=0.900, kh2=0.747);

said D12 being given by the linear interpolation between D1 (kh1=1.000, kh2=0.759) and D2 (kh1=1.000, kh2=0.789);

said E12 being given by the linear interpolation between E1 (kh1=1.100, kh2=0.809) and E2 (kh1=1.100, kh2=0.837);

said F12 being given by the linear interpolation between F1 (kh1=1.200, kh2=0.866) and F2 (kh1=1.200, kh2=0.891); and said G12 being given by the linear interpolation between G1 (kh1=1.400, kh2=0.987) and G2 (kh1=1.400, kh2=1.011).

8. A surface acoustic wave device according to claim 7, wherein said interdigital transducer comprises an input interdigital transducer (input IDT) for creating surface acoustic wave by being applied with electric power and an output interdigital transducer (output IDT) for receiving the surface acoustic wave to obtain electric energy; wherein sum N of a pair number Ni of said input IDT and a pair number No of said output IDT (N=Ni+No) is 50 to 90 pairs; and wherein a aperture length of said input IDT or said output IDT is 10λ to 50λ.

9. A surface acoustic wave device according to claim 7, further comprising at least one pair of reflectors which are disposed to interpose said input and said output IDTs along the propagating direction of the SAW, wherein the reflectors comprise fingers, the total number of which is not greater than 2×(100−N), where N is sum of a pair number Ni of said input IDT and a pair number No of said output IDT (N=Ni+No).

10. A surface acoustic wave device for 2nd mode surface acoustic wave of a wavelength λ ($\mu$m) comprising:
  (i) a diamond layer,
  (ii) a ZnO layer disposed on said diamond layer, said ZnO layer having a thickness $t_Z$,
  (iii) an interdigital transducer (IDT) disposed on said ZnO layer, said IDT having a thickness of $t_A$, and
  (iv) a SiO$_2$ layer disposed over said interdigital transducer onto said ZnO layer, said SiO$_2$ layer having a thickness of $t_S$;
  wherein a parameter $kh3=2\pi(t_A/\lambda)$ is $0.066 \leq kh3 \leq 0.099$:
  and wherein a parameter $kh1=2\pi(t_Z/\lambda)$ and a parameter $kh2=2\pi(t_S/\lambda)$ are given within a region defined by an upper line obtained by increasing kh2 from a interpolated primary combination line (A23-B23-C23-D23-E23-F23-G23) by 10% and a lower line obtained by decreasing kh2 from said interpolated primary combination line (A23-B23-C23-D23-E23-F23-G23) by 10%, in a two-dimensional Cartesin coordinate graph having abscissa axis of kh1 and ordinate axis of kh2,
  said interpolated primary combination line (A23-B23-C23-D23-E23-F23-G23) consisting of points A23, B23, C23, D23, E23, F23, G23 and lines A23-B23, B23-C23, C23-D23, D23-E23, E23-F23, F23-G23;
  said A23 being given by the linear interpolation between A2 (kh1=0.600, kh2=0.671) and A3 (kh1=0.600, kh2=0.713);
  said B23 being given by the linear interpolation between B2 (kh1=0.800, kh2=0.713) and B3 (kh1=0.800, kh2=0.758);
  said C23 being given by the linear interpolation between C2 (kh1=0.900, kh2=0.747) and C3 (kh1=0.900, kh2=0.790);
  said D23 being given by the linear interpolation between D2 (kh1=1.000, kh2=0.789) and D3 (kh1=1.000, kh2=0.832);
  said E23 being given by the linear interpolation between E2 (kh1=1.100, kh2=0.837) and E3 (kh1=1.100, kh2=0.879);
  said F23 being given by the linear interpolation between F2 (kh1=1.200, kh2=0.891) and F3 (kh1=1.200, kh2=0.930); and
  said G23 being given by the linear interpolation between G2 (kh1=1.400, kh2=1.011) and G3 (kh1=1.400, kh2=1.046).

11. A surface acoustic wave device according to claim 10, wherein said interdigital transducer comprises an input interdigital transducer (input IDT) for creating surface acoustic wave by being applied with electric power and an output interdigital transducer (output IDT) for receiving the surface acoustic wave to obtain electric energy; wherein sum N of a pair number Ni of said input IDT and a pair number No of said output IDT (N=Ni+No) is 50 to 90 pairs; and wherein a aperture length of said input IDT or said output IDT is 10λ to 50λ.

12. A surface acoustic wave device according to claim 10, further comprising at least one pair of reflectors which are disposed to interpose the input and the output IDTs along the propagating direction of the SAW, wherein the reflectors comprise fingers, the total number of which is not greater than 2×(100−N), where N is sum of a pair number Ni of said input IDT and a pair number No of said output IDT (N=Ni+No).

13. A surface acoustic wave device for 2nd mode surface acoustic wave of a wavelength λ ($\mu$m) comprising:
  (i) a diamond layer,
  (ii) a ZnO layer disposed on said diamond layer, said ZnO layer having a thickness $t_Z$,
  (iii) an interdigital transducer (IDT) disposed on said ZnO layer, said IDT having a thickness of $t_A$, and
  (iv) a SiO$_2$ layer disposed over said interdigital transducer onto said ZnO layer, said SiO$_2$ layer having a thickness of $t_S$;
  wherein a parameter $kh3=2\pi(t_A/\lambda)$ is $0.099 \leq kh3 \leq 0.132$:
  and wherein a parameter $kh1=2\pi(t_Z/\lambda)$ and a parameter $kh2=2\pi(t_S/\lambda)$ are given within a region defined by an upper line obtained by increasing kh2 from a interpolated primary combination line (A34-B34-C34-D34-E34-F34-G34) by 10% and a lower line obtained by decreasing kh2 from said interpolated primary combination line (A34-B34-C34-D34-E34-F34-G34) by 10%, in a two-dimensional Cartesin coordinate graph having abscissa axis of kh1 and ordinate axis of kh2,
  said interpolated primary combination line (A34-B34-C34-D34-E34-F34-G34) consisting of points A34, B34, C34, D34, E34, F34, G34 and lines A34-B34, B34-C34, C34-D34, D34-E34, E34-F34, F34-G34;
  said A34 being given by the linear interpolation between A3 (kh1=0.600, kh2=0.713) and A4 (kh1=0.600, kh2=0.755);
  said B34 being given by the linear interpolation between B3 (kh1=0.800, kh2=0.758) and B4 (kh1=0.800, kh2=0.803);
  said C34 being given by the linear interpolation between C3 (kh1=0.900, kh2=0.790) and C4 (kh1=0.900, kh2=0.837);
  said D34 being given by the linear interpolation between D3 (kh1=1.000, kh2=0.832) and D4 (kh1=1.000, kh2=0.877);
  said E34 being given by the linear interpolation between E3 (kh1=1.100, kh2=0.879) and E4 (kh1=1.100, kh2=0.922);
  said F34 being given by the linear interpolation between F3 (kh1=1.200, kh2=0.930) and F4 (kh1=1.200, kh2=0.972); and
  said G34 being given by the linear interpolation between G3 (kh1=1.400, kh2=1.046) and G4 (kh1=1.400, kh2=1.083).

14. A surface acoustic wave device according to claim 13, wherein said interdigital transducer comprises an input interdigital transducer (input IDT) for creating surface acoustic wave by being applied with electric power and an output interdigital transducer (output IDT) for receiving the surface acoustic wave to obtain electric energy; wherein sum N of a pair number Ni of said input IDT and a pair number No of said output IDT (N=Ni+No) is 50 to 90 pairs; and wherein a aperture length of said input IDT or said output IDT is 10λ to 50λ.

15. A surface acoustic wave device according to claim 13, further comprising at least one pair of reflectors which are disposed to interpose said input and said output IDTs along the propagating direction of the SAW, wherein the reflectors comprise fingers, the total number of which is not greater than 2×(100−N), where N is sum of a pair number Ni of said input IDT and a pair number No of said output IDT (N=Ni+No).

16. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a SiO$_2$ layer disposed over said interdigital transducer onto said ZnO layer, said SiO$_2$ layer having a thickness of $t_S$;
   wherein a parameter kh3=2π($t_A$/λ) is 0.132≦kh3≦0.198:
   and wherein a parameter kh1=2π($t_Z$/λ) and a parameter kh2=2π($t_S$/λ) are given within a region defined by an upper line obtained by increasing kh2 from a interpolated primary combination line (A45-B45-C45-D45-E45-F45-G45) by 10% and a lower line obtained by decreasing kh2 from said interpolated primary combination line (A45-B45-C45-D45-E45-F45-G45) by 10%, in a two-dimensional Cartesin coordinate graph having abscissa axis of kh1 and ordinate axis of kh2,
   said interpolated primary combination line (A45-B45-C45-D45-E45-F45-G45) consisting of points A45, B45, C45, D45, E45, F45, G45 and lines A45-B45, B45-C45, C45-D45, D45-E45, E45-F45, F45-G45;
   said A45 being given by the linear interpolation between A4 (kh1=0.600, kh2=0.755) and A5 (kh1=0.600, kh2=0.837);
   said B45 being given by the linear interpolation between B4 (kh1=0.800, kh2=0.803) and B5 (kh1=0.800, kh2=0.897);
   said C45 being given by the linear interpolation between C4 (kh1=0.900, kh2=0.837) and C5 (kh1=0.900, kh2=0.933);
   said D45 being given by the linear interpolation between D4 (kh1=1.000, kh2=0.877) and D5 (kh1=1.000, kh2=0.973);
   said E45 being given by the linear interpolation between E4 (kh1=1.100, kh2=0.922) and E5 (kh1=1.100, kh2=1.017);
   said F45 being given by the linear interpolation between F4 (kh1=1.200, kh2=0.972) and F5 (kh1=1.200, kh2=1.063); and
   said G45 being given by the linear interpolation between G4 (kh1=1.400, kh2=1.083) and G5 (kh1=1.400, kh2=1.167).

17. A surface acoustic wave device according to claim 16, wherein said interdigital transducer comprises an input interdigital transducer (input IDT) for creating surface acoustic wave by being applied with electric power and an output interdigital transducer (output IDT) for receiving the surface acoustic wave to obtain electric energy; wherein sum N of a pair number Ni of said input IDT and a pair number No of said output IDT (N=Ni+No) is 50 to 90 pairs; and wherein a aperture length of said input IDT or said output IDT is 10λ to 50λ.

18. A surface acoustic wave device according to claim 16, further comprising at least one pair of reflectors which are disposed to interpose the input and the output IDTs along the propagating direction of the SAW, wherein the reflectors comprise fingers, the total number of which is not greater than 2×(100−N), where N is sum of a pair number Ni of said input IDT and a pair number No of said output IDT (N=Ni+No).

19. A surface acoustic wave device for 2nd mode surface acoustic wave of a wavelength λ (μm) comprising:
   (i) a diamond layer,
   (ii) a ZnO layer disposed on said diamond layer, said ZnO layer having a thickness $t_Z$,
   (iii) an interdigital transducer (IDT) disposed on said ZnO layer, said IDT having a thickness of $t_A$, and
   (iv) a SiO$_2$ layer disposed over said interdigital transducer onto said ZnO layer, said SiO$_2$ layer having a thickness of $t_S$;
   wherein a parameter kh3=2π($t_A$/λ) is 0.198≦kh3≦0.264:
   and wherein a parameter kh1=2π($t_Z$/λ) and a parameter kh2=2π($t_S$/λ) are given within a region defined by an upper line obtained by increasing kh2 from a interpolated primary combination line (A56-B56-C56-D56-E56-F56-G56) by 10% and a lower line obtained by decreasing kh2 from said interpolated primary combination line (A56-B56-C56-D56-E56-F56-G56) by 10%, in a two-dimensional Cartesin coordinate graph having abscissa axis of kh1 and ordinate axis of kh2,
   said interpolated primary combination line (A56-B56-C56-D56-E56-F56-G56) consisting of points A56, B56, C56, D56, E56, F56, G56 and lines A56-B56, B56-C56, C56-D56, D56-E56, E56-F56, F56-G56;
   said A56 being given by the linear interpolation between A5 (kh1=0.600, kh2=0.837) and A6 (kh1=0.600, kh2=0.914);
   said B56 being given by the linear interpolation between B5 (kh1=0.800, kh2=0.897) and B6 (kh1=0.800, kh2=0.989);
   said C56 being given by the linear interpolation between C5 (kh1=0.900, kh2=0.933) and C6 (kh1=0.900, kh2=1.029);
   said D56 being given by the linear interpolation between D5 (kh1=1.000, kh2=0.973) and D6 (kh1=1.000, kh2=1.069);
   said E56 being given by the linear interpolation between E5 (kh1=1.100, kh2=1.017) and E6 (kh1=1.100, kh2=1.111);
   said F56 being given by the linear interpolation between F5 (kh1=1.200, kh2=1.063) and F6 (kh1=1.200, kh2=1.156); and
   said G56 being given by the linear interpolation between G5 (kh1=1.400, kh2=1.167) and G6 (kh1=1.400, kh2=1.257).

20. A surface acoustic wave device according to claim 19, wherein said interdigital transducer comprises an input interdigital transducer (input IDT) for creating surface acoustic wave by being applied with electric power and an output interdigital transducer (output IDT) for receiving the surface acoustic wave to obtain electric energy; wherein sum N of a pair number Ni of said input IDT and a pair number No of said output IDT (N=Ni+No) is 50 to 90 pairs; and wherein a aperture length of said input IDT or said output IDT is 10λ to 50λ.

21. A surface acoustic wave device according to claim 19, further comprising at least one pair of reflectors which are disposed to interpose the input and the output IDTs along the propagating direction of the SAW, wherein the reflectors comprise fingers, the total number of which is not greater than 2×(100−N), where N is sum of a pair number Ni of said input IDT and a pair number No of said output IDT (N=Ni+No).

22. A surface acoustic wave device according to claim 1, wherein said wavelength λ is about 3.2 µm to about 4.5 µm.

23. A surface acoustic wave device according to claim 1, wherein Q of said surface acoustic wave device is greater than 600.

24. A surface acoustic wave device according to claim 1, wherein an operating center frequency of said surface acoustic wave device is about 2.4 GHz to about 2.6 GHz.

25. A surface acoustic wave device according to claim 1, wherein a transmission loss of said surface acoustic wave device is about 6 dB to about 10 dB.

* * * * *